US008549207B2

(12) United States Patent
Satpathy et al.

(10) Patent No.: US 8,549,207 B2
(45) Date of Patent: *Oct. 1, 2013

(54) CROSSBAR CIRCUITRY FOR APPLYING AN ADAPTIVE PRIORITY SCHEME AND METHOD OF OPERATION OF SUCH CROSSBAR CIRCUITRY

(75) Inventors: Sudhir Kumar Satpathy, Ann Arbor, MI (US); David Theodore Blaauw, Ann Arbor, MI (US); Trevor Nigel Mudge, Ann Arbor, MI (US); Dennis Michael Sylvester, Ann Arbor, MI (US)

(73) Assignee: The Regents of the University of Michigan, Ann Arbor, MI (US)

(*) Notice: Subject to any disclaimer, the term of this patent is extended or adjusted under 35 U.S.C. 154(b) by 401 days.
This patent is subject to a terminal disclaimer.

(21) Appl. No.: 12/926,462

(22) Filed: Nov. 18, 2010

(65) Prior Publication Data
US 2011/0138098 A1    Jun. 9, 2011

Related U.S. Application Data

(63) Continuation-in-part of application No. 12/458,511, filed on Jul. 14, 2009, now Pat. No. 8,230,152, which is a continuation-in-part of application No. 12/379,191, filed on Feb. 13, 2009, now Pat. No. 8,108,585.

(51) Int. Cl.
*G06F 13/00* (2006.01)
*G06F 9/32* (2006.01)
*H03K 17/00* (2006.01)
*H04Q 3/00* (2006.01)
*H04Q 11/00* (2006.01)
*G11C 19/00* (2006.01)
*H04L 12/50* (2006.01)

(52) U.S. Cl.
USPC ............ 710/317; 710/316; 340/2.1; 340/2.2; 340/2.28; 340/14.4; 370/357; 370/360; 370/380

(58) Field of Classification Search
USPC .................. 710/316–317; 340/2.1, 2.2, 2.28, 340/14.4; 370/357, 360, 380
See application file for complete search history.

(56) References Cited

U.S. PATENT DOCUMENTS 5,053,942 A * 10/1991 Srini ............................ 710/317
5,517,186 A    5/1996 Veenstra
(Continued)

FOREIGN PATENT DOCUMENTS

EP        0 744 879        11/1996
EP        1089461 A2 *     4/2001
(Continued)

OTHER PUBLICATIONS

DaeHo Seo; Thottethodi, M., "Table-lookup based Crossbar Arbitration for Minimal-Routed, 2D Mesh and Torus Networks," Parallel and Distributed Processing Symposium, 2007. IPDPS 2007. IEEE International , pp. 1,10, Mar. 26-30, 2007.*

(Continued)

*Primary Examiner* — Faisal M Zaman
(74) *Attorney, Agent, or Firm* — Nixon & Vanderhye P.C.

(57) ABSTRACT

Crossbar circuitry has an array of data input and output paths where the data output paths are transverse to the data input paths. At each intersection between a data input path and a data output path, a crossbar cell is provided which includes a configuration storage circuit programmable to store a routing value, a transmission circuit, and an arbitration circuit. In a transmission mode of operation, the transmission circuit is responsive to the routing value being a first value, indicating that the data input path should be coupled to the data output path, to detect the data input along the data input path, and to output an indication of that data on the data output path at the associated intersection. In an arbitration mode of operation, the arbitration circuitry is operable to selectively modify the voltage on said plurality of bit lines in order to apply an adaptive priority scheme.

31 Claims, 32 Drawing Sheets

(56) References Cited

U.S. PATENT DOCUMENTS

| | | | |
|---|---|---|---|
| 5,530,814 A | 6/1996 | Wong et al. | |
| 5,689,644 A | 11/1997 | Chou et al. | |
| 5,781,717 A | 7/1998 | Wu et al. | |
| 5,857,111 A | 1/1999 | Oda | |
| 5,896,516 A * | 4/1999 | Powell et al. | 710/317 |
| 5,991,296 A | 11/1999 | Mu et al. | |
| 6,125,429 A * | 9/2000 | Goodwin et al. | 711/143 |
| 6,356,111 B1 | 3/2002 | Moss | |
| 6,690,597 B1 | 2/2004 | Perlov et al. | |
| 6,715,023 B1 * | 3/2004 | Abu-Lebdeh et al. | 710/317 |
| 6,771,162 B1 | 8/2004 | Moss | |
| 6,801,978 B2 | 10/2004 | Sota | |
| 6,950,893 B2 | 9/2005 | Chan | |
| 7,020,131 B1 | 3/2006 | Yun et al. | |
| 7,161,906 B2 * | 1/2007 | Dell et al. | 370/231 |
| 7,178,005 B1 * | 2/2007 | Jordan et al. | 711/217 |
| 7,239,669 B2 * | 7/2007 | Cummings et al. | 375/295 |
| 7,424,013 B1 * | 9/2008 | Yun et al. | 370/389 |
| 7,643,493 B1 | 1/2010 | Sayrafian-Pour | |
| 7,657,693 B2 | 2/2010 | Singh et al. | |
| 7,907,625 B1 * | 3/2011 | MacAdam | 370/412 |
| 8,108,585 B2 * | 1/2012 | Satpathy et al. | 710/317 |
| 8,155,134 B2 * | 4/2012 | Fairhurst et al. | 370/413 |
| 8,230,152 B2 * | 7/2012 | Satpathy et al. | 710/317 |
| 8,255,610 B2 * | 8/2012 | Satpathy et al. | 710/317 |
| 2003/0221043 A1 * | 11/2003 | Sota | 710/317 |
| 2004/0047334 A1 * | 3/2004 | Francois et al. | 370/351 |
| 2004/0062238 A1 * | 4/2004 | Yoshizawa et al. | 370/360 |
| 2004/0083326 A1 * | 4/2004 | Wang et al. | 710/317 |
| 2004/0120337 A1 | 6/2004 | Jun et al. | |
| 2005/0097256 A1 * | 5/2005 | Jones | 710/316 |
| 2006/0031625 A1 * | 2/2006 | Chan | 710/316 |
| 2008/0186961 A1 * | 8/2008 | Yun et al. | 370/360 |
| 2009/0034517 A1 * | 2/2009 | Yang et al. | 370/357 |
| 2009/0089478 A1 * | 4/2009 | Singh et al. | 710/317 |
| 2010/0090189 A1 | 4/2010 | Savransky | |
| 2010/0211719 A1 | 8/2010 | Satpathy et al. | |
| 2011/0138098 A1 | 6/2011 | Satpathy et al. | |
| 2011/0181307 A1 * | 7/2011 | Kuekes | 324/722 |
| 2012/0254491 A1 * | 10/2012 | Satpathy et al. | 710/116 |

FOREIGN PATENT DOCUMENTS

| | | |
|---|---|---|
| EP | 1115230 A2 * | 7/2001 |
| GB | 2 261 131 | 10/1991 |
| GB | 2261131 A * | 5/1993 |
| JP | 2000-22728 | 1/2000 |
| JP | 2000022728 A * | 1/2000 |
| JP | 2001197068 A * | 7/2001 |
| JP | 2002-342306 | 11/2002 |
| JP | 2004-78713 | 3/2004 |
| JP | 2008-46997 | 2/2008 |
| WO | WO 9935879 A1 * | 7/1999 |
| WO | WO 2004049645 A1 * | 6/2004 |
| WO | WO2005/020066 | 3/2005 |

OTHER PUBLICATIONS

Minkenberg, C.; Abel, F.; Gusat, M., "Reliable control protocol for crossbar arbitration," Communications Letters, IEEE, vol. 9, No. 2, pp. 178,180, Feb. 2005.*

Minkenberg, C.; Iliadis, I.; Abel, F., "Low-latency pipelined crossbar arbitration," Global Telecommunications Conference, 2004. Globecom '04. IEEE, vol. 2, pp. 1174,1179 vol. 2, Nov. 29-Dec. 3, 2004.*

Nitta, C.; Farrens, M.; Akella, V., "DCAF—A Directly Connected Arbitration-Free Photonic Crossbar for Energy-Efficient High Performance Computing," Parallel & Distributed Processing Symposium (IPDPS), 2012 IEEE 26th International, pp. 1144,1155, May 21-25, 2012.*

"NB9103112: Neural-Network Controller for Large Crosspoint Networks" Mar. 1, 1991, IBM, IBM Tevhnical Disclosure Bulletin, vol. 33, Iss. 10B, pp. 112-116.

"NB9103106: Hierarchical Neural Network-Based Controller for Crosspoint Networks" Mar. 1, 1991, IBM, IBM Technical Disclosure Bulletins, vol. 33, Iss. 10B, pp. 106-109.

A. Marrakchi et al, "A Neural Net Arbitrator for Large Crossbar Packet-Switches" IEEE Transactions on Circuits and Systems, vol. 36, No. 7, Jul. 1989, pp. 1039-1041.

J. Ghosh et al, "Neural Networks for Fast Arbitration and Switching Noise Reduction in Large Crossbars" IEEE Transactions on Circuits and Systems, vol. 38, No. 8, Aug. 1991, pp. 895-904.

Notice of Allowance mailed Mar. 22, 2012 in co-pending U.S. Appl. No. 12/458,511.

Golshan et al., "A novel reduced swing CMOS BUS interface circuit for high speed low power VLSI systems", *IEEE Explore*, Jan. 22, 2009, pp. 351-354.

Chang et al., "A 50 Gb/s 32×32 CMOS Crossbar Chip using Asymmetric Serial Links", *Computer System Laboratory, Stanford University*, Apr. 1999, (4 pages).

Wu et al., "A 2Gb/s 256 * 256 CMOS Crossbar Switch Fabric Core Design using Pipelined MUX", *IEEE*, Jul. 2002, pp. II-568-II-571.

Wijetunga, "High-performance crossbar design for system-on-chip", $3^{rd}$ *IEEE International Workshop*, Jun. 2003, (6 pages).

Borgatti et al., "A Multi-Context 6.4Gb/s/Channel On-Chip Communication Network Using 0.18μm Flash-EEPROM Switches and Elastic Interconnects", *IEEE International Solid-State Circuits Conference*, Sep. 2003, (3 pages).

Chi et al., "Decomposed Arbiters for Large Crossbars with Multi-Queue Input Buffers", IEEE International Conference on Computer Design, Oct. 14-16, 1991, pp. 233-238.

Delgado-Frias et al., "A VLSI Crossbar Switch with Wrapped Wave Front Arbitration", IEEE Transactions on Circuits and Systems, vol. 50, Issue 1, Jan. 2003, pp. 135-142.

Kavaldjiev et al., "A Virtual Channel Router for On-chip Networks", IEEE International SoC Conference, Sep. 12-15, 2004, pp. 289-293.

Shin et al, "Round-robin Arbiter Design and Generation", International Symposium on System Synthesis, 2002, pp. 243-248.

Molnar et al., "Simple Circuits that Work for Complicated Reasons", International Symposium on Advanced Research in Asynchronous Circuits and Systems, 2000, 12 pages.

Josephs et al., "CMOS Design of the Tree Arbiter Element", IEEE Transactions on VLSI systems, vol. 4, Issue 4, Dec. 1996, pp. 472-476.

Plummer, "Asynchronous Arbiters", IEEE Transactions on Computers Archive, vol. 21, Issue 1, Jan. 1972), pp. 37-42.

UK Search Report dated Apr. 16, 2010 for GB 1000172.5.

* cited by examiner

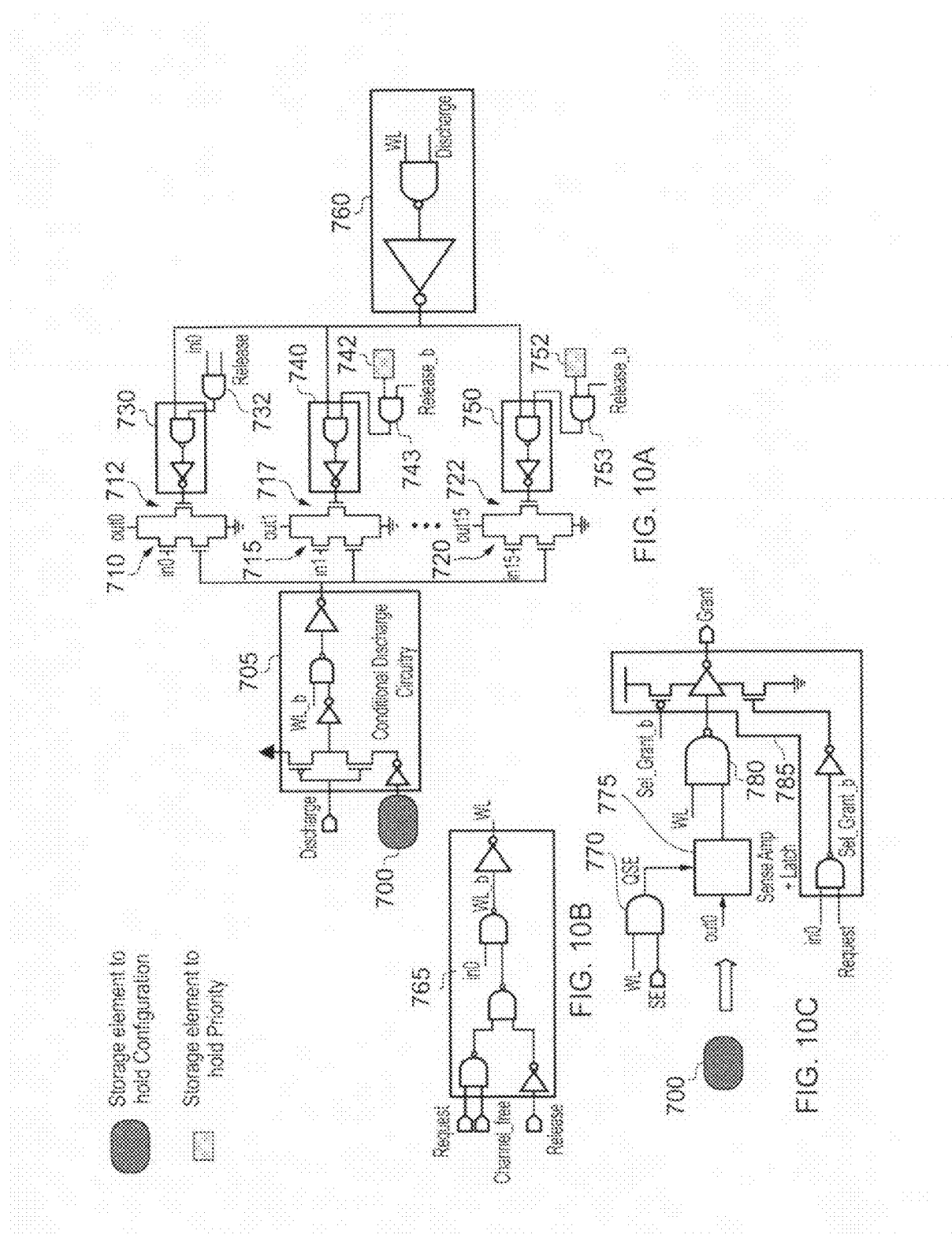

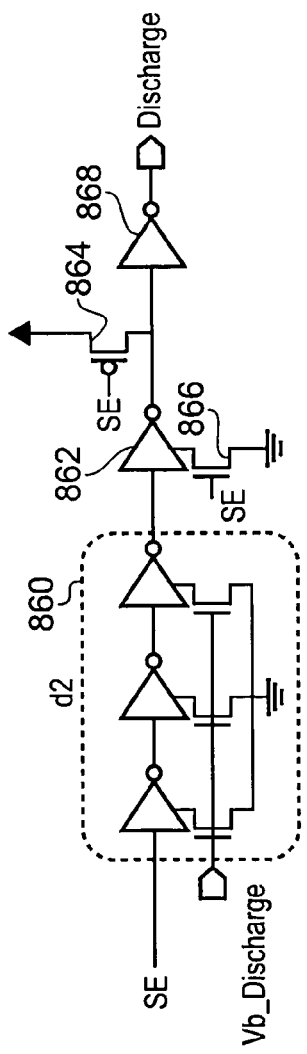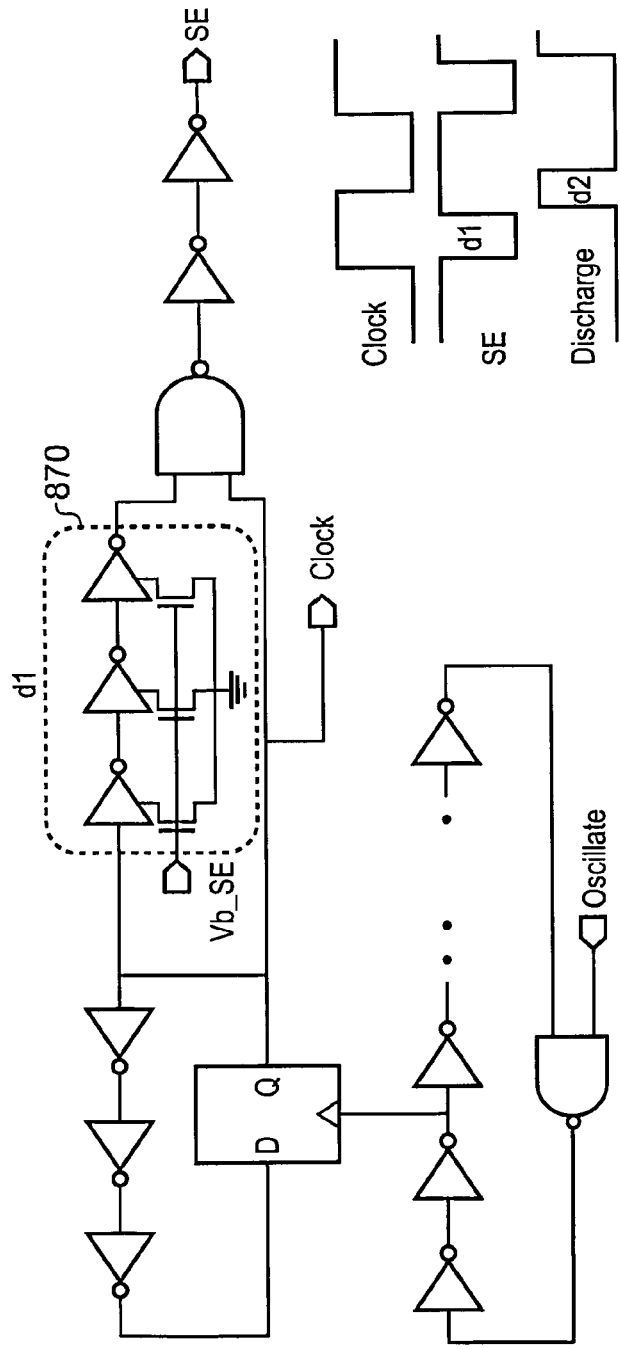

ENCODER:

DECODER:

CROSSBAR CIRCUITRY FOR APPLYING AN ADAPTIVE PRIORITY SCHEME AND METHOD OF OPERATION OF SUCH CROSSBAR CIRCUITRY

This application is a continuation-in-part of U.S. application Ser. No. 12/458,511 filed Jul. 14, 2009 now U.S. Pat. No. 8,230,152, which is a continuation-in-part of U.S. application Ser. No. 12/379,191 filed Feb. 13, 2009 now U.S. Pat. No. 8,108,585, the entire contents of each of which are hereby incorporated by reference.

BACKGROUND OF THE INVENTION

1. Field of the Invention

The present invention relates to crossbar circuitry for applying an adaptive priority scheme, and a method of operation of such crossbar circuitry.

2. Description of the Prior Art

A crossbar circuit is a switch infrastructure for connecting multiple inputs to multiple outputs in a matrix manner. Accordingly, crossbar circuitry can be used to interconnect a plurality of source circuits and a plurality of destination circuits such that data input to the crossbar circuitry from any of the plurality of source circuits can be output to any of the plurality of destination circuits. Crossbar circuits can be used in a variety of implementations. For example, in a data processing system implementation, such crossbar circuitry can be used to interconnect a plurality of processors used to perform data processing operations on data values with a plurality of memory devices used to store those data values, thereby allowing the data values from any memory device to be routed to any processor.

Known techniques for producing crossbar circuits require a large area for the crossbar circuitry due to the components required to form the crossbar circuitry and the significant number of control lines required for routing control signals to those components, and also consume significant power. Further, their complexity tends to grow rapidly with size, making many of the known techniques impractical for use with crossbar circuits required to interconnect a large number of source circuits with a large number of destination circuits. Some known techniques are discussed below.

The article "A 50 Gb/s 32×32 CMOS Crossbar Chip using Asymmetric Serial Links" by K Chang et al, 1999 Symposium on VLSI Circuits, Digest of Technical Papers, Pages 19 to 22, and the article "A 2 Gb/s 256×256 CMOS Crossbar Switch Fabric Core Design using Pipelined MUX" by T Wu et al, IEEE International Symposium on Circuits and System, 2002, Pages 568 to 571, describe crossbar circuits using a hierarchical arrangement of multiplexers to enable the routing of data from any input source to any output destination. However, such MUX-based crossbar circuits are relatively large in size, and have a large power consumption. Further, they typically require a considerable number of control lines in order to control the various multiplexers. Such MUX-based designs are not typically scalable with an increase in the number of inputs and outputs to be supported, at least in part because it becomes increasingly difficult as the size increases to route the necessary control signals to the various multiplexers. Further, if the input data is multi-bit data routed over an input bus, the routing of the data paths themselves becomes very complex.

The article "A Novel Reduced Swing CMOS Bus Interface Circuit for High Speed Low Power VLSI Systems" by R Golshan et al, IEEE International Symposium on Circuits and System, Pages 351 to 354, 1994, describes an X-Y style crossbar circuit where the input paths pass in a horizontal direction and the output paths pass in a vertical direction. At the intersection between each input path and output path, a storage element in the form of a flip-flop circuit is provided whose output controls a transistor used to couple the input path to the output path. However, such a design requires a large number of control lines to program the various flip-flops in order to configure the crossbar circuit to perform the required routing. Further, the input data provided on an input data path is used to drive the output data on the relevant output data path. As the crossbar circuit becomes larger to accommodate larger numbers of inputs and outputs, the capacitance of the output data paths increases, and accordingly it is necessary to provide larger drive transistors on the inputs in order to overcome the increased capacitance. In addition, the coupling transistor driven by the flip-flop at the interconnection between a data input path and a data output path also needs to increase in size as the crossbar circuit increases in size. Further, it will typically be necessary to include one or more buffers in the data output paths as the crossbar circuitry increases in size. All of these factors give rise to significant problems in layout of the elements of the crossbar circuit and the associated control lines, particularly as the crossbar circuit increases in size to accommodate more inputs and outputs. Accordingly, this approach becomes complex and is not scalable.

The article "High-Performance Crossbar Design for System-On-Chip" by P Wijetunga, Proceedings of the Third IEEE International Workshop on System-On-Chip for Real-Time Applications, 2003, describes a crossbar design employing a pass-transistor chain as transmission circuitry to be located at each intersection between the data input paths and the data output paths. When the pass-transistor chain is required to couple the input data to the output data path, a current sensing circuit located on the output data path is used to detect the input data value. A significant disadvantage of this design is that it consumes large power due to the requirement for current sensing devices to be located on each output path. Further, a large number of control signals need routing within the crossbar circuitry, and indeed those control signals will dominate the routing requirements as the crossbar circuit increases in size to accommodate more inputs and outputs. Hence, again, this design is not readily scalable to larger designs of crossbar circuitry.

The article "A Multi-Context 6.4 Gb/s/Channel On-Chip Communication Network using 0.18 µm Flash-EEPROM Switches and Elastic Interconnects" by M Borgatti et al, ISSCC 2003, Session 26, Embedded and Digital Systems, Paper 26.5, describes a programmable crossbar implemented using a matrix of modified flash-EEPROM devices. However, as is clear from Figure 26.5.6, the number of memory cells involved in routing a data input from a source device to a destination device depends on where those devices are connected into the crossbar, and accordingly the timing for signals passing through the crossbar is not deterministic. Further, a large number of control lines will be required to enable programming of the various flash-EEPROM cells, and a significant amount of time will be required to program those various flash-EEPROM cells. Any reconfiguration of the crossbar device will hence also take a significant time.

Accordingly, such a design of crossbar is complex, and will increase in complexity as more input devices and output devices need to be supported by the crossbar, due to the proliferation in control lines required. Further, since the timing of the crossbar is not deterministic, this will make the crossbar design inappropriate for certain implementations.

In summary, it will be appreciated from the above discussions that existing crossbar designs typically involve complex routing of control signals, with that complexity rapidly increasing as the size of the crossbar increases. Often the designs consume significant power consumption and lack scalability, due partly to the number of control lines required, and partly due to the need to increase the size of certain components provided within the crossbar as the size of the crossbar increases.

Commonly owned US published patent application 2010/0211719, the entire contents of which are hereby incorporated by reference, describes a crossbar circuit design where routing patterns are cached locally at crosspoints in the crossbar and are then used to route data. This significantly reduces routing congestion when producing the wiring layout for the crossbar circuit. The design is readily scalable, and hence the crossbar circuitry can be readily utilised even where the number of source circuits and destination circuits to be connected to the crossbar circuitry is large. Further, the design produces a regular layout providing a fixed latency for the transfer of data through the crossbar circuitry.

Another issue in crossbar design is how to provide the crossbar with collision detection and resolution abilities. Multiple requests for the same destination in a switching fabric is termed a collision. With increasing number of sources and destinations, collisions get more frequent. Under such circumstances, arbitration becomes a bottle-neck in the overall efficiency of the crossbar circuitry.

Most contemporary switching fabrics consist primarily of two modules: a crossbar to transmit data, and an arbiter to configure the crossbar. In such an implementation, the source circuits send requests to the arbiter for channels. The arbiter samples all requests and using some priority assignment scheme, grants some or all of the requests and configures the crossbar accordingly. This scheme poses two major problems for scalability:

1) Routing all request signals from the source circuits to the arbiter, and all the grant signals back, becomes increasingly difficult for larger systems; and
2) The arbiter needs to have knowledge of all incoming requests as well the current state of the crossbar, before it can make a decision. Monitoring the state of the crossbar every cycle requires additional logic as well as interconnects. This contributes to additional delay.

A number of attempts have been made to address the scalability and arbitration delay of packet switching networks. In the article by Chi H. et. al. entitled "Decomposed Arbiters for Large Crossbars with Multi-Queue Input Buffers," IEEE International Conference on Computer Design, 14-16 Oct. 1991, pages: 233-238, the authors discuss decomposing arbiters, so that some requests can be granted before the arbitration process completes. However, the worst case arbitration delay still remains the same. In general, the arbitration delay grows linearly with size.

In the article by Delgado-Frias et. al. entitled "A VLSI Crossbar Switch with Wrapped Wave Front Arbitration," IEEE Transactions on Circuits and Systems, Volume 50, Issue 1, January 2003 Pages: 135-141, and the article by Kavaldjiev N. et. al. entitled "A Virtual Channel Router for On-chip Networks," IEEE International SoC Conference, 12-15 Sep. 2004, pages: 289-293, the authors discuss the handling of arbitration within a crossbar. However, the disclosed implementations are not scalable and are restricted to a crossbar of size 4*4.

In the article by Shin E. et. al. entitled "Round-robin Arbiter Design and Generation," International Symposium on System Synthesis, 2002, pages: 243-248, the authors propose a tool to generate a round robin arbiter. The approach is hierarchical, attempting to make a 32*32 switch out of 4*4 switches.

In the article by William W. Plummer entitled "Asynchronous Arbiters", IEEE Transactions on Computers Archive Volume 21, Issue 1 (January 1972) Pages 37-42, the article by Charles E. Molnar et. al. entitled "Simple Circuits that Work for Complicated Reasons," International Symposium on Advanced Research in Asynchronous Circuits and Systems, 2000. (ASYNC 2000) Proceedings, and the article by Mark B. Josephs et. al. entitled "CMOS Design of the Tree Arbiter Element," IEEE Transactions on VLSI systems, Volume 4, Issue 4, December 1996 Page(s):472-476, some asynchronous techniques for arbitration are described. These designs exploit meta-stability to achieve randomness. However, delay in meta-stable systems can become high at times, thereby restricting their use in real time systems that require guaranteed throughput.

In summary, many solutions available in literature take a hierarchical approach towards making a large crossbar switch using 2*2 or 4*4 switches. Hence, the delay grows linearly with the size of the crossbar switch. This leaves no room for voltage scaling in wide and parallel systems (SIMD/MIMD type applications).

Further, in previous attempts to integrate the arbiter and the crossbar together, such as for example discussed in the earlier mentioned article "A Virtual Channel Router for On-chip Networks," IEEE International SoC Conference, 12-15 Sep. 2004, pages: 289-293, it has only been possible to bring them spatially close. However, the logic and interconnect for both functionalities have remained exclusive.

In conventional implementations, collision detection and resolution is done hierarchically. This is achieved in multiple stages of arbitration logic, wherein after each stage the number of requests is reduced by a certain fraction.

Commonly owned US published patent application US 2010/0211720, the entire contents of which are hereby incorporated by reference, describes a self-arbitrating design of crossbar circuitry that enables a very efficient resolution of conflicts to be performed by applying a predetermined priority scheme, whilst providing a very regular design, with uniform delay across all paths, and which requires significantly less control lines that typical prior art crossbar designs. Such crossbar circuitry is readily scalable to form large crossbars.

However, certain types of priority scheme are still difficult to implement efficiently, for example adaptive priority schemes where the relative priorities of the source circuits change between each application of the adaptive priority scheme. US 2010/0211720 proposed the use of a priority configuration module which, in a priority assignment mode of operation, was able to reprogram the values in selected priority storage circuits of the crossbar. It was also identified that such a priority configuration module could be made adaptive by monitoring activity of the crossbar and determining how to update the priority storage circuits dependent on that analysis. However, such an approach impacts efficiency of the crossbar for a number of reasons.

Firstly it is necessary to enter a dedicated priority assignment mode of operation in order to reprogram the priority storage circuits, thereby causing clock cycles to be spent purely performing the priority update process. Typically it is also only possible at one time to reprogram the storage circuits of the crossbar cells connected to one data output path. Furthermore, for the adaptive priority configuration module, it is necessary first to extract information from the crossbar indicative of the activities of the crossbar, then to analyse that extracted information, and then to input the revised priority data into the crossbar for storage within the relevant priority storage circuits, thereby leading to an inefficient update process.

One type of adaptive priority scheme which has traditionally been difficult to implement efficiently is the least recently granted (LRG) priority scheme, where the relative priorities of the various source circuits are updated dependent on which source circuit wins a current arbitration process. In particular, if source circuit X wins the arbitration process, then in accordance with the LRG scheme all sources having a lower priority than source X have their priorities increased, all sources having a higher priority than source X have their priorities maintained at their current level, and source X has its priority demoted so as to have the lowest relative priority.

Although the LRG priority scheme guarantees fairness, and a better quality of service (QoS) than other priority schemes (for example round-robin, pseudo round-robin, random priority assignment, etc), its hardware implementation typically results in a significant overhead in the area, performance and energy consumption of the crossbar circuit. In addition the hardware complexity grows quadratically with the size of the crossbar circuit.

In contemporary switching fabrics that support LRG, the arbiter updates the priorities assigned to different sources by keeping track of all incoming and granted requests in the network. This requires additional memory, processing elements and wires to implement this in hardware.

Accordingly, it would be desirable to provide an improved crossbar design that alleviates the above described problems associated with supporting adaptive priority schemes.

SUMMARY OF THE INVENTION

Viewed from a first aspect, the present invention provides crossbar circuitry for interconnecting a plurality of source circuits and a plurality of destination circuits such that data input to the crossbar circuitry from any of said plurality of source circuits can be output to any of said plurality of destination circuits, the crossbar circuitry comprising: a plurality of data input paths passing through said crossbar circuitry, each data input path being connectable to one of said plurality of source circuits and providing a plurality of word lines; a plurality of data output paths passing through said crossbar circuitry transverse to the plurality of data input paths, each data output path being connectable to one of said plurality of destination circuits and providing a plurality of bit lines; a crossbar cell associated with each intersection between one of said data input paths and one of said data output paths, each crossbar cell comprising: configuration storage circuitry programmable in an arbitration mode of operation to store a routing value in dependence on a voltage on at least one of said plurality of bit lines, the routing value being programmed to a first value to indicate that data input along the word lines of the data input path to the associated intersection is to be output on the bit lines of the data output path at the associated intersection, and the routing value being programmed to a second value to indicate that data input along the word lines of the data input path to the associated intersection is not to be output on the bit lines of the data output path at the associated intersection; transmission circuitry which in a transmission mode of operation is responsive to the routing value having said first value to detect the data input along the word lines of the data input path and to output an indication of that data on the bit lines of the data output path at the associated intersection; arbitration circuitry that operates in said arbitration mode of operation in dependence on a transmission request received by the crossbar cell from the source circuit connected to the data input path of the associated intersection, if the transmission request is asserted to indicate that said source circuit wishes to route data from the data input path to the data output path at the associated intersection, the arbitration circuitry being arranged to operate in combination with the arbitration circuitry of other crossbar cells associated with the same data output path to selectively modify the voltage on the plurality of bit lines in order to apply an adaptive priority scheme, such that in the presence of multiple asserted transmission requests for said same data output path, the configuration storage circuitry of only one crossbar cell associated with said same data output path has its routing value programmed to said first value, thereby resolving conflict between said multiple asserted transmission requests according to said adaptive priority scheme; and priority storage circuitry configured to store priority data identifying which of the plurality of bit lines are to have their voltage modified by the associated arbitration circuitry in order to apply the adaptive priority scheme; the priority storage circuitry being configured, between each application of the adaptive priority scheme by the arbitration circuitry, to self update the priority data stored therein in dependence on the voltage of at least one of the plurality of bit lines.

In accordance with the present invention, crossbar cells are associated with each intersection between a data input path and a data output path, with each crossbar cell comprising transmission circuitry arranged in a transmission mode of operation to selectively connect data on its data input path to its data output path in dependence on a routing value stored in an associated configuration storage circuit, and arbitration circuitry that operates in an arbitration mode of operation in combination with the arbitration circuitry of other crossbar cells in order to resolve conflicts between multiple asserted transmission requests. In particular, if a transmission request is asserted from a source circuit to a crossbar cell, then the arbitration circuitry of that crossbar cell operates in combination with the arbitration circuitry of other crossbar cells associated with the same data output path to selectively modify the voltage on the plurality of bit lines in order to apply an adaptive priority scheme, such that in the presence of multiple asserted transmission requests for that same data output path, the configuration storage circuitry of only one crossbar cell associated with the same data output path has its routing value programmed to a first value (i.e. the value that causes the crossbar cell to couple its data input path to its data output path in the transmission mode of operation).

In addition, each crossbar cell has priority storage circuitry configured to store priority data identifying which of the plurality of bit lines are to have their voltage modified by the associated arbitration circuitry in order to apply the adaptive priority scheme, and the priority storage circuitry is configured, between each application of the adaptive priority scheme by the arbitration circuitry, to self update the priority data stored therein in dependence on the voltage of at least one of the plurality of bit lines.

Hence, it can be seen that in accordance with the present invention, in the arbitration mode of operation, the bit lines of the data output paths are re-used to detect conflicts for particular data output paths, to resolve those conflicts such that at any point in time only one source circuit is granted access to a particular data output path, and to update the priority data stored in the priority storage circuitry. This provides a fast and scalable technique for implementing adaptive priority schemes within a crossbar circuit. The approach is significantly more scalable than prior art techniques (in embodiments of the present invention the hardware complexity grows linearly with the size of the interconnection network provided by the crossbar), and can be implemented with little overhead to the interconnection network, and little performance impact.

In the arrangement of the present invention, both the arbiter and the crossbar functions are integrated together within the crossbar circuitry. The arbiter is highly logic dominated while the crossbar is highly routing dominated, and by bringing these two functions together within the crossbar cells of the crossbar circuitry, a more efficient utilisation of routing tracks and silicon space in the chip is achieved. In addition, the communication overhead that traditionally is incurred between the crossbar and the arbiter is now alleviated. By storing the crossbar configuration at the crossbar cells associated with each intersection within the crossbar circuitry, this allows re-utilisation of the bit lines of the data output paths for arbitration.

In accordance with the present invention, the crossbar circuitry can be laid out in the style of an SRAM array topology, with the crossbar cells being laid out in an array, the data input paths providing word lines, and the data output paths providing bit lines. Such an arrangement allows for a very efficient layout both in terms of size and in terms of the number of interconnects required.

Whilst the adaptive priority scheme can take a variety of forms, in one embodiment the adaptive priority scheme is a least recently granted (LRG) scheme. As mentioned earlier, LRG schemes have traditionally been complex to implement in hardware, and hence the ability to provide an LRG scheme using embodiments of the present invention presents a very significant improvement over the known prior art approaches.

In one embodiment, each data output path provides n bit lines, and each configuration storage circuitry is associated with one of said n bit lines via which the routing value is programmed into the configuration storage circuitry, such that for up to n crossbar cells associated with the same data output path, the configuration storage circuitry of those crossbar cells have a different associated bit line of said n bit lines. Within each crossbar cell the arbitration circuitry and the priority storage circuitry is associated with the n−1 bit lines other than the one bit line associated with the configuration storage circuitry of that crossbar cell, with the priority storage circuitry identifying which of those n−1 bit lines should have their voltages modified by the arbitration circuitry in order to apply said adaptive priority scheme.

In one particular embodiment, the priority storage circuitry may be formed of n−1 priority storage elements, one for each of the n−1 bit lines associated with the priority storage circuitry. The priority storage elements can take a variety of forms, but in one embodiment are formed of SRAM cells.

In one such embodiment, in said arbitration mode of operation, after the arbitration circuitry of any crossbar cells associated with the same data output path that receive an asserted transmission request has selectively modified the voltage on the n bit lines in order to apply said adaptive priority scheme, each configuration storage circuitry of a crossbar cell receiving an asserted transmission request is configured to sample the voltage on its associated bit line in order to program said routing value.

In one embodiment, each crossbar cell further comprises release circuitry coupled to the one bit line associated with the configuration storage circuitry of that crossbar cell, on receipt of an asserted release request the channel release circuitry causing the voltage on that one bit line to be modified to a level that causes said second value to be stored as said routing value in the configuration storage circuitry of that crossbar cell, thereby causing the crossbar cell to release the associated data output path to allow re-allocation of that data output path.

This provides a simple and effective mechanism for allowing a source circuit to release a particular data output path when it has finished transmitting data, thereby allowing another source circuit to subsequently seek to acquire that data output path.

In one embodiment, the priority storage circuitry in those crossbar cells associated with the released data output path is responsive to the asserted release request to self update the priority data stored therein in dependence on the voltage of at least one of the plurality of bit lines. Hence, in such embodiments, the asserted release request provides a convenient event to trigger the performance of the self update process, and ensures that the self update process is performed between each application of the adaptive priority scheme by the arbitration circuitry.

In one embodiment, each priority storage circuitry comprises a plurality of priority storage elements, each priority storage element being associated with one of said plurality of bit lines, and within each priority storage circuitry the current value of the plurality of priority storage elements indicating, for the associated data output path, a relative priority level for the source circuit coupled to the crossbar cell containing that priority storage circuitry.

In one such embodiment where the adaptive priority scheme is a least recently granted (LRG) priority scheme, then within the priority storage circuitry of those crossbar cells associated with the released data output path, those priority storage elements that are associated with the bit line whose voltage is modified by the release circuitry are set to a first value, whereby the relative priority level of each source circuit other than the source circuit releasing the data output path is either increased or maintained. Further, for the crossbar cell containing the release circuitry that received the asserted release request, the priority storage circuitry has its priority storage elements cleared to a second value, whereby the source circuitry releasing the data output path is assigned a relative priority lower than the other source circuits. This provides a particularly efficient mechanism for implementing the LRG scheme, with the relative priority levels of the source circuits being independently updated for each data output path as that data output path is released.

In one embodiment, at an initialization point, the priority storage circuitry of each crossbar cell are initialized to predetermined values to provide initial relative priority levels for the plurality of source circuits in respect of each of the plurality of data output paths.

In one embodiment, the initial relative priority levels can be specified independently for each data output path. Further, in one embodiment, each priority storage circuitry is responsive to a reset signal asserted at the initialization point in order to set itself to a predetermined value. In one particular embodiment the individual priority storage elements of each priority storage circuitry can take one of two forms, so that on application of the reset signal, their value is updated to either a logic 1 value or a logic 0 value dependent on their form.

In one particular embodiment, each of the bit lines are precharged to a first voltage level, and on receipt of said asserted release request, the release circuitry discharges the voltage on the one bit line associated with the configuration storage circuitry of that crossbar cell. Further, each configuration storage circuitry comprises a sense-amp enabled latch which, in the presence of an asserted release request to the associated release circuitry, senses the voltage on its associated bit line following the discharge operation performed by the release circuitry in order to update the routing value to said second value, thereby releasing the associated data output path. Hence, in such embodiments, to release a channel at a crossbar cell, the bit line that is sensed by the associated sense-amp enabled latch is discharged and subsequently sampled.

In one embodiment, each data input path provides n word lines, and the release requests for up to n crossbar cells associated with the same data input path are input to the crossbar circuitry via the n word lines of that same data input path. Further, each release circuitry is associated with one of said n word lines, such that for up to n crossbar cells associated with the same data input path, the release circuitry of those crossbar cells have a different associated word line of said n word lines via which the release request is received. Hence, in such embodiments, the release requests can, be issued in an efficient manner through re-use of the word lines of the data input paths.

In one particular embodiment, the release requests are issued in said arbitration mode of operation, and a control signal is issued by the plurality of source circuits in the arbitration mode of operation to identify if the n word lines of the associated data input path are carrying release requests or transmission requests. Hence, in such embodiments the control signal can be used to qualify whether the information routed over the word lines identifies release requests or transmission requests, and hence whether the arbitration circuitry or the release circuitry needs to be activated. In one particular embodiment, the control signal actually takes the form of two separate signal lines, one being a request_channel signal and the other being a release_channel signal, only one of these two signals being allowed to be set at any point in time. In one embodiment these two signals are provided on a per row basis, and hence within any particular row the crossbar cells will either be processing release requests or transmission requests at any point in time. In some implementations it would be possible to provide a finer granularity of control signals, so that some crossbar cells in a row could be processing release requests whilst others are processing transmission requests.

Since the configuration storage circuits of different crossbar cells in the same data output path are associated with different bit lines, and the arbitration circuits of those crossbar cells in that data output path receiving an asserted transmission request selectively modify the voltage on the n bit lines, it is possible to apply the adaptive priority scheme by ensuring that at the point the configuration storage circuit of each crossbar cell receiving an asserted transmission request samples the voltage on its associated bit line following the arbitration process, only one of the bit lines will be at a value that would cause the associated configuration storage circuit to store said first value as the routing value, thereby allowing only a single source circuit to be granted access to a data output path at any point in time.

The manner in which the arbitration circuits selectively modify the voltage on the n bit lines can be varied dependent on implementation. However, in one embodiment, each of the bit lines are precharged to a first voltage level and then during the arbitration mode of operation the arbitration circuitry of any crossbar cells associated with the same data output path that receive an asserted transmission request selectively discharge the voltage on the n bit lines in order to apply said adaptive priority scheme. Hence, in such embodiments, the bit lines are conditionally discharged in order to apply the adaptive priority scheme, thereby resolving any conflicts during the arbitration mode of operation.

There are a number of ways in which the transmission request can be asserted from the source circuits to the crossbar cells. However, in one embodiment, each data input path provides n word lines, and in the arbitration mode of operation the transmission requests for up to n crossbar cells associated with the same data input path are input to the crossbar circuitry via the n word lines of that same data input path. Hence, in such embodiments, the data input paths are themselves re-used in the arbitration mode of operation for the provision of asserted transmission requests.

In one particular embodiment, each configuration storage circuitry is associated with one of said n word lines, such that for up to n crossbar cells associated with the same data input path, the configuration storage circuitry of those crossbar cells have a different associated word line of said n word lines via which the transmission request is received.

In such embodiments where the n word lines of the data input paths and the n bit lines of the data output paths are re-used during the arbitration mode of operation, it can be seen that conflict detection and resolution can be performed in a single stage, thereby yielding significant performance benefits when compared with the conventional prior art approach where collision detection and resolution is done hierarchically in multiple stages.

In particular, it will be seen that for crossbar circuitry containing a matrix of up to n×n crossbar cells, conflict detection and resolution can be performed in a single stage.

However, the techniques of embodiments of the present invention can also be used with crossbar circuits having a larger matrix of crossbar cells. In particular, in one embodiment, a matrix of mn×mn crossbar cells are provided; wherein m is an integer of 2 or more, the matrix is divided into a plurality of sections, and a series of arbitration operations are used to apply the adaptive priority scheme to cause the configuration storage circuitry of only one crossbar cell associated with said same data output path to have its routing value programmed to said first value, thereby resolving conflict between multiple asserted transmission requests according to said adaptive priority scheme. For each arbitration operation in the series, one or more of the sections in said plurality of sections are subjected to that arbitration operation.

In one particular embodiment, each arbitration operation operates on a single section, such that after said series of arbitration operations have been performed all of said plurality of sections have been subjected to said arbitration operation. Hence, by way of example, for a 64×64 crossbar circuit with 16-bit data input paths and data output paths, the crossbar circuitry can be divided into four sections, with the arbitration operation being performed in sequence on each of those sections. In one embodiment a counter can be incremented every cycle to select which section to serve during arbitration in that cycle (in the above example a two bit counter would suffice). Such an implementation still maintains the benefits of minimal wiring and logic overhead, but the arbitration latency for a given request can vary dependent on the section with which that request is associated (in the above example the latency can vary from one to four cycles). The self update of the priority data will then take place after all sections have been processed.

In an alternative embodiment, in a first arbitration operation of the series, all of the plurality of sections are subjected to the first arbitration operation in order to identify one of the sections in said plurality that contains the configuration storage circuitry whose routing value is to be programmed to said first value. Then, in a second arbitration operation of the series, said one of the sections identified by the first arbitration operation is subjected to the second arbitration operation to identify the configuration storage circuitry within that section whose routing value is to be programmed to said first value. In accordance with such embodiments, the crossbar is again divided into sections, but arbitration is then performed hierarchically in two steps, first among the sections, and then among all requests in a given section. The same group of bit lines can be used for both arbitration steps. The self update of the priority data will then take place after both steps of the arbitration have taken place.

In one embodiment, each crossbar cell is provided with two configuration storage circuits, the first being used to detect if the associated section contains the highest priority asserted transmission request, and the second being used in the subsequent arbitration step to detect if the highest priority asserted transmission request is associated with that particular crossbar cell.

By way of example, in a 64×64 crossbar with 16-bit data input paths and data output paths, the crossbar could again be divided into four sections. If section 0 has the highest priority and at least one source associated with that section asserts a transmission request, then in the first stage of arbitration the first configuration storage circuits in each crossbar cell in that section will have a routing value programmed to the first value, whilst those in the other sections will have their routing values programmed to the second value (in both cases the programming occurring as a result of the voltages on the bit lines associated with each first configuration storage circuit). In the next cycle, only asserted transmission requests in respect of section 0 are considered, with the bit lines again being used for arbitration, and with the second configuration storage circuits now sensing the associated bit lines. In the event that both configuration storage circuits at a particular crossbar cell have their routing value set to the first value, this indicates that the associated asserted transmission request has prevailed, and in the data transmission mode of operation that crossbar cell will connect its input to its output.

Such an implementation will have a fixed two cycle arbitration latency at the expense of some additional logic, but no additional interconnect. With 16 bit lines in a data output path, it is possible to arbitrate between up to 16 sections, with each section being able to receive up to 16 asserted transmission requests. Hence, the arbitration latency can be retained at two cycles for a crossbar up to a 256×256 crossbar.

In one embodiment, when a crossbar cell has its routing value programmed to the first value during the arbitration mode of operation, a grant signal is asserted to the associated source circuit to confirm that the transmission request that it asserted has been granted. In one embodiment, a source circuit can only send a single request at a time, and in such an embodiment there will typically be only a single grant signal issued per row. However, in an alternative embodiment, a source circuit may be able to send multiple requests at a time, and in such embodiments multiple grant signals per row can be provided, with one grant signal being associated with each data output path.

The transmission circuitry can operate in a variety of ways. However, in one embodiment, each data output path associated with a crossbar cell in the transmission mode of operation is precharged to a first logic level prior to data transfer, the transmission circuitry of each crossbar cell comprising: first and second switches connected in series between the data output path and a second logic level; in the transmission mode of operation the first switch being open or closed dependent on the routing value stored in the associated configuration storage circuitry, and the second switch being open or closed dependent on the data input over the data input path. In one particular embodiment, the first logic level is the supply voltage level Vdd and the second logic level is ground. Hence, by such an arrangement, the data on the input data path does not directly drive the data on the output data path, and instead the data on the output data path either remains at the first logic level, or is discharged towards the second logic level in the event that both the first and second switches are closed.

By such an arrangement of transmission circuitry, the transmission circuitry does not need to be altered irrespective of the size of the crossbar circuitry and hence the length of the data output path, and further the drive circuitry providing the input data over the input data path also does not need resizing as the crossbar circuitry is increased in size. Hence, if the crossbar circuitry is increased in size, the circuitry of each crossbar cell does not need to be changed and instead only the number of crossbar cells needs to increase. Thus, by using such a design, the delay of the crossbar circuitry grows linearly with size, making such a design of crossbar circuitry useable with very large crossbars (for example with 128×128 or 256×256 inputs/outputs). In addition, the design is very regular and the delay across all routes through the crossbar circuitry is uniform.

In one embodiment, each said data input path comprises n word lines for carrying an n-bit input data value during the transmission mode of operation, and each said data output path comprises n bit lines for carrying an n-bit data value during said transmission mode of operation, at least the second switch being replicated for each bit line. Accordingly, the design of the transmission circuitry can readily accommodate various sizes of data input paths and data output paths, without any significant increase in the complexity of the crossbar circuitry.

In one embodiment, in the transmission mode of operation, a bit line of the data output path is pulled to the second logic level if the routing value is said first value and the input data bit on the corresponding word line is at said first logic level. Hence, if the routing value stored in the configuration storage circuitry indicates that the data input path should be coupled to the data output path, and the data on the data input path is at a logic one level, then the data output path will be discharged towards the second logic level.

In one embodiment each crossbar cell further comprises conditional discharge circuitry for turning off the first switch irrespective of the routing value whilst the associated data output path is being precharged to the first logic level, and for allowing the first switch to be controlled by the routing value following the precharging of the associated data output path to the first logic level. Accordingly, such conditional discharge circuitry isolates the bit lines of the data output path from the inputs whilst they are being precharged, thereby reducing the power consumption of the precharge operation. Also, by such an arrangement, the data input paths can be driven simultaneously with the precharge operation, due to the conditional discharge circuitry isolating the data output paths from the inputs at that time, thereby enabling an increased speed of operation.

Furthermore, by using the arrangement of transmission circuitry described above, it should be noted that all bit lines of the data output path are precharged to the first logic level, and then either stay at the first logic level or transition to the second logic level dependent on the input value on the associated word line of the data input path and the routing value. As a result, no situation arises where the voltages on two adjacent bit lines are moving in opposite directions, thereby reducing capacitive coupling effects and thereby improving speed of operation.

In embodiments where the data output path is precharged prior to data transfer, and then selectively discharged dependent on the routing value and the data input value, power consumption of the crossbar circuitry can be reduced through the use of sense amplifier circuitry. In particular, in one embodiment, the crossbar circuitry further comprises sense amplifier circuitry to detect, during the transmission mode of operation, the data output on the bit lines of the data output path, thereby allowing detection of a transition towards the second logic level before the voltage on a bit line of the data output path has reached the second logic level. Since the detection of the transition occurs before a bit line of the data output path has reached the second logic level, the power required to precharge the bit lines of the data output path back to the first logic level is significantly reduced.

In embodiments where such precharging of the data output paths occurs, then further power savings can be obtained by suitable encoding of the input data prior to provision to the crossbar circuitry. In particular, in one embodiment, the crossbar circuitry further comprises: encode circuitry between each of said plurality of source circuits and said plurality of data input paths; decode circuitry between each of said plurality of data output paths and said plurality of destination circuits; the encode circuitry applying an encoding operation to encode input data provided by each source circuit into an encoded format that reduces the number of times the data output paths need to be pulled to the second logic level following their precharge to the first logic level, when compared to the number of times the data output paths would need to be pulled to the second logic level if the original input data were passed through the crossbar circuitry; the decode circuitry applying a corresponding decoding operation to identify the original input data provided by the source circuit from the encoded data output over the data output path.

In one particular embodiment, the encoding operation ensures that the encoded format produced from the input data is only a logic one value when the input data changes, and accordingly the data output path is only discharged when the input changes. The decode circuitry then recreates the original input data from the encoded data output over the data output path.

Due to the regular design of the crossbar circuitry of embodiments of the present invention, and the manner in which the transmission circuits of each crossbar cell operate, the plurality of source circuits are connectable to either end of the plurality of data input paths, thereby significantly improving flexibility when designing the layout of the apparatus in which the crossbar circuitry and source circuits are provided. Similarly, the plurality of destination circuits are connectable to either end of the plurality of data output paths.

In one embodiment, a sequence of word line drivers may be used to propagate data input values along the data input paths to the various crossbar cells connected to those data input paths. In a single request embodiment, where multi-casting is not supported, and accordingly each source will only request access to a single output path at a time, significant power may be consumed in propagating the data along the entirety of the data input path in situations where it is not needed. In one embodiment this power consumption is alleviated through the provision of a partially activated network arrangement. In particular, in one embodiment, each data input path consists of multiple input path portions separated by word line drivers, and each word line driver is activated in dependence on the routing values stored in the configuration storage circuitry of crossbar cells provided along the associated data input path but further from the source circuit than that word line driver. As a result, each word line driver is only activated if the configuration storage circuitry of at least one crossbar cell provided along the associated data input path but further from the source circuit than that word line driver has a routing value set to said first value. Such an approach can yield significant power savings.

The crossbar circuitry of embodiments of the present invention may be utilised in a variety of systems. However, according to a second aspect of the present invention, a data processing apparatus is provided comprising: a plurality of memory devices for storing data values; a plurality of processors for performing data processing operations in parallel on multiple of the data values stored in said plurality of memory devices; and crossbar circuitry in accordance with the first aspect of the present invention for routing the data value from any of said plurality of memory devices to any of said plurality of processors.

The crossbar circuitry of embodiments of the present invention provides a particularly simple, scalable and power efficient mechanism for routing data values from any of the memory devices to any of the processors.

Viewed from a third aspect, the present invention provides crossbar circuitry for interconnecting a plurality of source means and a plurality of destination means such that data input to the crossbar circuitry from any of said plurality of source means can be output to any of said plurality of destination means, the crossbar circuitry comprising: a plurality of data input path means passing through said crossbar circuitry, each data input path means for connecting to one of said plurality of source means and providing a plurality of word line means; a plurality of data output path means passing through said crossbar circuitry transverse to the plurality of data input path means, each data output path means for connecting to one of said plurality of destination means and providing a plurality of bit line means; a crossbar cell means associated with each intersection between one of said data input path means and one of said data output path means, each crossbar cell means comprising: configuration storage means programmable in an arbitration mode of operation for storing a routing value in dependence on a voltage on at least one of said plurality of bit line means, the routing value being programmed to a first value to indicate that data input along the word line means of the data input path means to the associated intersection is to be output on the bit line means of the data output path means at the associated intersection, and the routing value being programmed to a second value to indicate that data input along the word line means of the data input path means to the associated intersection is not to be output on the bit line means of the data output path means at the associated intersection; transmission means, responsive to the routing value having said first value in a transmission mode of operation, for detecting the data input along the word line means of the data input path means and to output an indication of that data on the bit line means of the data output path means at the associated intersection; arbitration means for operating in said arbitration mode of operation in dependence on a transmission request received by the crossbar cell means from the source means connected to the data input path means of the associated intersection, if the transmission request is asserted to indicate that said source means wishes to route data from the data input path means to the data output path means at the associated intersection, the arbitration means for operating in combination with the arbitration means of other crossbar cell means associated with the same data output path means to selectively modify the voltage on the plurality of bit line means in order to apply an adaptive priority scheme, such that in the presence of multiple asserted transmission requests for said same data output path means, the configuration storage means of only one crossbar cell means associated with said same data output path means has its routing value programmed to said first value, thereby resolving conflict between said multiple asserted transmission requests according to said adaptive priority scheme; and priority storage means for storing priority data identifying which of the plurality of bit line means are to have their voltage modified by the associated arbitration means in order to apply the adaptive priority scheme; the priority storage means for self updating the priority data stored therein in dependence on the voltage of at least one of the plurality of bit line means, between each application of the adaptive priority scheme by the arbitration means.

Viewed from a fourth aspect, the present invention provides a method of operating crossbar circuitry to interconnect a plurality of source circuits and a plurality of destination circuits such that data input to the crossbar circuitry from any of said plurality of source circuits can be output to any of said plurality of destination circuits, the crossbar circuitry having a plurality of data input paths passing through said crossbar circuitry, each data input path being connectable to one of said plurality of source circuits and providing a plurality of word lines, and a plurality of data output paths passing through said crossbar circuitry transverse to the plurality of data input paths, each data output path being connectable to one of said plurality of destination circuits and providing a plurality of bit lines, the method comprising the steps of: employing a crossbar cell in association with each intersection between one of said data input paths and one of said data output paths; programming a routing value in each crossbar cell in an arbitration mode of operation, the routing value being programmed in dependence on a voltage on at least one of said plurality of bit lines, the routing value being programmed to a first value to indicate that data input along the word lines of the data input path to the associated intersection is to be output on the bit lines of the data output path at the associated intersection, and the routing value being programmed to a second value to indicate that data input along the word lines of the data input path to the associated intersection is not to be output on the bit lines of the data output path at the associated intersection; in a transmission mode of operation, causing the crossbar cell to be responsive to the routing value having said first value to detect the data input along the word lines of the data input path and to output an indication of that data on the bit lines of the data output path at the associated intersection; in said arbitration mode of operation, causing arbitration circuitry in the crossbar cell to operate in dependence on a transmission request received by the crossbar cell from the source circuit connected to the data input path of the associated intersection, if the transmission request is asserted to indicate that said source circuit wishes to route data from the data input path to the data output path at the associated intersection, the arbitration circuitry operating in combination with the arbitration circuitry of other crossbar cells associated with the same data output path to selectively modify the voltage on the plurality of bit lines in order to apply an adaptive priority scheme, such that in the presence of multiple asserted transmission requests for said same data output path, the configuration storage circuitry of only one crossbar cell associated with said same data output path has its routing value programmed to said first value, thereby resolving conflict between said multiple asserted transmission requests according to said adaptive priority scheme; storing, in priority storage circuitry within the crossbar cell, priority data identifying which of the plurality of bit lines are to have their voltage modified by the associated arbitration circuitry in order to apply the adaptive priority scheme; and arranging the priority storage circuitry, between each application of the adaptive priority scheme by the arbitration circuitry, to self update the priority data stored therein in dependence on the voltage of at least one of the plurality of bit lines.

BRIEF DESCRIPTION OF THE DRAWINGS

The present invention will be described further, by way of example only, with reference to embodiments thereof as illustrated in the accompanying drawings, in which:

FIGS. 10A to 10D illustrate in more detail components provided within each crossbar cell of the crossbar circuit in accordance with one embodiment;

FIGS. 13A to 13C illustrate the configuration of a pulse generator for generating discharge and sense enable (SE) signals in accordance with one embodiment;

DESCRIPTION OF EMBODIMENTS

Figure 1:
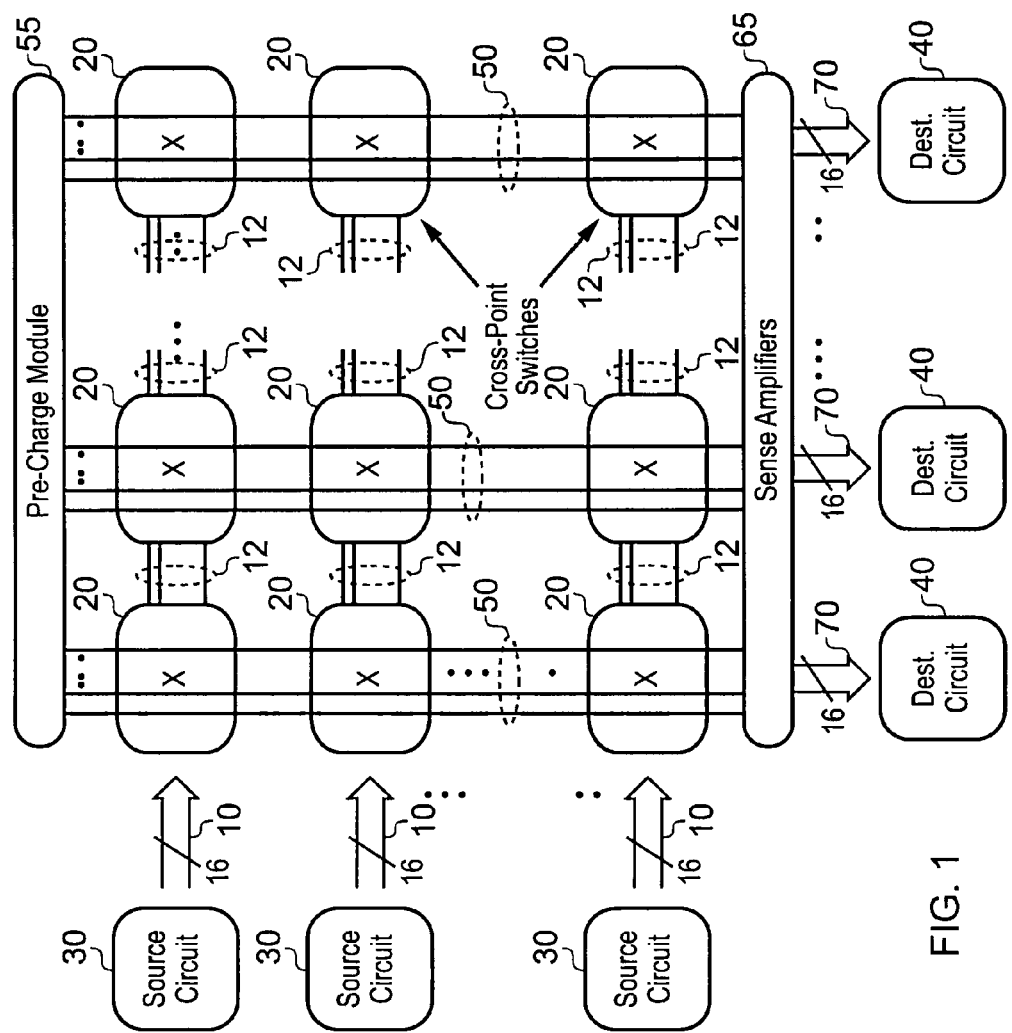
FIG. 1 is a block diagram of crossbar circuitry in accordance with one embodiment.

FIG. 1 illustrates a top-level diagram of a proposed switching fabric, comprising a crossbar circuitry in accordance with one embodiment and a plurality of source circuits and destination circuits connected thereto. The crossbar circuitry includes a plurality of data input paths 12 running in a first direction through the crossbar circuitry, and a plurality of data output paths 50 running in a second direction transverse to the first direction. In the embodiment of FIG. 1, both of these paths are formed by multi-bit buses, and in particular each data input path comprises a plurality of word lines and each data output path comprises a plurality of bit lines.

At the intersection between each data input path and data output path, a crossbar cell 20 is provided, which is used to selectively route data received on the associated data input path out on the associated data output path. Each crossbar cell includes a configuration storage element for storing the on/off status of each crossbar cell, such that if the crossbar cell is in the on state, then it will route input data received on the data input path to the data output path, and if the cell is in the off state, the input data will merely be passed through the cell without being routed onto the associated data output path.

Each data input path 12 is coupled to an associated source circuit 30 from which input data 10 may be received, and each data output path 50 is coupled to an associated destination circuit 40 arranged to receive the output data 70 provided on that data output path.

In the embodiment shown, the bit lines of each data output path 50 are precharged using a pre-charge module 55, and then the bit lines are selectively discharged dependent on the data input from one of the source circuits to a crossbar cell connecting that source circuit's data to the data output path. This selective discharge of the bit lines is detected by the sense amplifier circuitry 65, in order to produce the output data 70.

Whilst data is routed through the crossbar circuitry in the above described manner when the crossbar is in a transmission mode of operation, the crossbar circuitry will not always be in the transmission mode of operation. In particular, the crossbar circuitry has an arbitration mode of operation during which it detects and resolves any conflicts between transmission requests issued by the various source circuits 30. In particular, multiple requests for the same destination circuit in a switching fabric is termed a collision, and with increasing numbers of sources and destinations, collisions become more frequent. As will be discussed in more detail later, each crossbar cell 20 includes arbitration circuitry which, in the arbitration mode of operation, operates in combination with arbitration circuitry of other crossbar cells, re-using the bit lines of the data output paths to detect the presence of multiple asserted transmission requests and, in the event of such multiple asserted transmission requests, to implement an adaptive priority scheme to resolve those conflicts. The proposed approach provides a fast, low-power and highly scalable solution to detect and resolve such collisions.

Each crossbar cell includes priority storage circuitry for storing priority data referenced by the arbitration circuitry when implementing the adaptive priority scheme, the priority storage circuitry being configured to re-use the bit lines to self update the priority data stored therein between each application of the adaptive priority scheme by the arbitration circuitry.

Whilst in FIG. 1 the source circuits are shown to the left hand side of the crossbar and the destination circuits are shown at the bottom of the crossbar, the source circuits can be provided at either side of the crossbar circuitry, and similarly the destination circuits can be provided at either end of the data output paths. Hence, it will be appreciated that the crossbar circuitry of embodiments of the present invention offers the flexibility of placing sources at either horizontal ends and destinations at either vertical ends. This simplifies design floor planning by reducing routing congestion.

Figure 2:
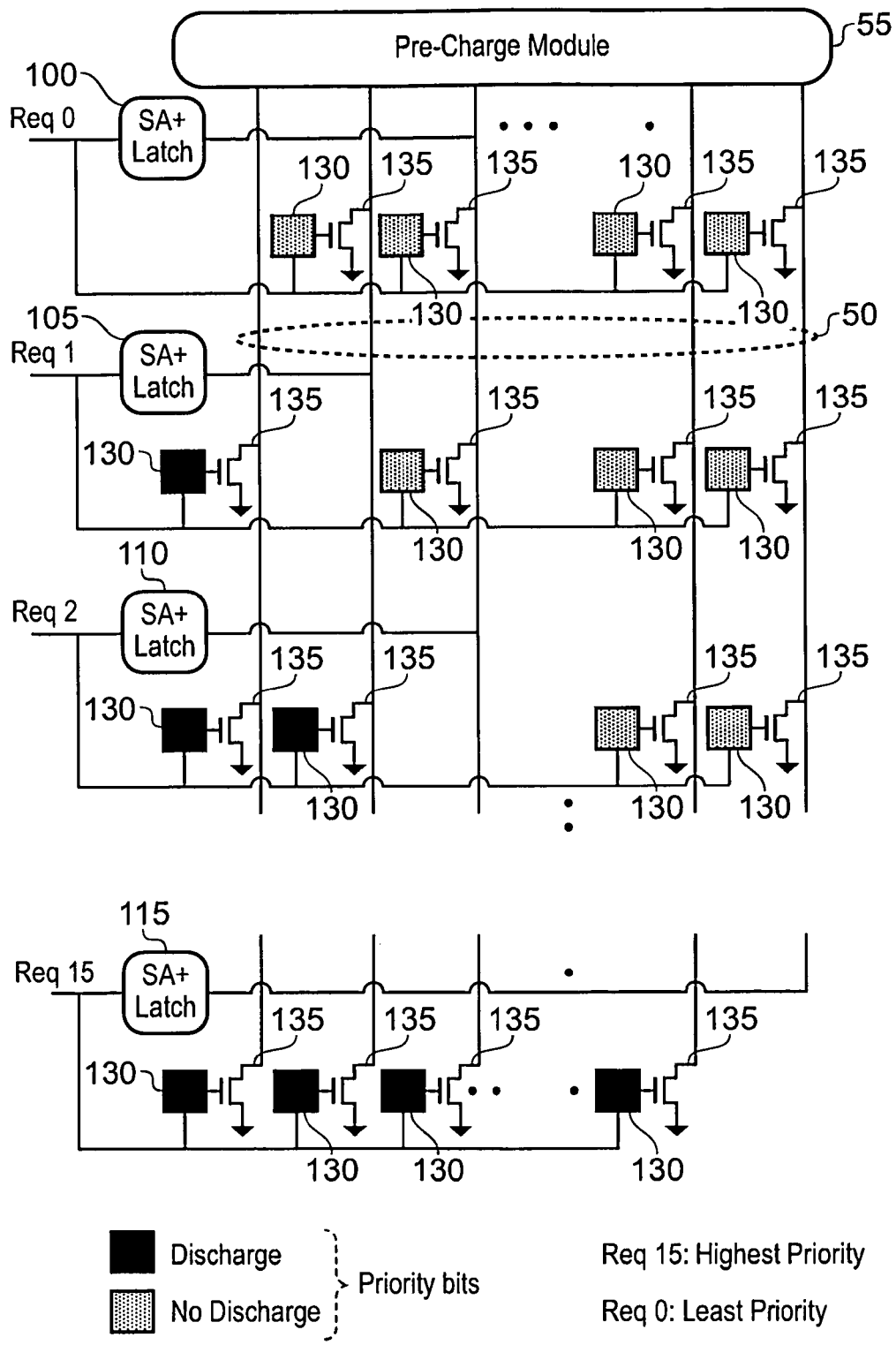
FIG. 2 illustrates how priority storage circuitry provided in association with each crossbar cell may be used in one embodiment.

FIG. 2 illustrates how the bit lines of the data output paths may be re-used to detect and resolve conflicts during the arbitration mode of operation. In this example, there are 16 source circuits connected to the crossbar circuitry, that may issue transmission requests 0 to 15. For any particular data output path 50, each source circuit will be associated with a crossbar cell 20 which incorporates within it configuration storage circuitry in the form of a sense amp and latch. Hence, source 0 is associated with the crossbar cell containing the sense amp and latch 100, source 1 is associated with the crossbar cell containing the sense amp and latch 105, source 2 is associated with the crossbar cell containing the sense amp and latch 110, and so for the remainder of the source circuits, such that source circuit 15 is associated with the crossbar cell containing the sense amp and latch 115.

In the arbitration mode of operation, the precharge module 55 precharges all of the bit lines of each data output path 50, whereafter those bit lines are selectively discharged dependent on the asserted transmission requests and in accordance with an adaptive priority scheme. In this example, each data output path 50 comprises 16 bit lines, and it can be seen that each of the sense amp and latch circuits are associated with a different one of those bit lines. Following the precharge of the bit lines, the transmission requests asserted by the various source circuits are evaluated, an asserted transmission request in this embodiment taking a logic one value.

As shown in FIG. 2, the priority storage circuitry of each crossbar cell comprises a series of priority storage elements 130, one for each bit line other than the bit line to which the sense amp and latch of that crossbar cell is connected. In particular, as shown in FIG. 2, each crossbar cell includes a sequence of transistors 135 associated with each of the bit lines other than the bit line connected to the sense amp and latch circuitry of that crossbar cell. In the presence of an asserted transmission request, priority storage elements 130 are then used to provide a value to the gate of those transistors 135, in dependence on a value programmed into those priority storage elements.

As shown in FIG. 2, all of the priority storage elements 130 shaded dark are currently programmed to a logic one value and all of the priority storage elements 130 shaded light are currently programmed to a logic zero value. Hence, in the presence of an asserted transmission request, transistors attached to priority storage elements storing a logic one value discharge the bit lines while those attached to priority storage elements storing a logic zero value do not. In the example illustrated in FIG. 2, it is assumed that for the current application of the adaptive priority scheme, source 15 has the highest priority, such that if it asserts a transmission request, this causes the discharge of all of the bit lines other than the bit line of its associated sense amp and latch circuit 115. Source 14 has the next highest priority, source 13 the next highest priority and so on, with source 0 having the lowest priority. In particular, as can be seen, if the transmission request from source 0 (i.e. req 0) is asserted, this does not cause any bit lines to be discharged.

Following the selective discharge operation, then any sense amp plus latch circuit that receives an asserted transmission request samples its associated bit line in order to store a routing value that will determine whether the associated crossbar cell will then, in the transmission mode of operation, couple its input to its output. In particular, only if the routing value has a first value (in one embodiment this being a logic one value) will the associated crossbar cell connect its input data to its output during the transmission mode of operation, and by virtue of the above described scheme it will be appreciated that only one crossbar cell will have its sense amp and latch circuitry set to a logic one value at the end of the arbitration mode of operation.

Hence, by way of example, if both source 1 and source 2 issue asserted transmission requests, it will be seen that both asserted request 1 and asserted request 2 cause the first bit line to be discharged. As a result, even if source 0 asserts a request, its request will not be granted, since the associated sense amp and latch circuitry 100 will latch a logic zero value at the end of the arbitration mode of operation. Further, the asserted request 2 causes the second bit line to be discharged, such that at the end of the arbitration mode of operation, the sense amp and latch circuitry 105 associated with source 1 will latch a logic zero value. Hence, even though source 1 asserted a transmission request, that transmission request is not granted, given that source 2 has also issued an asserted transmission request. Assuming no other source circuits assert a transmission request in that cycle, then it will be seen that the sense amp and latch circuitry 110 associated with source circuit 2 will latch a logic one value at the end of the arbitration mode of operation, and accordingly the transmission request from source 2 will be granted.

From the above description, it will be seen that incoming asserted transmission requests cause the suppression of other asserted transmission requests from lower priority sources. The sense amplifier and latch circuits for any asserted transmission request then sample their associated bit lines to determine if the request is granted or not. By virtue of this technique, collisions can be detected and resolved in a single cycle. Further, it can be seen that the same bit lines that are used during the arbitration mode of operation to detect and resolve conflicts are then used for the transmission of data in the following transmission mode of operation.

Whilst the asserted transmission requests can be input into the crossbar circuitry in a number of different ways, in one embodiment the word lines of the data input paths are used to input the asserted transmission requests. Hence, considering embodiments where each data input path has 16 word lines, it will be seen that any particular source circuit can specify via those word lines which of up to 16 data output paths it wishes to assert a transmission request for, in the arbitration mode of operation each of the individual word lines being associated with a different data output path.

Whilst not explicitly shown in FIG. 2, in addition to the priority storage elements 130 there will also typically be some associated isolation circuitry for each transistor 135, to ensure that the transistors 135 are turned off during the precharge operation performed by the precharge module 55.

In one embodiment, each crossbar cell is provided with release circuitry to provide a mechanism for releasing a channel when it is no longer required. In particular, once a source circuit 30 has been granted access to a channel, only that source circuit can release the channel for subsequent allocation to a different source circuit, and this releasing of the channel is performed by the release circuitry in response to an asserted release request from the source circuit currently granted access to that channel. While a channel is granted to a particular source circuit, no other source circuit can gain access to that channel, and any asserted transmission requests in respect of that channel issued by other source circuits will not be actioned whilst the channel is allocated to a source circuit.

Figure 3:
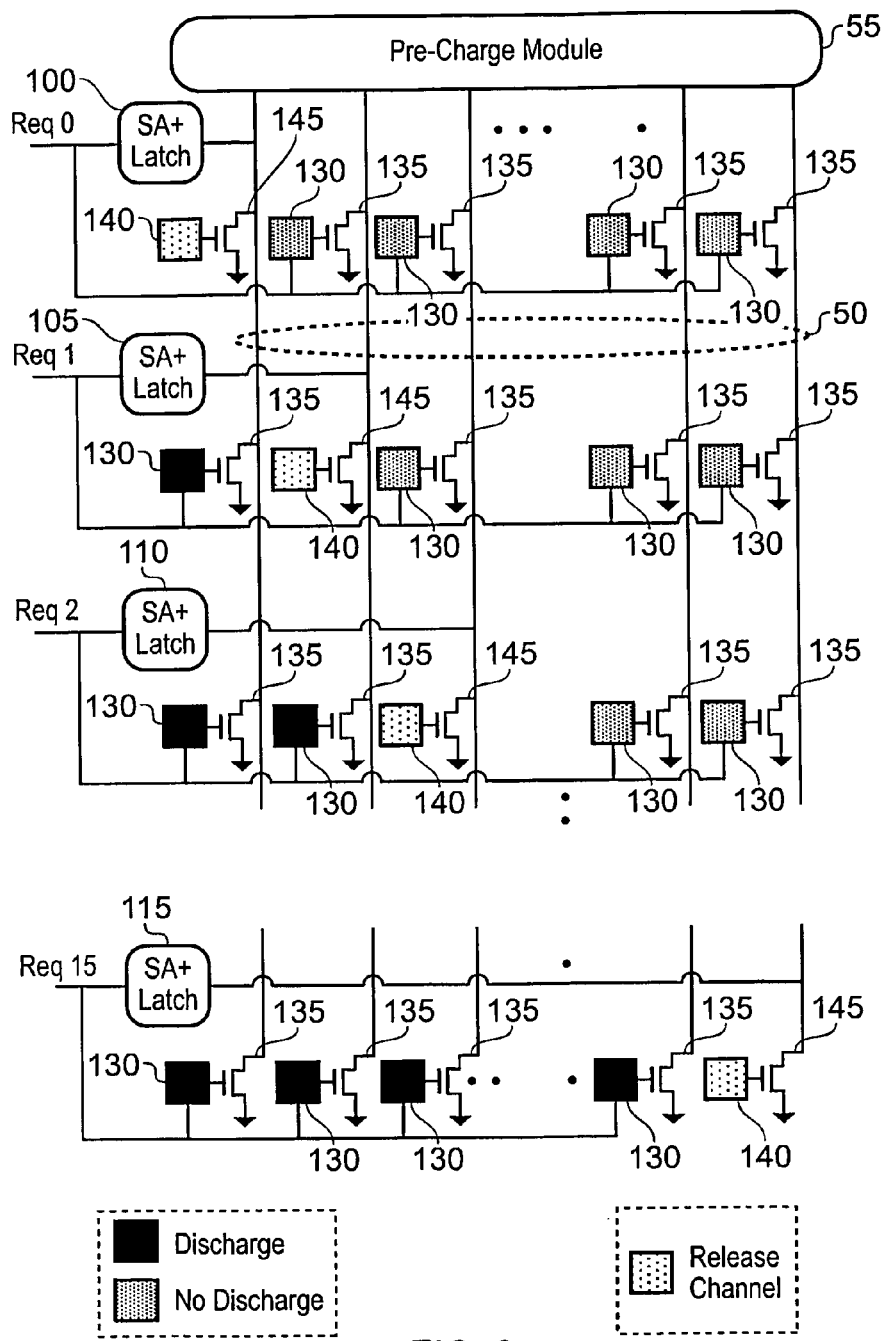
FIG. 3 illustrates how release circuitry may be used in one embodiment to enable a crossbar cell to release a particular data output path (also referred to herein as a channel)

FIG. 3 illustrates the release circuitry 140 that is added in accordance with one embodiment. In a similar way to the priority storage elements, the release circuitry 140 is used to drive an associated transistor 145, and in this case the transistor is coupled to the bit line that is sampled by the sense amp and latch circuitry of the same crossbar cell to determine the routing value. Hence, when a source circuit wishes to release a channel, it sends a release request to the release circuitry 140, which causes a logic one value to be output to the transistor 145, causing the associated bit line to discharge. Thereafter, the associated sense amp and latch samples the bit line, to thereby store a logic zero value therein, thus releasing the channel. Again, some associated isolation circuitry is provided for each transistor 145, to ensure that the transistor 145 is turned off during the precharge operation performed by the precharge module 55.

In one embodiment, the release requests are issued in the arbitration mode of operation, and a control signal is issued by the source circuits in the arbitration mode of operation to identify if the word lines of the associated data input path are carrying release requests or transmission requests. Hence, again the word lines of the data input paths can be re-used, this time to carry asserted release requests to the associated release circuits 140, thereby providing a particularly efficient mechanism for releasing channels that have previously been granted to a particular source circuit.

As discussed earlier, the priority storage circuitry of each crossbar cell stores priority data referenced by the arbitration circuitry when implementing the adaptive priority scheme, and the priority storage circuitry is configured to re-use the bit lines to self update the priority data stored therein between each application of the adaptive priority scheme by the arbitration circuitry. The manner in which this is achieved for the particular embodiment where the adaptive priority scheme is an LRG priority scheme will be discussed further with reference to FIGS. 4A to 4H.

Figure 4A:
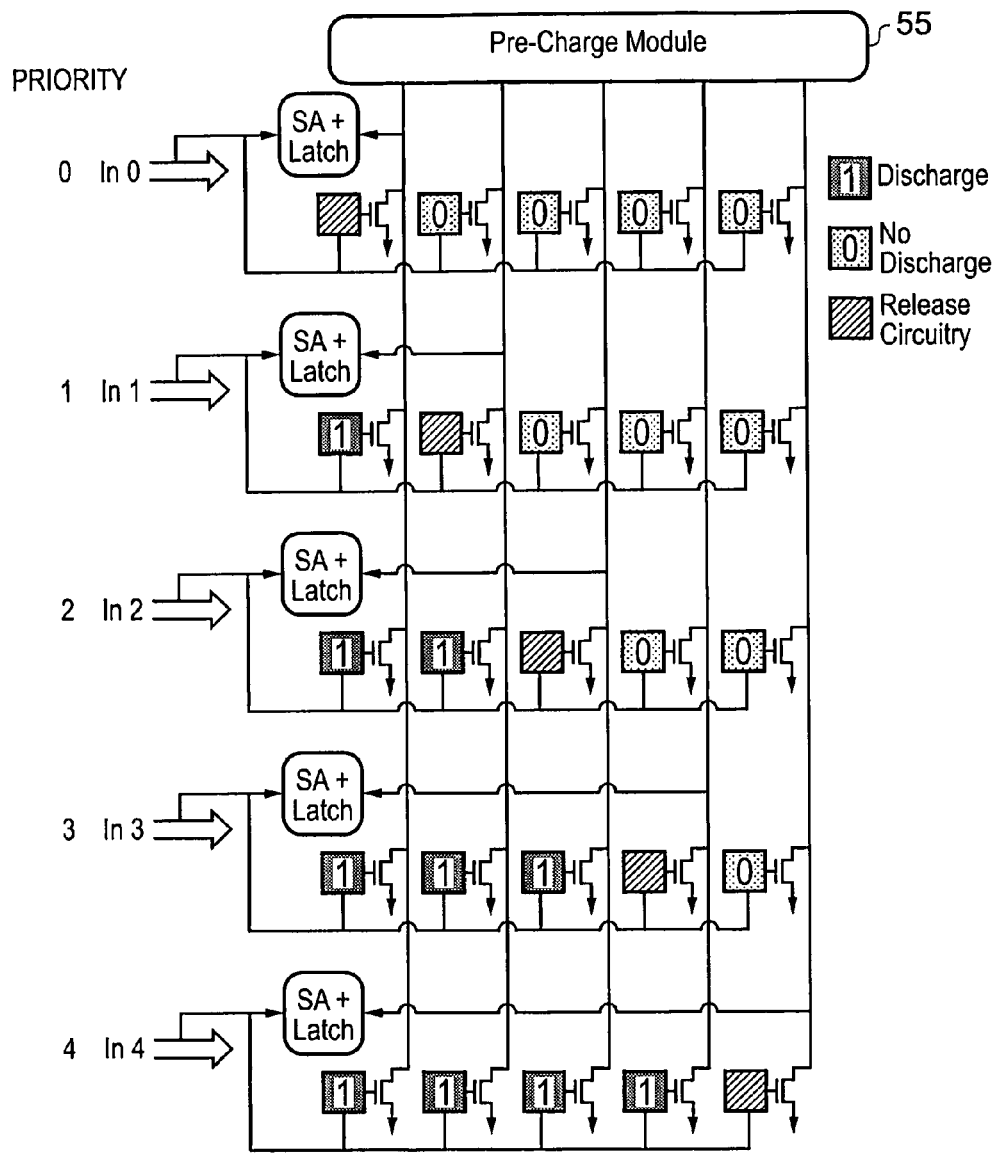
FIGS. 4A to 4H illustrate how the priority storage circuitry may be updated to support a LRG priority scheme in accordance with one embodiment.

FIG. 4A shows an instance with five source circuits that can assert a request for a channel. In this example the priority storage circuitry of each crossbar cell consists of four priority storage elements whose stored values collectively indicate the priority of the associated source circuit in respect of the channel to which the crossbar cell is coupled. As discussed earlier with reference to FIG. 2, the arbitration mechanism is implemented in two phases. In the positive phase of the clock, the bit lines are precharged to a logic 1 level, and following this, in the negative phase of the clock, those bit lines are selectively discharged at the cross-points where a request is asserted by a source circuit, based on the priority stored at the cross-point.

In FIG. 4A, the priority storage circuitry of each crossbar cell is subjected to a reset operation, to allocate a predetermined initial priority to each source circuit in respect of each channel. For the example of the channel illustrated in FIG. 4A, the priority is assigned in an increasing order, with source 4 having the highest priority whilst source 0 has the lowest priority.

Figure 4B:
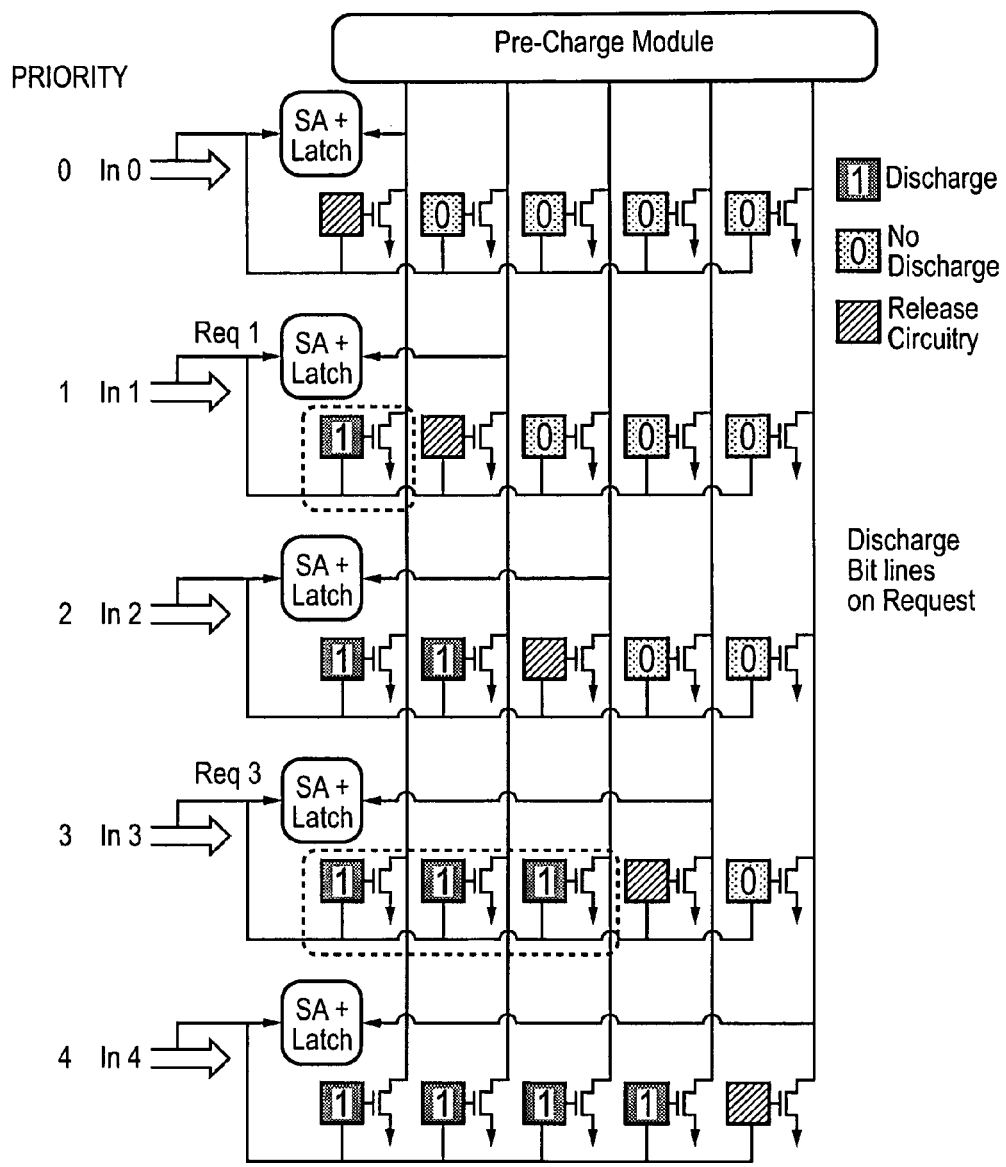
Figure 4C:
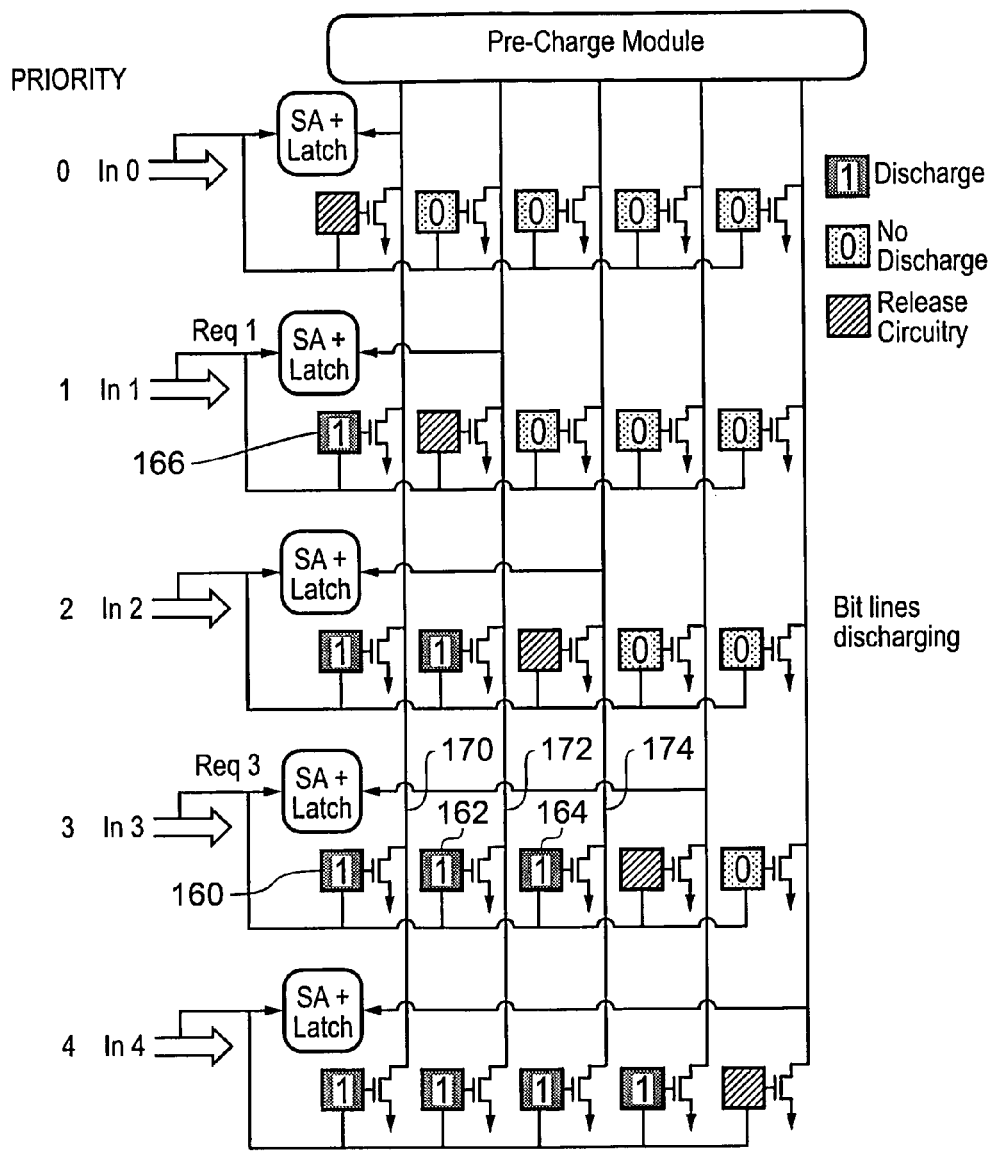

Then, as shown in FIG. 4B, one or more of the source circuits assert a transmission request. In the example of FIG. 4B, it is assumed that sources 1 and 3 assert a transmission request in respect of the illustrated channel. With the bit lines precharged, the asserted transmission requests cause some of the bit lines to be discharged in dependence on the stored priority data, as shown in FIG. 4C. In particular, the logic 1 values stored in priority storage elements 160, 162 and 164 associated with source 3 cause bit lines 170, 172 and 174, respectively, to be discharged. The logic 1 value in priority storage element 166 associated with source 1 also causes bit line 170 to discharge.

Figure 4D:
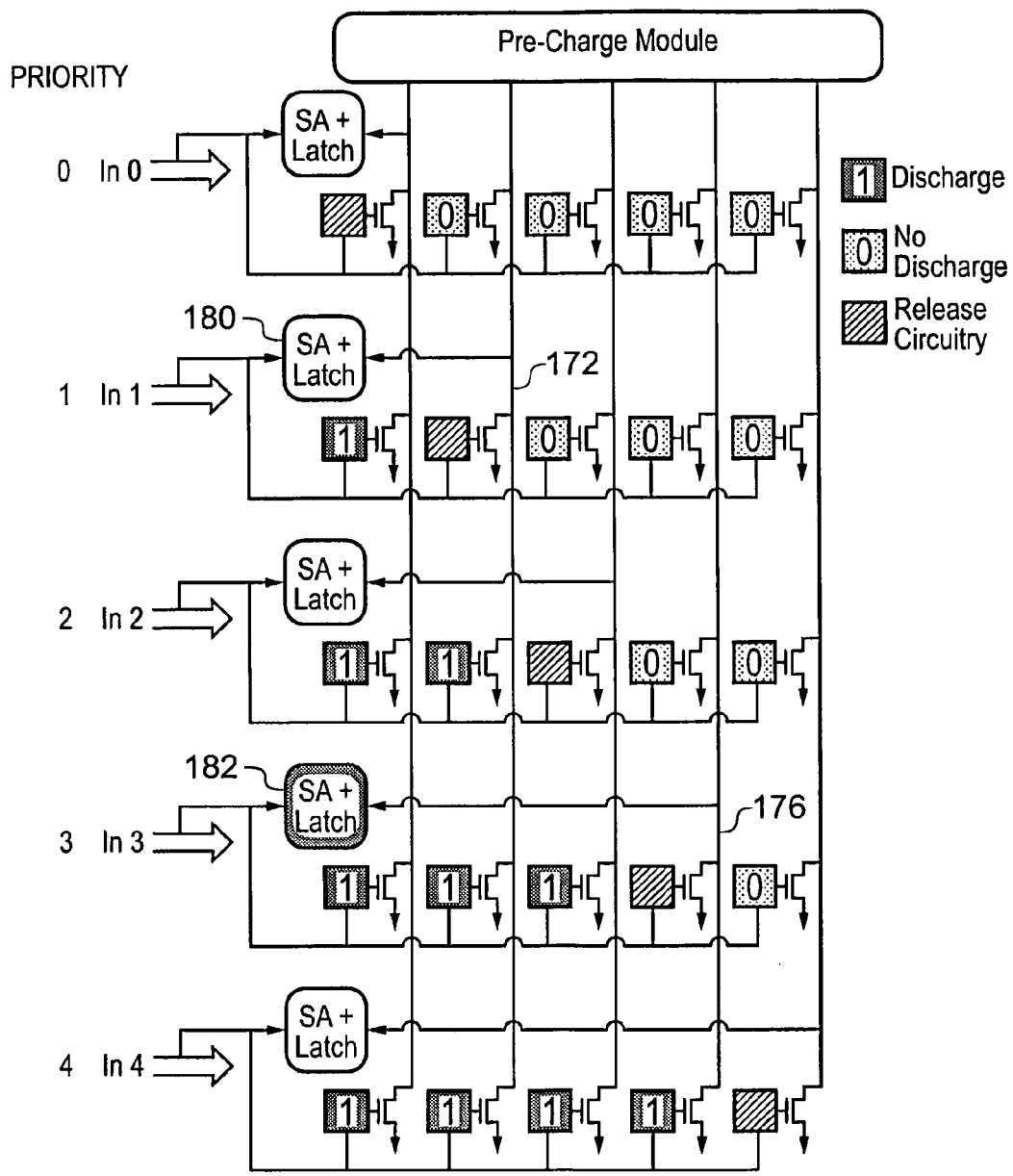

As shown in FIG. 4D, following the selective discharge process, the sense amp and latch (SAEL) circuits 180, 182 associated with source circuits 1 and 3, respectively, then evaluate their bit lines. SAEL circuit 182 senses a logic 1 value since bit line 176 has not been discharged, indicating that the asserted transmission request of source circuit 3 has been successful. Meanwhile SAEL circuit 180 senses a logic 0 value since bit line 172 has been discharged, indicating that the asserted transmission request of source circuit 1 has not been successful. Source circuit 3 can now send data over the channel.

Figure 4E:
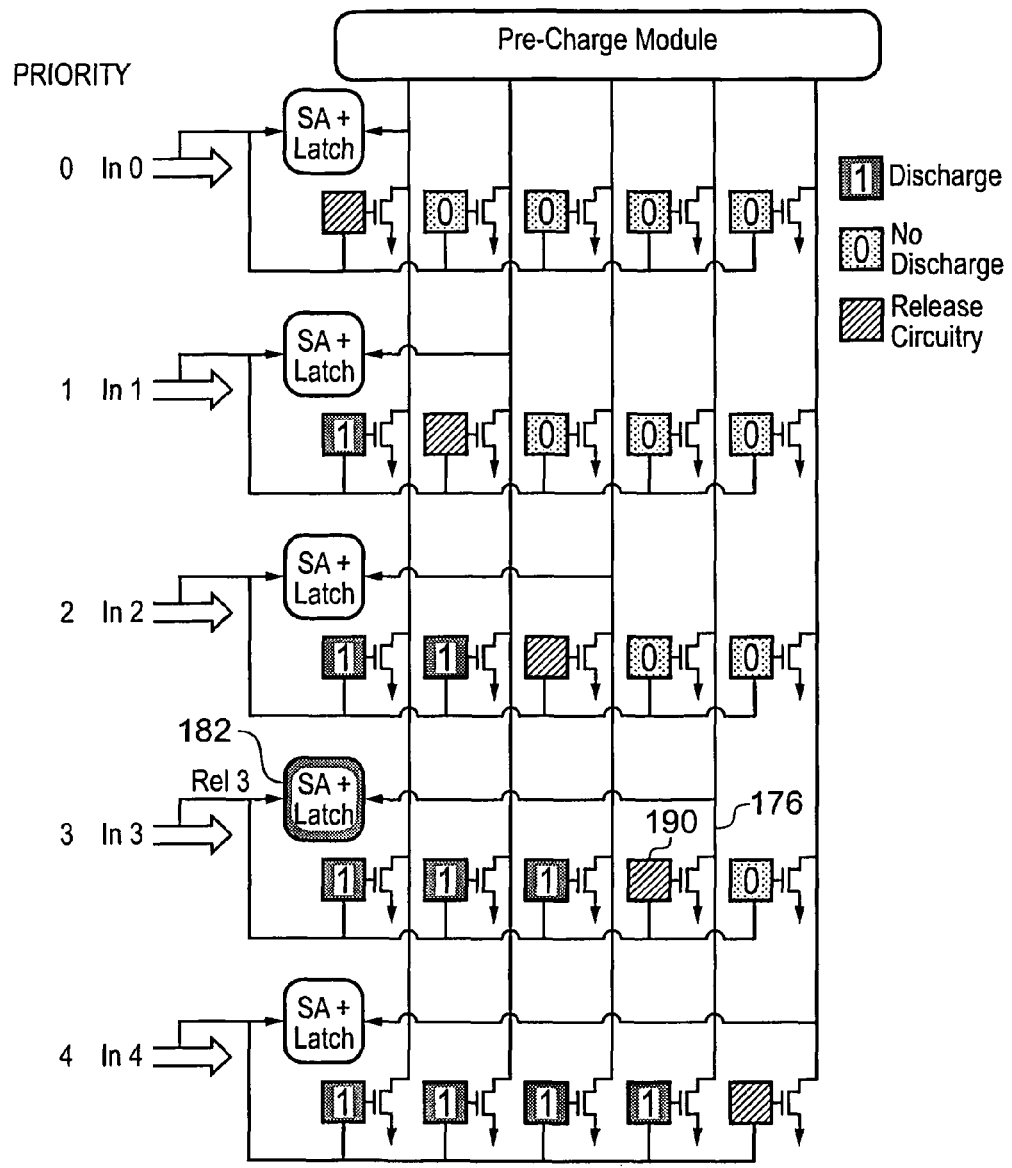
Figure 4F:
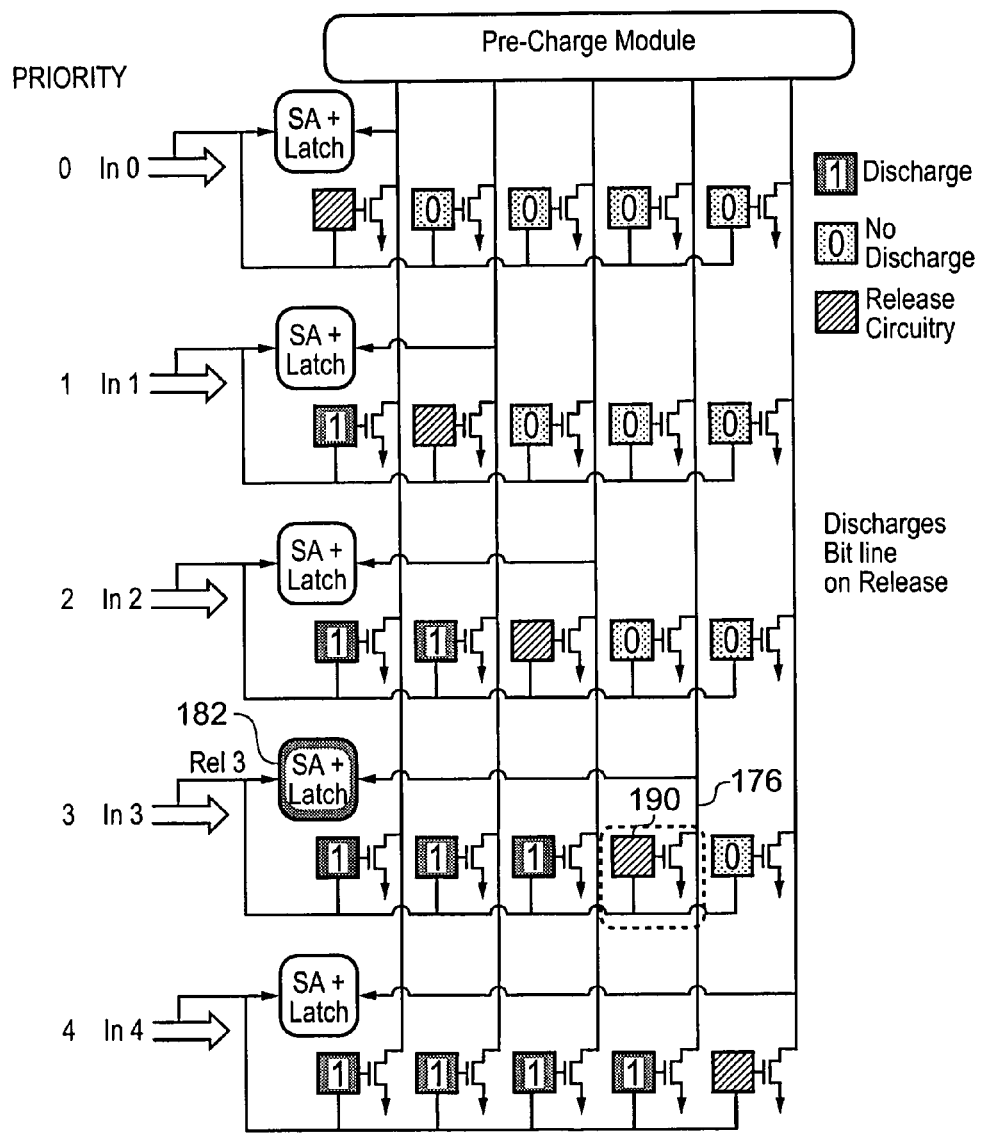

When source circuit 3 has finished sending data, it asserts a release request, as shown in FIG. 4E. The bit lines are precharged, whereafter bit line 176 is discharged by the release circuit 190 given the asserted release request from source circuit 3, as shown in FIG. 4F. SAEL circuit 182 then senses a logic 0 value, thereby releasing the channel.

Figure 4G:
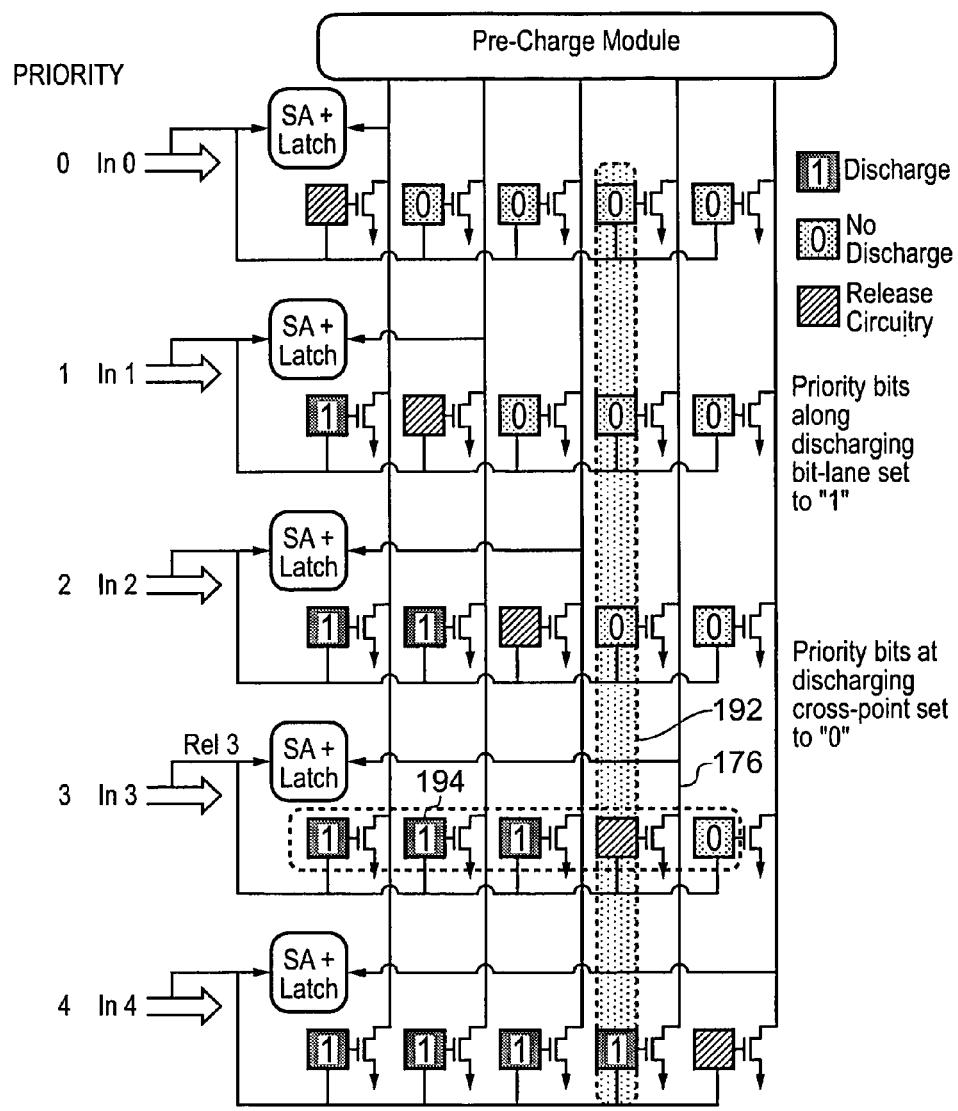
Figure 4H:
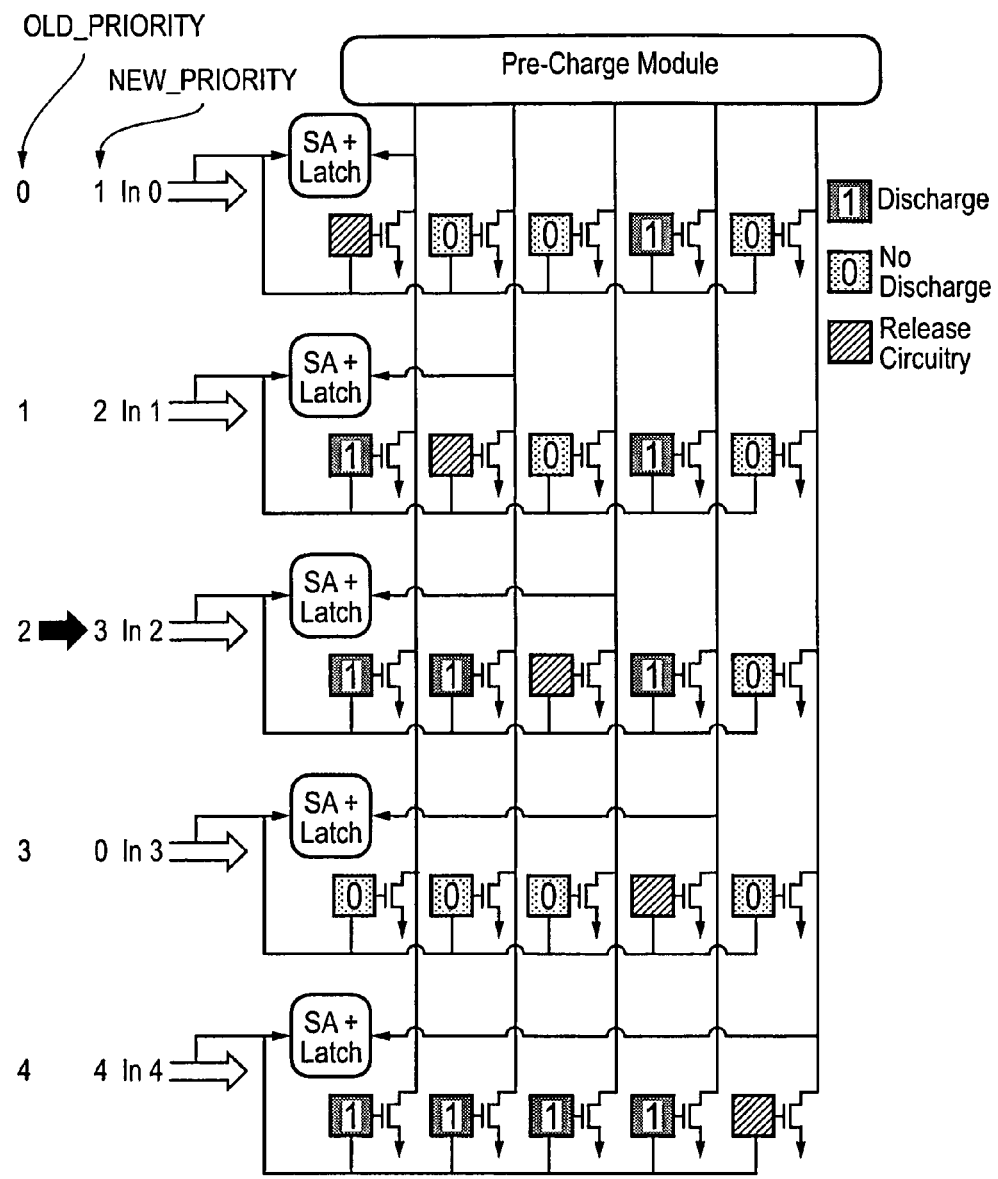

Thereafter, the priorities stored in the priority storage circuitry are updated, as shown in FIG. 4G this update process affecting both the column of priority storage elements 192 coupled to the bit line 176 that was discharged, and the row of priority storage elements 194 contained within the crossbar cell receiving the release request. In particular, as shown in FIG. 4H, within the column 192 all priority storage elements are written to a logic 1 value, whereas within the row 194, all priority storage elements are written to a logic 0 value. As a result it can be seen that source circuit 3 now has the lowest priority. The priority for source circuit 4 remains intact, since it had a higher priority than source circuit 3. Additionally, source circuits 0, 1 and 2 have their priorities upgraded. By comparison of the old priorities and new priorities listed in FIG. 4H, it can be seen that this priority update process achieves an LRG implementation, since next time the arbitration process is applied the new priorities will be used when evaluating the asserted transmission requests.

Whilst for the sake of illustration only five inputs have been considered, it will be appreciated that the technique can be used for any number of inputs.

Figure 5:
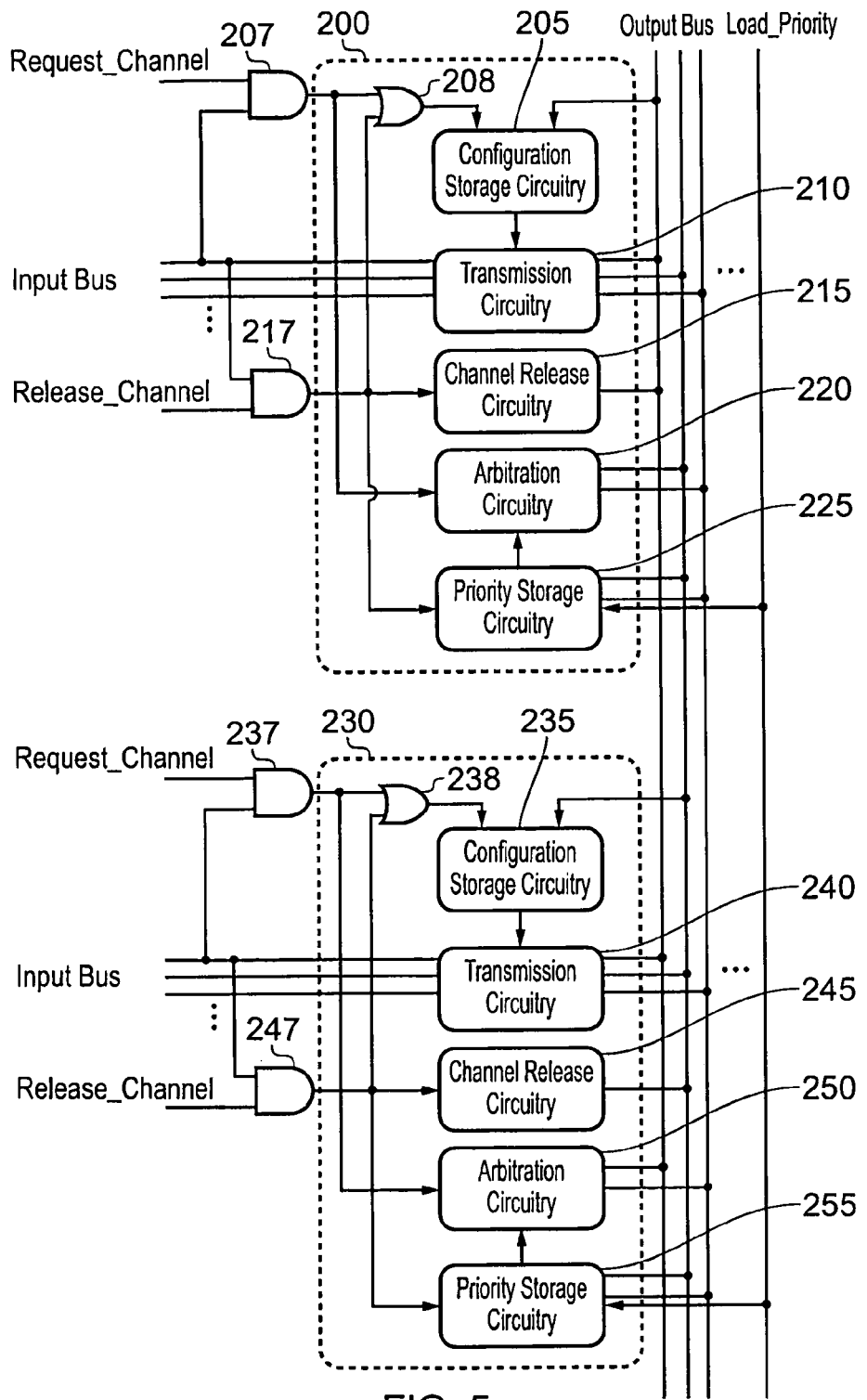
FIG. 5 illustrates the circuitry provided within each crossbar cell for a number of crossbar cells in a column.
Figure 5:
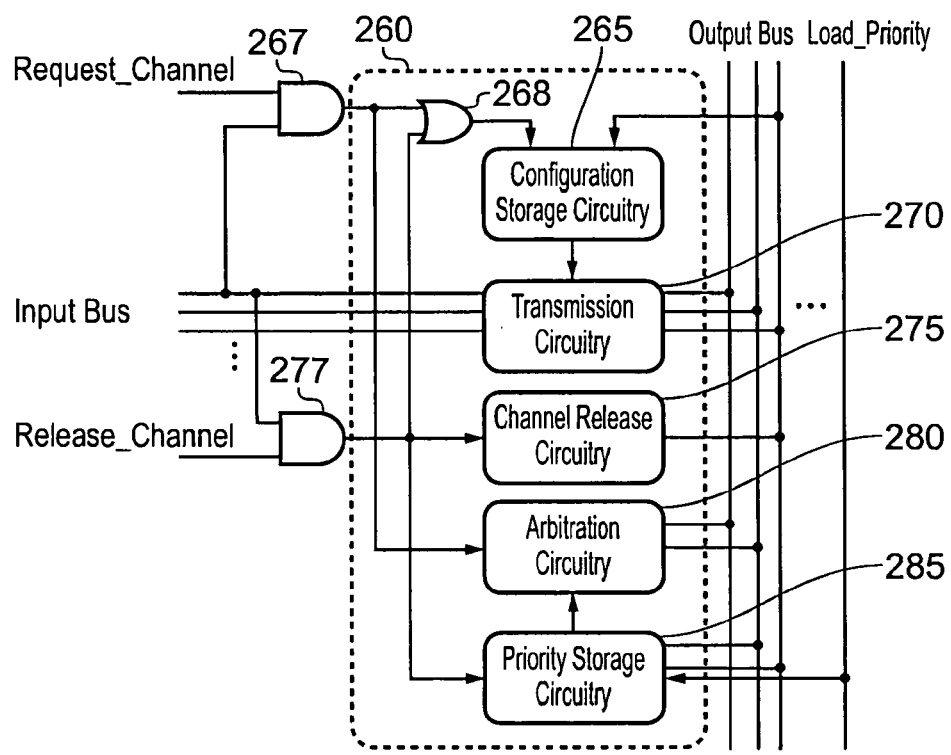

FIG. 5 illustrates the main components provided within each crossbar cell, and in particular shows the crossbar cells provided for column 0 in respect of rows 0, 1 and 2. Hence, the crossbar cell 200 is provided at the intersection between row 0 and column 0, the crossbar cell 230 is provided at the intersection between row 1 and column 0, and the crossbar cell 260 is provided at the intersection between row 2 and column 0.

Considering first the crossbar cell 200, this consists of a configuration storage circuit 205, transmission circuitry 210, channel release circuitry 215, arbitration circuitry 220 and priority storage circuitry 225. In the arbitration mode of operation, transmission requests are asserted over the data input path (also referred to in FIG. 5 as the input bus), and accordingly if source 0 wishes to assert a transmission request for column 0, it does so by setting bit 0 of the input bus. As can be seen, the value of bit 0 is input to AND gate 207, whose other input is driven by the request channel control signal. A source circuit will assert the request channel control signal if it is issuing any asserted transmission requests over the input bus during the arbitration mode of operation. Accordingly, if source 0 has issued an asserted transmission request for channel 0, both inputs to the AND gate 207 will be at a logic one value, and accordingly both the arbitration circuitry 220 and the configuration storage circuitry 205 will be activated (the configuration storage circuitry being activated via OR gate 208).

As can be seen, the configuration storage circuitry 205 is connected to bit 0 of the data output path for channel 0 (also referred to in FIG. 5 as the output bus), and at the end of the arbitration mode of operation will sample the value on bit 0 of the output bus in order to determine the routing value to be stored therein. However, prior to that point, the arbitration circuitry 220 will operate in association with the arbitration circuitry 250, 280, etc. of any other crossbar cells associated with that column that have received asserted transmission requests, in order to selectively discharge bit lines of the output bus. In particular, as can be seen in FIG. 5, the arbitration circuitry 220 of the crossbar cell 200 is connected to all of the other bit lines of the output bus other than bit line 0, and will selectively discharge those bit lines dependent on the priority data programmed into the priority storage circuitry 225.

As mentioned above, following the selective discharge operation of the arbitration circuitry 220, the configuration storage circuitry 205 will then sample the value on its associated output bit line, and in particular if that bit line is still at the precharge voltage level, it will store a logic one routing value within the configuration storage circuitry 205 to indicate that source 0 has been granted access to channel 0. Due to the nature of the adaptive priority scheme implemented by the arbitration circuits of the crossbar cells in the column, only one crossbar cell for any particular column will have its configuration storage circuit set to a logic one value at the end of the arbitration mode of operation, and accordingly only one source circuit can be granted access to a particular destination circuit at any point in time.

Following the arbitration mode of operation, the switching fabric enters the transmission mode of operation, during which time each source circuit that has been granted access to a particular channel provides its input data over the input bus. Accordingly, assuming source 0 was granted access to column 0, it will issue its data over the input bus to the transmission circuitry 210, which given the logic one value stored in the configuration storage circuitry 205, Will then connect its input to the output bus for channel 0.

As mentioned previously, in the arbitration mode of operation it is also possible to release channels when they have previously been granted to a particular source. Hence, by way of example, if source 0 has previously been granted access to channel 0, and accordingly the configuration storage circuitry 205 has a logic one routing value stored therein, then in the arbitration mode of operation, the source 0 can issue a release channel control signal to the AND gate 217, along with a logic one value on bit 0 of the input bus to specify an asserted release request for channel 0. This will cause a logic one value to be input to the channel release circuitry 215, and the configuration storage circuitry to be activated via OR gate 208. In response to this logic one value, the channel release circuitry discharges bit 0 of the output bus, and then the configuration storage circuitry 205 re-samples the output bus, thereby causing a logic zero value to be stored within the configuration storage circuitry 205.

The asserted release request also causes the priority storage circuitry to be activated to self update the priority data stored therein. As discussed earlier, and illustrated in FIG. 5, the priority storage circuitry is coupled to each bit line of the output bus other than the bit line to which the configuration storage circuitry of the same crossbar cell is coupled. In addition the priority storage circuitry receives a load priority signal, which in one embodiment is used (in combination with the voltages of the bit lines coupled to the priority storage circuitry) during the self update process to identify at least some of the individual priority storage elements whose values are to be updated, as will be discussed in more detail later with reference to FIG. 10D.

In one embodiment, both the request channel control signal and the release channel control signal can be encoded in a two bit signal, with that two bit signal specifying during the arbitration mode of operation whether the associated source circuit is issuing any asserted transmission requests, is issuing any asserted release channel requests, or is not issuing any asserted requests.

The crossbar cells 230 and 260 are constructed in an identical way to the crossbar cell 200 and hence the elements 235, 237, 238, 240, 245, 247, 250 and 255 of the crossbar cell 230, and the elements 265, 267, 268, 270, 275, 277, 280 and 285 of the crossbar cell 260 correspond with the elements 205, 207, 208, 210, 215, 217, 220 and 225 of the crossbar cell 200, respectively. However, as is clear from FIG. 5, the way in which those various elements are connected to the various word lines and bit lines is slightly different. Since each of the crossbar cells 200, 230, 260 is associated with column 0, then the asserted transmission requests and asserted release requests are always provided on bit 0 of the associated input bus, and accordingly all three crossbar cells are connected to bit 0 (word line 0) for this purpose. However, considering the connections to the bit lines, it will be seen that whilst the configuration storage circuitry 205 of crossbar cell 200 is connected to bit 0 of the output bus, configuration storage circuitry 235 of crossbar cell 230 is connected to bit 1 and configuration storage circuitry 265 of crossbar cell 260 is connected to bit 2. The channel release circuitry of each crossbar cell is connected to the same bit line as the associated configuration storage circuitry. Meanwhile the arbitration circuitry and priority storage circuitry are connected to all of the bit lines other than the bit line connected to the associated configuration storage circuitry. The transmission circuitry is of course connected to all of the word lines and bit lines, since in the transmission mode of operation, if the routing value in the associated configuration storage circuitry is set to a logic 1 value, then the transmission circuitry will connect the data on the input bus to the associated output bus.

Figure 6:
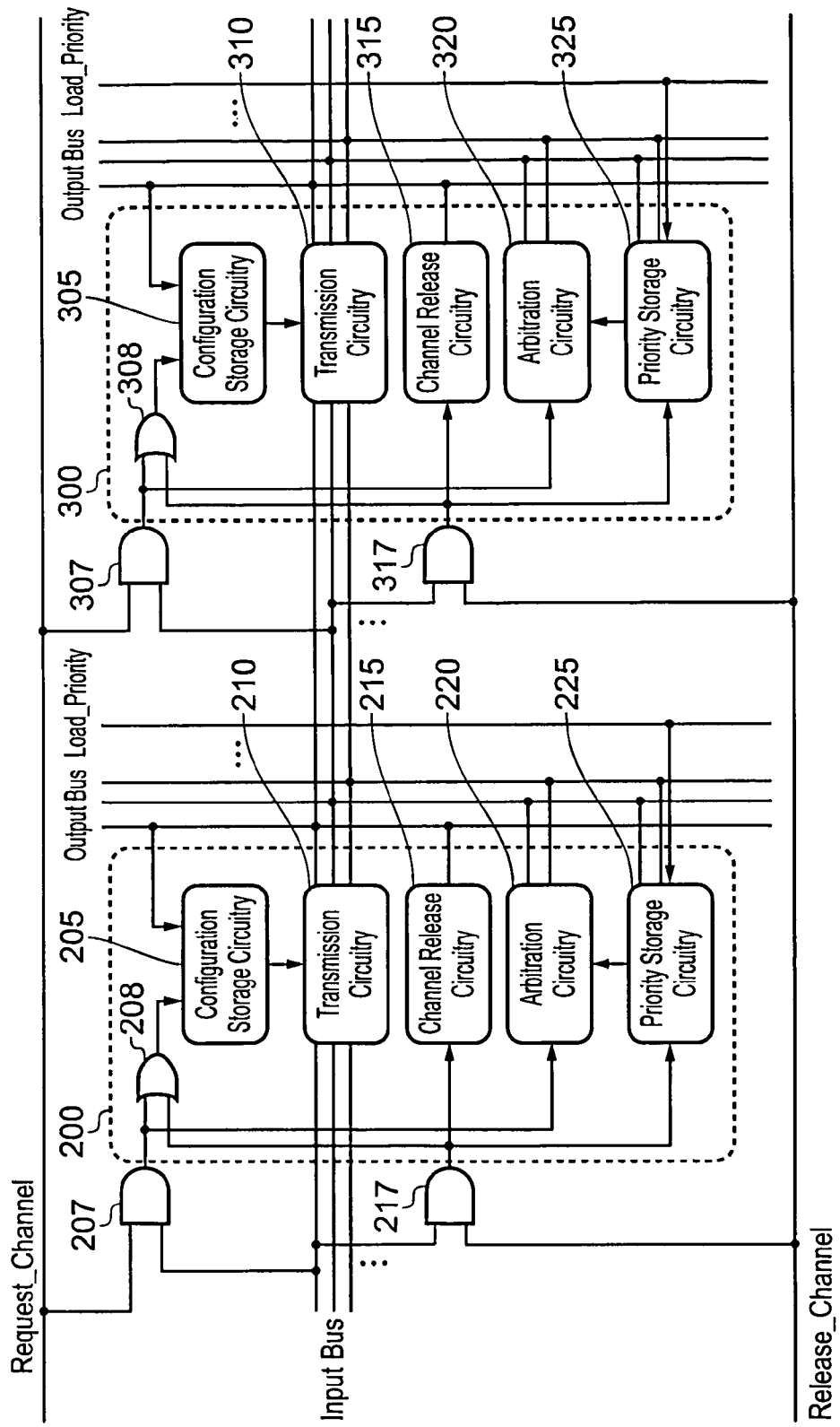
FIG. 6 illustrates the circuitry provided within each crossbar cell for a number of crossbar cells in a row.
Figure 6:
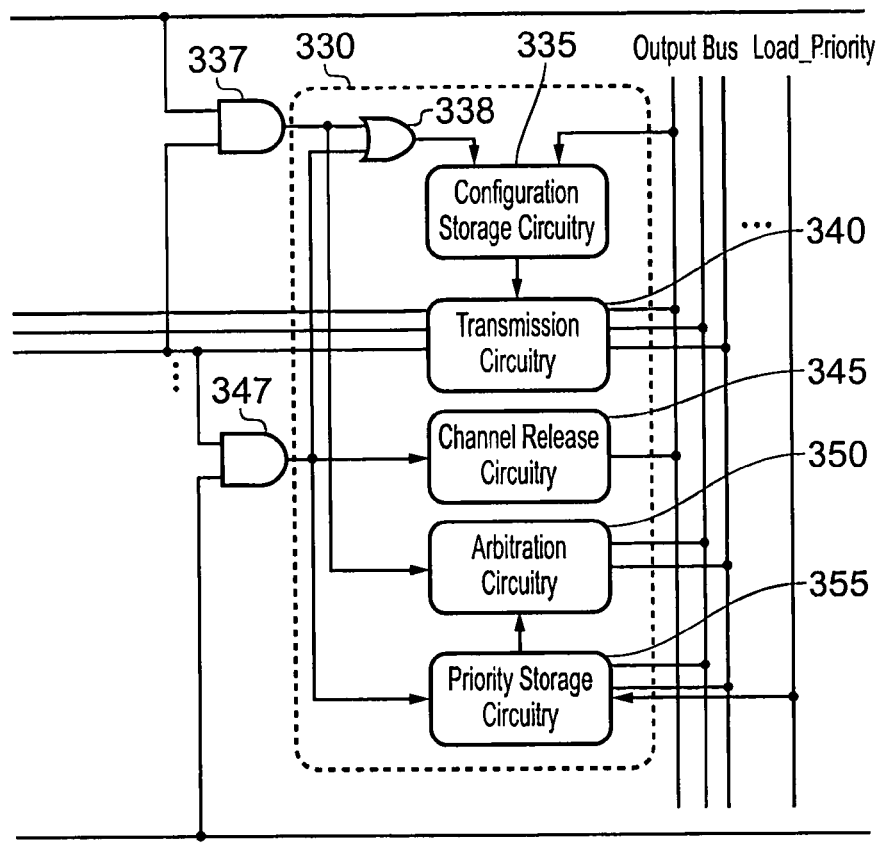

FIG. 6 is a similar diagram to FIG. 5, but shows the crossbar cells 200, 300, 330 provided at the intersection between row 0 and column 0, column 1 and column 2, respectively. The crossbar cell 200 is as discussed earlier with reference to FIG. 5, and the crossbar cells 300, 330 are constructed in the same way. Accordingly, the elements 305, 307, 308, 310, 315, 317, 320 and 325 of crossbar cell 300 and the elements 335, 337, 338, 340, 345, 347, 350 and 355 of crossbar cell 330 correspond with the elements 205, 207, 208, 210, 215, 217, 220 and 225 of crossbar cell 200, respectively. In this example, since all of the crossbar cells are associated with the same row, they are connected to the bit lines of their respective output bus in an identical manner. However, when considering the input bus, the asserted transmission requests or release requests for channel 0 are input on word line 0 whilst asserted transmission or release requests for channel 1 are input on word line 1 and asserted transmission or release requests for channel 2 are input on word line 2. Accordingly, the configuration storage circuit, channel release circuit and arbitration circuit of each crossbar cell are driven by different input word lines accordingly.

Figure 7:
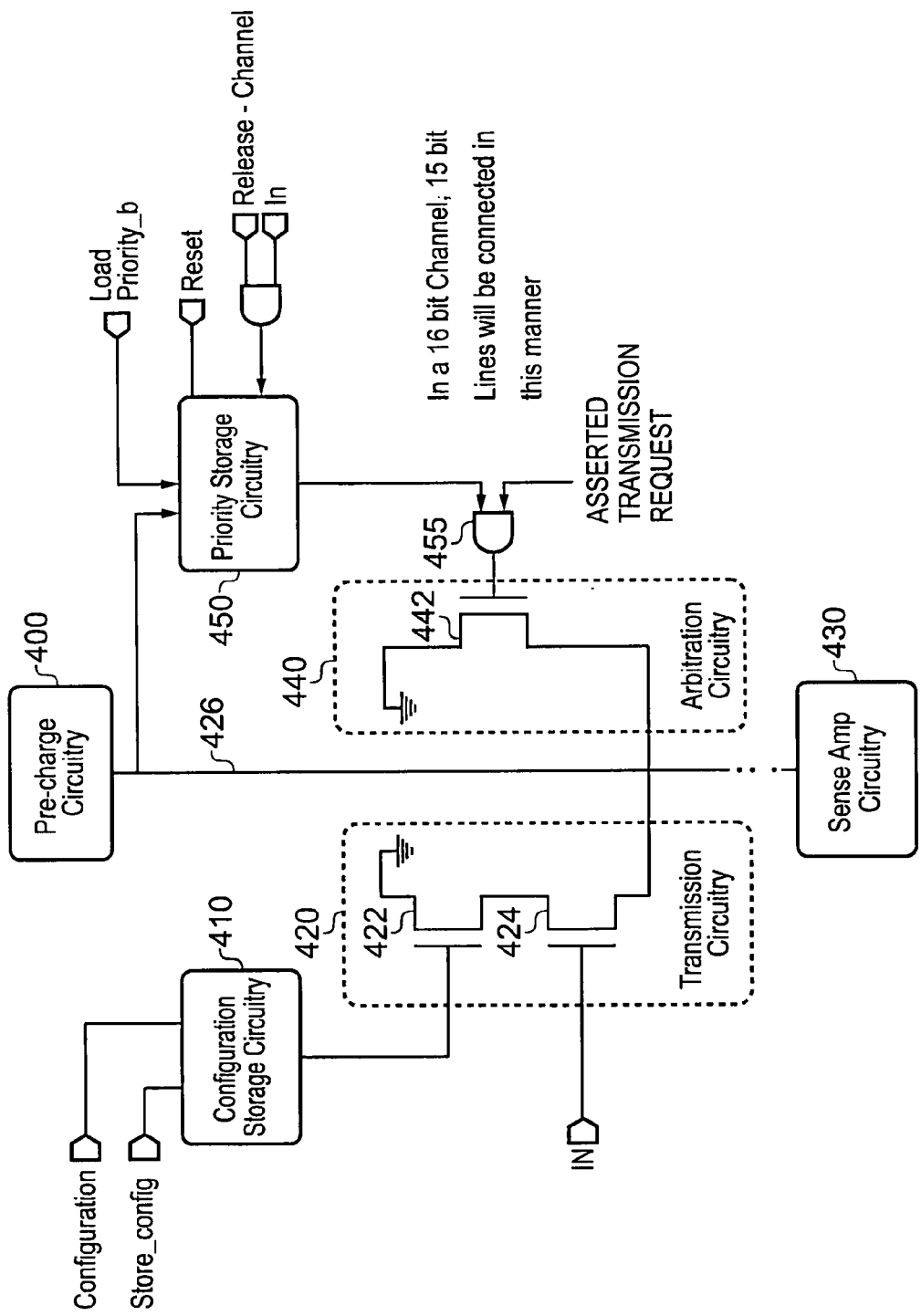
FIG. 7 illustrates in more detail the transmission circuitry, arbitration circuitry and priority storage circuitry that may be provided within each crossbar cell in accordance with one embodiment.

FIG. 7 illustrates in more detail how transmission circuitry and arbitration circuitry are connected to each bit line. In particular, element 420 shows that part of the transmission circuitry associated with an individual bit line and element 440 shows that part of the arbitration circuitry associated with an individual bit line.

Considering a 16-bit wide channel, fifteen of the sixteen bit lines will be connected in the manner shown in FIG. 7 since arbitration circuitry will be associated with all of the bit lines other than the bit line to which the configuration storage circuitry 410 of that crossbar cell is connected. The configuration storage circuitry 410, which is provided once for the crossbar cell, receives a store configuration signal which is set in the presence of an asserted transmission request or an asserted release request to that crossbar cell, and responsive to that set store configuration signal, samples as its configuration the value on a particular bit line to which it is connected, as discussed earlier with reference to FIGS. 5 and 6. This takes place during the arbitration mode of operation, and if at the end of the arbitration mode of operation this results in a logic one routing value being stored in the configuration storage circuitry 410, then when the crossbar circuitry subsequently enters the data transmission mode of operation, it will be seen that the transistor 422 of the transmission circuitry 420 is turned on. Accordingly, if the data input on the corresponding word line is also at a logic one value, this will cause the transistor 424 to turn on and will accordingly cause the bit line 426 to discharge, this bit line having previously been precharged to a logic one level by the precharge circuitry 400. Any discharge of the bit line 426 will be sensed by the sense amp circuitry 430.

In the arbitration mode of operation, the transmission circuitry is not used, and instead the arbitration circuitry 440 is used to selectively discharge the bit line 426 dependent on an input received by the transistor 442 from AND gate 455. In particular, if the priority storage element 450 stores a logic one value, and an asserted transmission request is received over the corresponding word line, then a logic one value will be input to the transistor 442, causing the bit line 426 to discharge. Towards the end of the arbitration mode of operation, any configuration storage circuitry connected to that bit line 426 in another crossbar cell that has received an asserted transmission request will sample the value on that bit line in order to determine the value of the routing value applicable to that crossbar cell.

A separate priority storage element 450 will be provided for each associated arbitration element 440, with its value being updated in the presence of an asserted release_channel signal whilst the release input on the corresponding word line is also at a logic one value. As will be discussed later with reference to FIG. 10B, a load priority_b signal and the voltage on bit line 426 is also used during the priority update process. Further, the priority storage element receives a reset signal, which when set causes the priority storage element to be written to a predetermined value (a 1 or a 0 depending on the form of the priority storage element).

Figure 8:
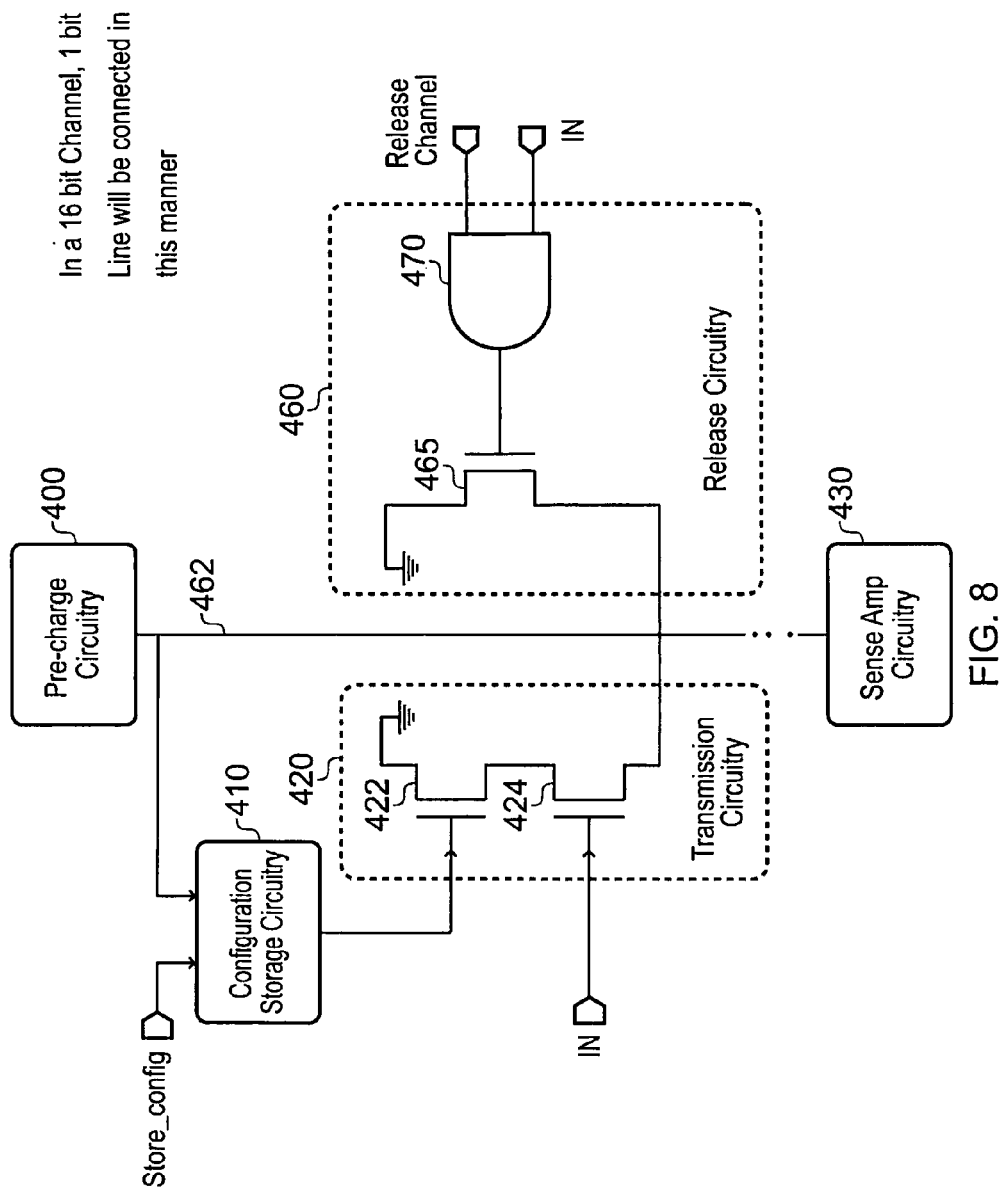
FIG. 8 illustrates in more detail the transmission circuitry and release circuitry that may be provided within each crossbar cell in accordance with one embodiment.

FIG. 8 illustrates the transmission circuitry and associated release circuitry in accordance with one embodiment. Considering a 16-bit channel, one bit line will be connected in this manner within each crossbar cell. The operation of the transmission circuitry is unchanged from that discussed with reference to FIG. 7, and accordingly will not be discussed further herein. However, the release circuitry 460 is connected to this bit line 462 instead of the arbitration circuitry 440 of FIG. 7. It will also be noted that the configuration storage circuitry 410 of the crossbar cell is also connected to this bit line 462. The AND gate 470 corresponds with the AND gates shown feeding the channel release circuits in FIGS. 5 and 6, and hence if the release channel control signal is asserted and the bit on the associated input word line is asserted, this indicates the presence of an asserted release request for the particular channel, and as can be seen from FIG. 8 results in the transistor 465 being turned on to discharge the bit line 462. Subsequently the configuration storage circuitry 410 will be caused to receive an asserted store configuration signal which will cause it to resample the value on the bit line 462, thereby causing a logic zero routing value to be stored therein, thus releasing the channel.

Figure 9:
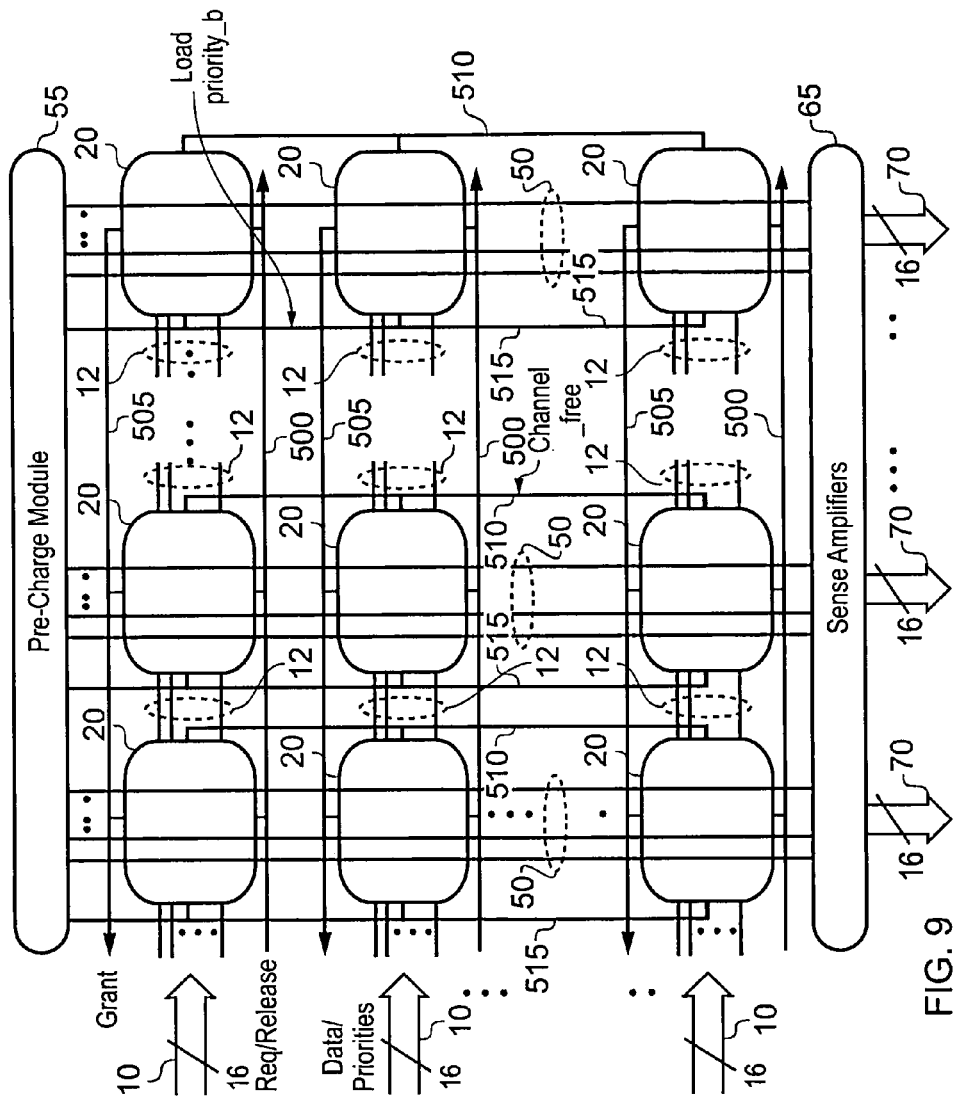
FIG. 9 schematically illustrates a packet switching crossbar implementation in accordance with one embodiment.

Using the above described techniques, it is possible to implement a packet switching crossbar as shown schematically in FIG. 9. In a packet switching environment, a source first sends a request, and then on receipt of a grant signal sends data, with the request and data being sent over the same input lines. From the above discussion of embodiments of the present invention, it can be seen that the crossbar circuitry of embodiments of the present invention lends itself readily to such a packet switching embodiment, by allowing asserted transmission requests to be input over the same word lines that subsequently, in the transmission mode of operation, will be used for carrying data. The request channel and release channel control signals discussed earlier with reference to FIGS. 5 and 6 can be input via a 2-bit request/release input line 500, with the asserted transmission requests or asserted release requests being input over the associated data input paths 12. When a particular configuration storage circuit in a crossbar cell stores a logic one value during the arbitration mode of operation to indicate that the associated source circuit has been granted, this causes a grant signal to be returned to the source circuit over line 505. In a single request implementation, where any particular source circuit is only able to request one output channel at any point in time, only a single grant signal line 505 is required. However, in an alternative embodiment supporting multi-casting (where one source circuit can broadcast data over multiple channels at any point in time), then the source circuit will be able to issue multiple asserted transmission requests at any point in time, and in such embodiments a multi-bit grant signal line 505 can be provided to identify which channels the master has been granted access to.

During the arbitration mode of operation, each of the crossbar cells also receives a channel free signal over lines 510, indicating whether the associated channel is free to be allocated to a requesting source, the use of this signal being discussed later with reference to FIGS. 10 and 11. A load priority_b signal is provided over paths 515, this being precharged by the pre-charge module 55, and then discharged when the priority data in the priority storage elements are updated in response to an asserted release request, as will be discussed in more detail later with reference to FIG. 10D.

It will hence be appreciated from FIG. 9, and the earlier discussion of embodiments of the present invention, that in this packet switching crossbar implementation, a precharge and conditional discharge scheme is used to transmit data through the crossbar circuitry during a transmission mode of operation. During a preceding arbitration mode of operation, the bit lines are re-used for collision detection and resolution, with the word lines being used to transmit asserted transmission requests. A 2-bit request/release signal can be used to specify whether transmission requests or release requests are being asserted during a particular arbitration mode of operation. Assuming transmission requests are being asserted, then the grant signal is used to indicate to the source whether its request succeeded in acquiring the requested channel.

The existing word lines (input buses) and bit lines (output buses) are used to realise all of the above mentioned functionalities, thereby allowing all of these functionalities to be achieved with minimum routing overhead.

Figure 10D:
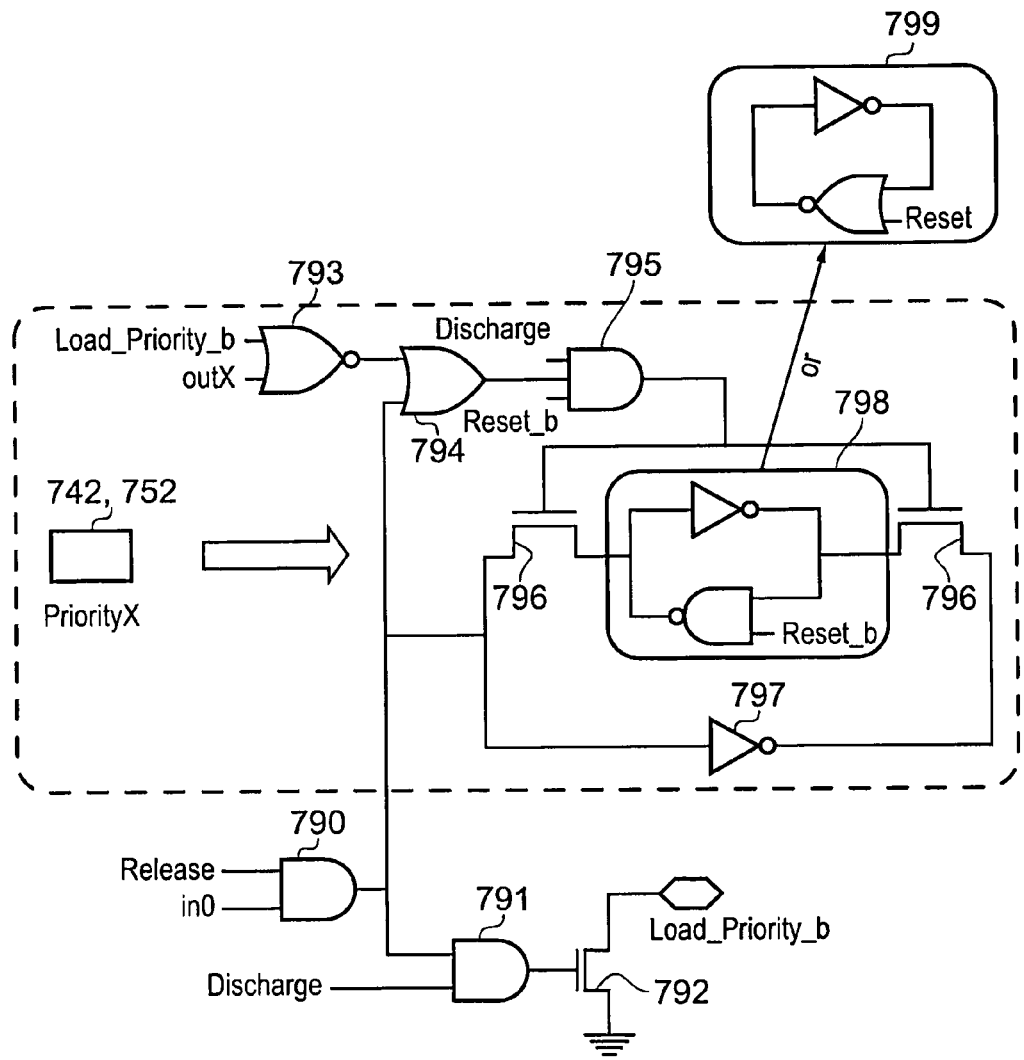

FIGS. 10A to 10D illustrate in more detail the circuitry provided within each crossbar cell 20 in accordance with a first embodiment, where a source circuit may only issue a single transmission request at a time. As is apparent from the earlier discussion of FIGS. 7 and 8, for each bit line of the output path, a pair of transistors 710, 715, 720 are provided to form the transmission circuitry, with one of those transistors receiving at its input the value on a corresponding word line, and the other transistor receiving at its input the routing value in the associated configuration storage element 700. During a precharge stage of the operation, a discharge signal will be set to a logic zero value, causing the conditional discharge circuitry 705 to isolate those transistors of each transmission circuit 710, 715, 720 from the contents of the configuration storage circuit 700. However, when the discharge signal goes high to indicate that the precharge operation has finished, and the sensing operation has begun, it can be seen that the configuration storage element 700 now provides a value which is used to drive the second transistor of each transmission circuit 710, 715, 720, causing the selective discharge of the associated bit line dependent on the input data received at the first transistor. The conditional discharge circuitry 705 also uses a WL_b signal, and FIG. 10B illustrates how that WL_b signal is generated, the circuitry 765 of FIG. 10B being provided once per crossbar cell.

As shown on the right hand side of FIG. 10A, one of the bit lines will be connected to release channel circuitry formed by the AND gate 732 and the associated transistor 712, whilst all of the other bit lines will be connected to arbitration circuitry and associated priority storage elements 717, 742 and 722, 752, respectively. Each of the components 730, 740 and 750 act in combination with the component 760 to provide conditional discharge circuitry which isolates the associated transistors 712, 717, 722 during the precharge mode of operation. In particular, during the precharge mode of operation, the discharge signal will be low causing the output from block 760 to be low irrespective of the value of the WL signal, which in turn causes the output of the components 730, 740 and 750 to be low, thereby turning off the transistors 712, 717, 722.

However, when the discharge signal goes high, then if the WL signal goes high, this will cause a logic one value to be output from the component 760. Hence, considering the arbitration circuitry and associated priority storage elements 717, 742 and 722, 752, in the event of an asserted transmission request in a situation where the associated storage element 742, 752 also stores a logic one value, the Release_b signal will be high (since there is an asserted transmission request rather than an asserted release request), and hence the output from the AND gate 743, 753 will be high, causing the associated transistor 717, 722, respectively, to discharge, thereby implementing the priority scheme discussed earlier. However, if either of the priority storage elements stores a logic zero value, or the WL signal is not asserted because an asserted transmission request is not present, then the corresponding transistor 717, 722 will not discharge.

Similarly, considering the release circuitry 712, 732, in the presence of an asserted release request, where both the release signal and the input 0 word line is set high, this will cause the release transistor 712 to discharge, whereafter the bit line will be resampled by the configuration storage element 700 to reset the routing value to zero. It should be noted that, whilst the release signal is set high, the release_b signal will be low, and accordingly the priority storage elements in other crossbar cells connected to the same bit line that is being released cannot interfere with the release operation being performed via the release transistor 712.

FIG. 10B illustrates circuitry which is used to qualify an asserted request channel or release channel signal. It produces the WL signal, which is set high only if a request/release channel signal is qualified. This WL signal is then used to activate the configuration storage element 700. The same WL (and WL_b) signal is also used to appropriately operate the conditional discharge circuitry 705 and the arbitration circuitry 760.

FIG. 10C illustrates the circuitry provided in association with the sense amp and latch circuitry 775 of the configuration storage element 700 in order to cause it to update its stored value, and in order to generate a grant signal dependent on the updated value. In particular, if a sense enable (SE) signal is set and the WL signal is set, this causes the AND gate 770 to output a set QSE (qualified SE) signal. If the QSE signal is set, this causes the sense amp and latch circuitry 775 to sample the current value on the corresponding bit line, in this example the sense amp and latch circuitry being connected to bit line 0.

A grant signal is generated from the current contents of the sense amp and latch circuitry 775. In particular, based on the current contents and the WL signal, the NAND gate 780 outputs a signal which is routed to the isolation circuitry 785. The isolation circuitry 785 ensures that only one crossbar cell in a particular row will drive a grant signal. In particular only the crossbar cell associated with the column that the source circuit is currently seeking to request can give rise to the grant signal. Hence, in this example, if the transmission request is set high and the input on word line 0 is set high, this will cause a logic one value to be provided to the lower transistor in the isolation circuitry 785 and a logic zero value to be provided to the higher transistor, thereby turning on the inverter and causing a grant signal to be propagated (the grant signal being asserted if the sense amp and latch circuit 775 stores a logic one value). However, otherwise a logic zero value is provided to the lower transistor and a logic one value to the upper transistor, thereby causing the inverter to be turned off and no grant signal to be propagated.

FIG. 10D illustrates the structure of each priority storage element 742, 752 in accordance with one embodiment. In the presence of an asserted release request, where both the release signal and the input 0 word line is set high, AND gate 790 will output a logic 1 value. When the discharge signal also goes to a logic 1 level, this will cause AND gate 791 to output a logic 1 value and discharge the load priority_b signal via transistor 792.

During normal operation, the reset signal will be at a logic 0 level and hence the reset_b signal will be at a logic 1 level. Hence, it can be seen that for all priority storage elements in the crossbar cell receiving the asserted release request (e.g. those priority storage elements in row 194 illustrated in FIG. 4G discussed earlier), AND gate 795 will receive three logic one inputs when the discharge signal is high, the middle logic one input coming from the output of AND gate 790 via OR gate 794. As a result the transistors 796 will be turned on, and cause the priority storage element 798 to store a logic 0 value therein by virtue of the logic one value supplied from AND gate 790.

Similarly, for all priority storage elements coupled to the bit line discharged by the asserted release request (e.g. those priority storage elements in column 192 illustrated in FIG. 4G discussed earlier), AND gate 795 will receive three logic one inputs when the discharge signal is high, the middle logic one input coming from the output of NAND gate 793. In particular, since at this time the load priority_b signal is at a logic 0 level, this ensures that NAND gate 793 will only produce a logic 1 output if the associated bit line has been discharged. As a result the transistors 796 will be turned on, and cause the priority storage element 798 to store a logic 1 value therein by virtue of the logic 0 value supplied from AND gate 790 (this output being a logic 0 value for those priority storage elements coupled to the discharged bit line since they will reside within crossbar cells that are not coupled to the source circuit issuing the asserted release request).

For all other priority storage elements not in the row 194 or the column 192, the middle input of AND gate 795 will be at a logic 0 value and accordingly no update to the priority value will take place.

As illustrated in FIG. 10D each priority storage element can take either the form shown in block 798 or the form shown in block 799. During normal use, when the reset signal is low and the reset_b signal is high, both forms operate in an identical manner since both the NAND gate of form 798 and the NOR gate of form 799 operate as inverters. However, during a reset operation, the reset signal will transition to a logic 1 level, causing the reset_b signal to transition to a logic 0 level, and as a result priority storage elements of the form 798 will store a logic 0 value and priority storage elements of the form 799 will store a logic 1 value. Hence, it can be seen that the priority storage elements can be set to an original configuration upon a reset signal, and thereafter, each time a channel is release the priority data for that channel is updated so as to implement a LRG priority scheme for the channel. It will be appreciated that the LRG scheme implemented as discussed above operates independently for each channel within the crossbar circuit.

FIGS. 11A to 11D illustrate the circuitry provided within each crossbar cell in accordance with an alternative embodiment of the present invention, where each source may issue multiple requests simultaneously. This allows a more efficient implementation for performing multi-casting within the crossbar. In particular, in the embodiment of FIGS. 10A to 10D, a source circuit can only request one channel at a time, and so will require multiple arbitration cycles in order to acquire multiple channels if multi-casting is required. However, with the embodiment of FIGS. 11A to 11D, a source circuit can issue requests for multiple channels at the same time and can potentially acquire multiple channels in one arbitration cycle, thereby enabling multi-casting to be achieved more efficiently.

Figures 11A, 11B, 11C:
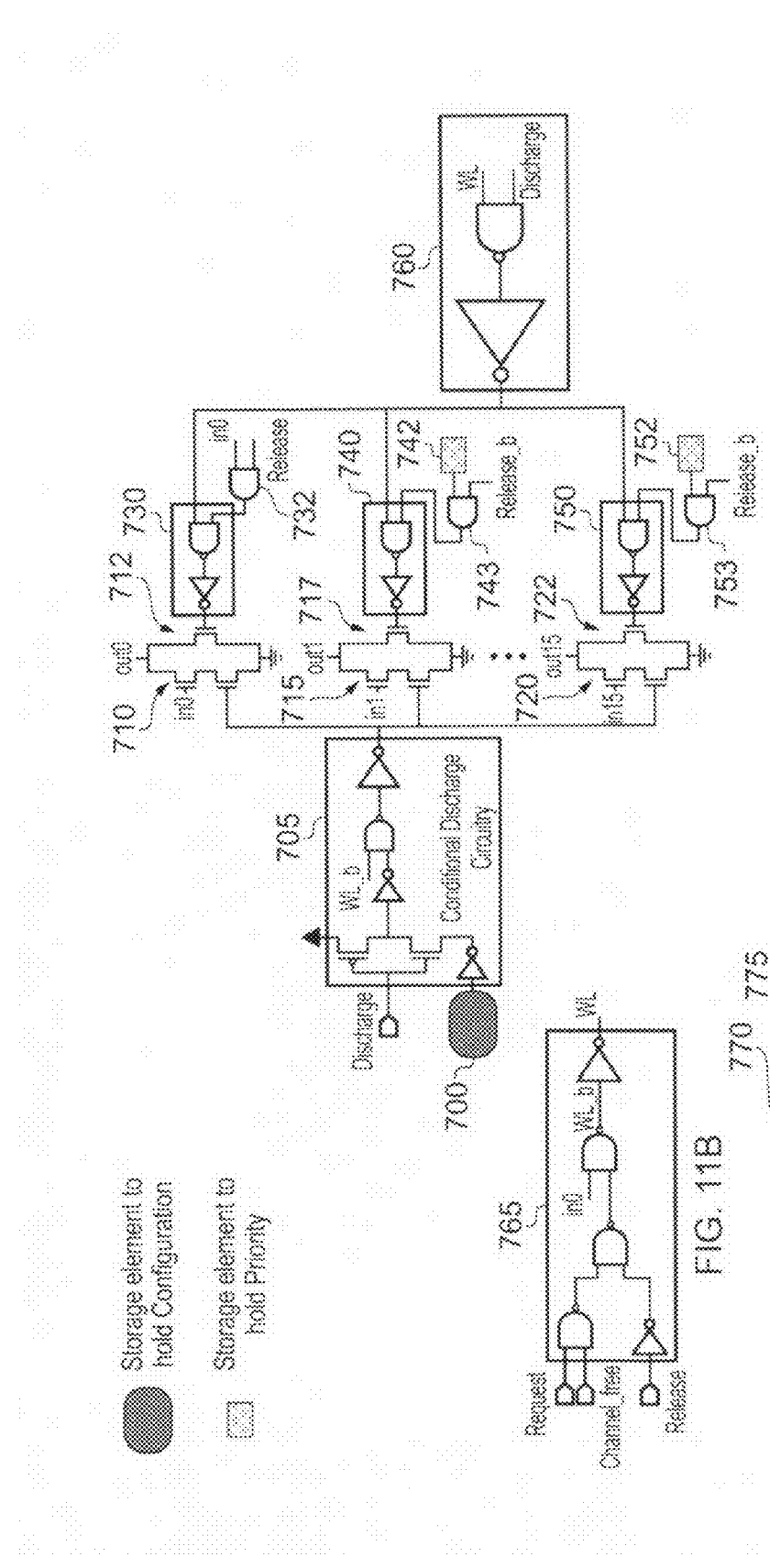
FIGS. 11A to 11D illustrate in more detail the components provided within each crossbar cell of the crossbar circuit in accordance with an alternative embodiment.
Figure 11D:
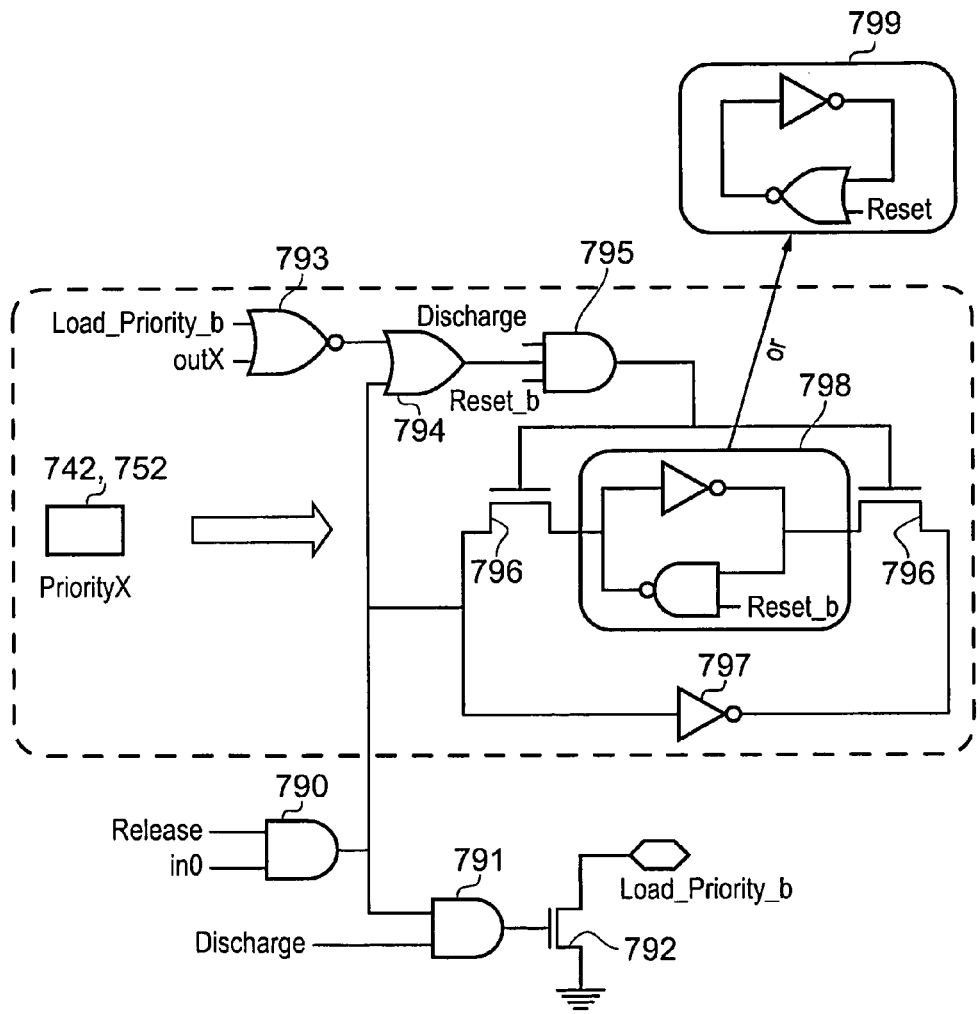

FIGS. 11A, 11B and 11D are identical to FIGS. 10A, 10B and 10D, and accordingly will not be discussed further herein. However, the structure of the configuration storage circuitry is significantly simplified, as shown in FIG. 11C, since there is no need for any isolation circuitry. Instead, a separate grant line is provided in association with each column and hence the current contents of the sense amp and latch circuitry 775 can be used to directly produce the grant signal in the presence of a set WL signal. In particular, if the WL signal is set, the source circuit has issued an asserted transmission request, and the current contents of the sense amp and latch circuitry 775 are set to a logic one value indicating the transmission request has been successful, then a logic one grant signal is issued back to the source circuit.

Figure 12:
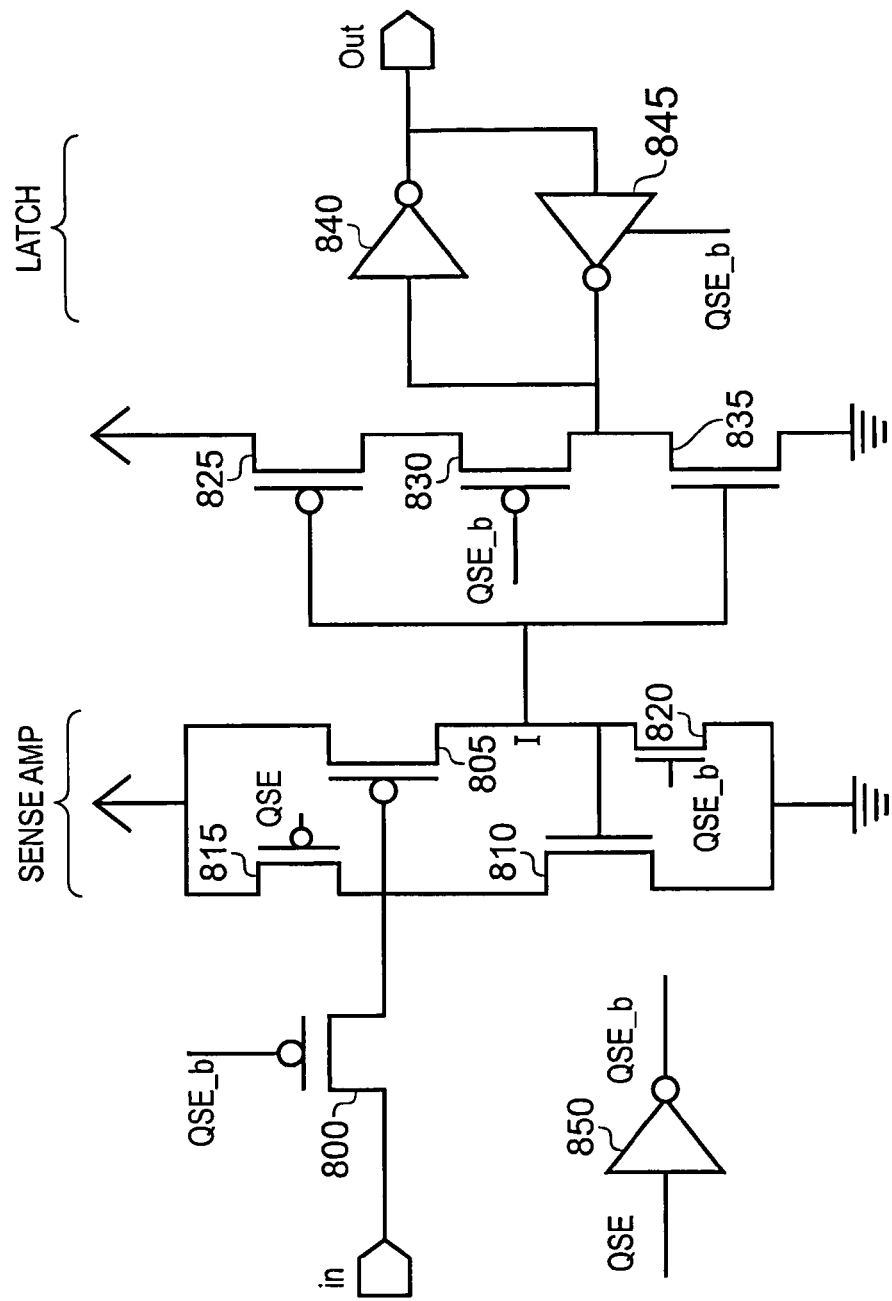
FIG. 12 illustrates in more detail the arrangement of the configuration storage element provided within each crossbar cell in accordance with one embodiment.

FIG. 12 illustrates the arrangement of the configuration storage circuitry (i.e. the sense amp and latch circuitry) provided within each crossbar cell in accordance with one embodiment. The QSE signal generated by the AND gate 770 in FIGS. 10C and 11C is passed via the inverter 850 to produce the QSE_b signal. Accordingly, when the QSE signal goes high, the PMOS transistor 800 is opened to start the sensing operation of the sense amp, the sense amp being formed by the transistors 805, 810, 815, 820. At the start of the sensing operation, the transistors 815 and 820 are turned off. If the input line routed to the transistor 805 starts to discharge, this will cause the transistor 805 to turn on, pulling the intermediate node I towards Vdd. This in turn will cause the transistor 810 to turn on creating a positive feedback loop within the sense amp after a short period of time, at which point the sense amp is no longer reliant on the input signal transitioning towards ground in order to generate its output.

The series of transistors 825, 830, 835 acts as a transfer mechanism between the sense amp and the latch constructed of the components 840 and 845. In particular, during the sensing stage of the operation, the transistor 830 turns on, allowing the contents of the latch to be dictated by the value at the intermediate node I of the sense amp. In particular, it will be seen that if the input to the sense amp is transitioned towards the logic zero value, this will cause the intermediate node I to transition towards Vdd, thereby causing the transistor 835 to turn on in order to store a logic zero value within the latch. Conversely, if the input line does not discharge, the voltage at the intermediate node remains at a logic zero level, thereby turning on the transistor 825 and causing a logic one value to be stored within the latch.

It will be appreciated that the latch only updates its input during a period when the QSE signal is high, since as soon as the QSE signal goes low, the transistor 830 is turned off, thereby isolating the latch from the sense amp output.

FIGS. 13A to 13C illustrate the pulse generator circuitry used in one embodiment to generate both the SE and discharge signals. FIG. 13A shows how the discharge signal is produced from the SE signal after some delay introduced by the component 860. In effect the circuitry of FIG. 13A acts as an AND gate, ANDing together the SE signal with a delayed version of the SE signal.

FIG. 13B illustrates a ring oscillator design used to create the SE signal. When the oscillate input signal is high, this activates the ring oscillator to then produce a clock signal, with the SE signal being derived from the clock signal via some delay circuitry 870.

As shown in FIG. 13C, the duration for which the SE signal goes low, namely duration d1, is determined by the component 870, and the period of time for which the discharge signal goes high, namely duration d2, is determined by the delay circuitry 860 of FIG. 13A.

The voltages Vb_SE and Vb_Discharge are used to control the delay periods d1 and d2, an in particular if these voltages are reduced, the delay periods will grow accordingly.

At the positive edge of the clock, data is launched onto the word lines. Since the "Discharge" signal is low at this time, the bit lines are isolated from the word lines. During period "d1", data settles on the word lines and the bit lines get fully pre-charged. "d2" is the period for which the bit lines are conditionally discharged. Simultaneously the SE signal goes high and the sense amplifier starts sampling the bit lines. The bit line is discharged just sufficiently enough so that the sense amplifier can detect it. This is done to save power. Hence, after time "d2", the "Discharge" signal goes low, while the SE signal remains high.

Figure 14:
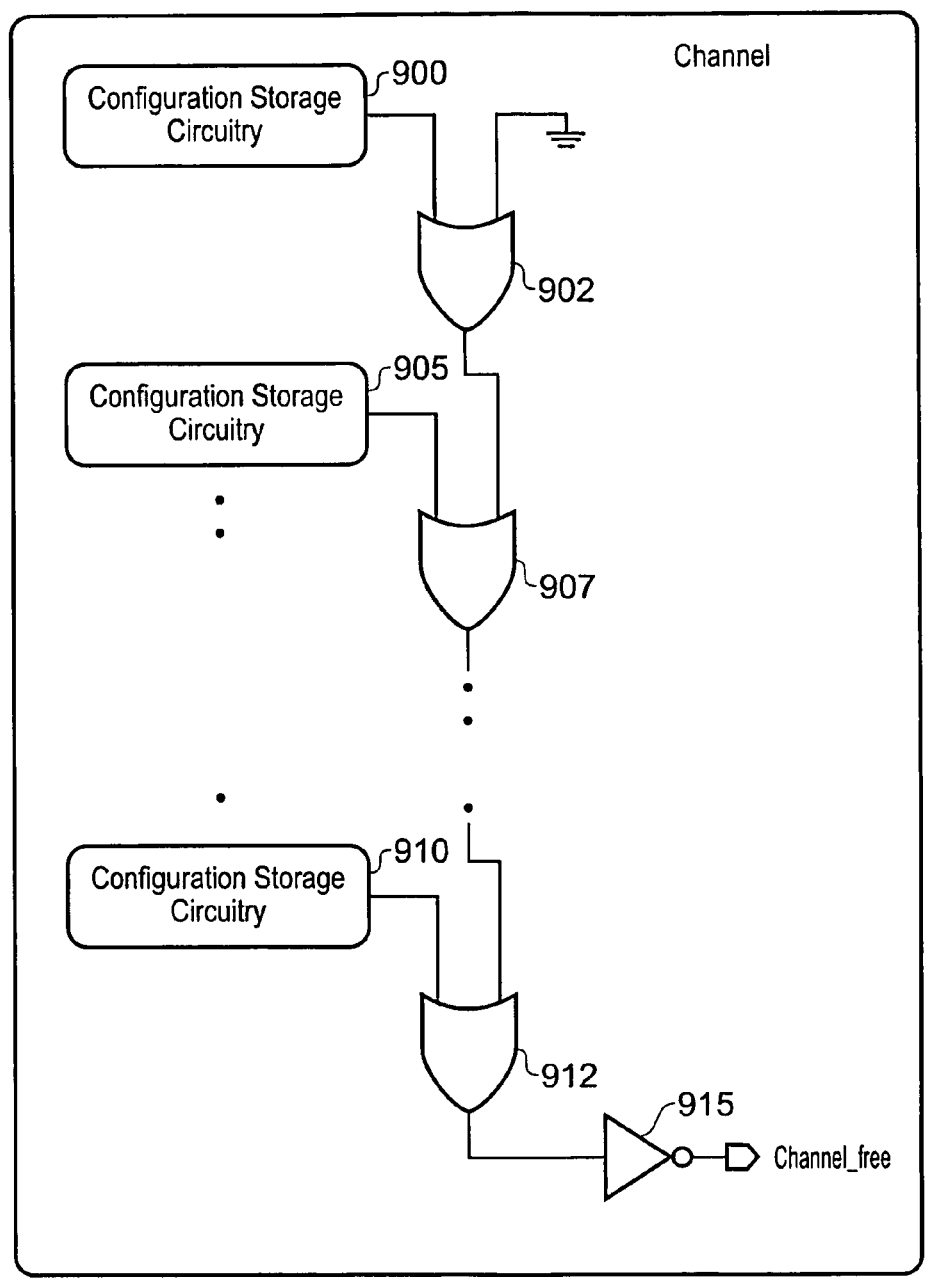
FIG. 14 illustrates how a channel_free signal is generated in accordance with one embodiment.

FIG. 14 schematically illustrates how the channel_free signal referred to in FIGS. 10B and 11B is generated in accordance with one embodiment. In particular, as shown, the outputs from the various configuration storage circuits 900, 905, 910 within crossbar cells connected to a particular output channel are logically OR-ed together by the OR gates 902, 907, 912, with the result then being inverted by the inverter 915. Accordingly, it can be seen that the channel_free signal will be at a logic zero value if any of the configuration storage circuits stores a logic one routing value, and only if all of them store a logic zero routing value will the channel_free signal be set to one. Hence, if at the start of the arbitration mode of operation, one of the configuration storage circuits is already set to a logic one value, indicating that a source circuit already has ownership of that channel, then none of the asserted transmission requests at that time will be granted, and only once that channel has been released will it be possible for another source to request and be granted that channel.

Figure 15A:
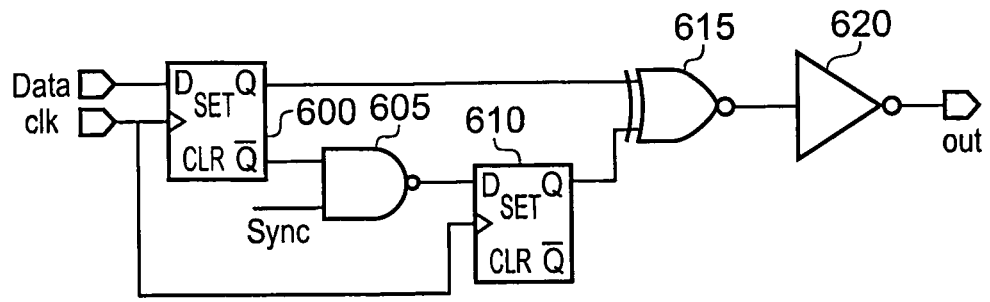
FIGS. 15A to 15E illustrate encoding and decoding circuitry that may be used in one embodiment to encode the input data prior to input into the crossbar circuitry, and to decode the output data from the crossbar circuitry, in order to reduce power consumption within the crossbar circuitry.
Figure 15B:
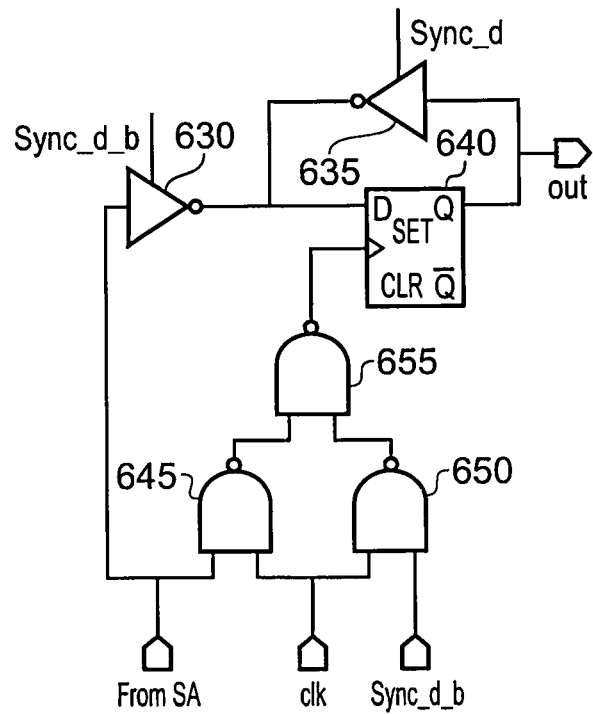
Figure 15C:
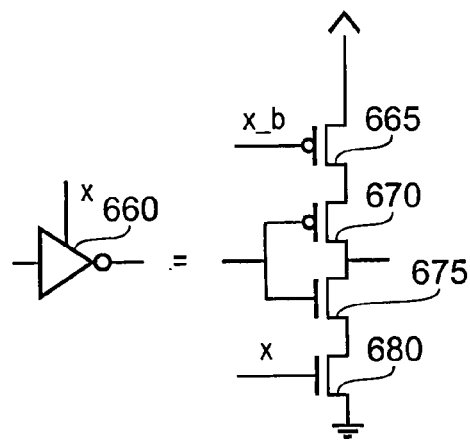

Since the output data lines are precharged high in the above described embodiment, a static high input would result in those data lines being discharged every clock cycle. FIGS. 15A to 15E illustrate an encoding scheme that can be used to mitigate this, and thereby reduce power consumption. In particular, FIG. 15A shows encoder circuitry that may be placed between the source and the input data path of the crossbar, and FIG. 15B illustrates associated decoder circuitry that may be placed between the output of the sense amplifiers 65 and the destination circuit. Considering first the encoder circuitry of FIG. 15A, each item of new data is latched in the flip-flop 600 and the old data is propagated via the NAND gate 605 to the flip-flop 610. The comparator 615 then compares the new data with the old data and whenever there is a difference this causes a logic zero value to be output to the inverter 620 resulting in a logic one value being output by the encoder circuitry. Hence, from the provided input data, the encoder produces logic zero values separated by logic one values every time the input data changes from a logic zero to a logic one value or from a logic one value to a logic zero value. From the earlier discussion of the crossbar cells, it will be appreciated that the data output lines will only be discharged when such logic one values appear, thereby significantly reducing the power consumption associated with the precharge operation.

When the first data item is input, there will be no previous data to compare against, and accordingly the sync signal is used to set an initial state in the flip-flop 610. Further, the synchronisation pulse can be used to reset the encoder hardware (without the expense of a clock cycle) every time the crossbar switches to a new configuration.

The corresponding decoder circuitry is illustrated in FIG. 15B. The structure of the components 630 and 635 is illustrated schematically in FIG. 15C by the component 660. As shown, such a component actually consists of a series of transistors 665, 670, 675, 680 connected in series.

The sync_d signal is the same as the sync signal, but delayed by one clock cycle. The sync_d_b signal is the inverted sync_d signal. The relationship between these three signals is shown in FIG. 15E. It should be noted that the sync signal is an active low signal and hence under normal operation (when the circuitry is not switching to a new configuration), sync and sync_d will be at a high, logic one, level, whilst the sync_d_b signal will be a low, logic zero, level.

As can be seen from FIG. 15B, the decoder receives the output from the sense amplifier, the clock signal and the sync_d_b signal and, via a series of NAND gates 645, 650, 655, provides an internal clock signal to the flip-flop 640. The output from the flip-flop 640 drives the output to the destination circuit, and recreates the original input data from the encoded output received via the sense amplifier.

In normal operation, since the sync signal will be at a logic 1 level and the sync_d_b signal will be a logic 0 level, component 635 will be activated while component 630 is deactivated. The three NAND gates 645, 650, 655 provide a pulse to Flip-Flop 640 when the sense amplifier detects a transition and sends a high signal. When a switch to a new configuration takes place, the sync and sync_d signals go low while the sync_d_b signal goes high. Hence, at that time, component 630 is activated while component 635 is deactivated. As a result, instead of toggling the previous data via the inverter 635, the flip-flop 640 takes the data (after component 630 inverts it) from the sense-amplifier.

Figure 15D:
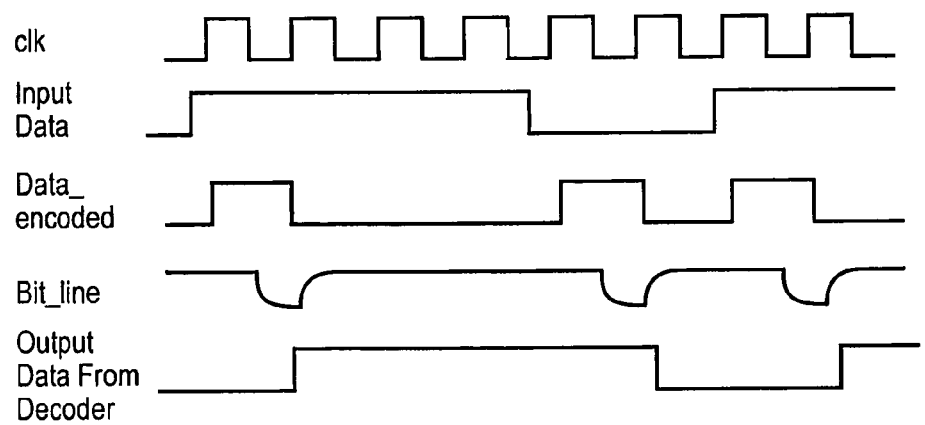
Figure 15E:
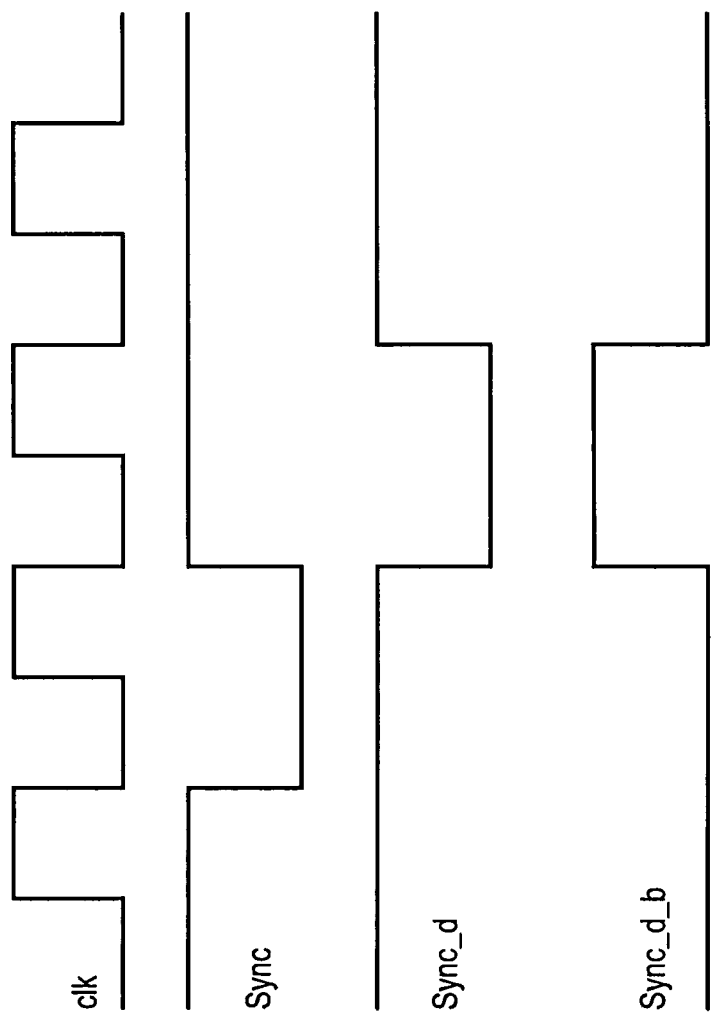

FIG. 15D illustrates the input data to the encoder circuitry, the resultant encoded data output from the encoder circuitry, an indication of the corresponding bit line being discharged each time the encoded data goes high, and shows the output data produced by the decoder circuitry based on the information received from the sense amp. It can be seen that the output data faithfully reproduces the input data that was passed to the encoder.

In the embodiments discussed above, the size of the crossbar circuitry corresponds with the size of the input buses and output buses. Hence, considering input buses providing 16 word lines and output buses providing 16 bit lines, a 16×16 crossbar circuit has been discussed. However, the technique can also be adapted to operate with crossbar circuits having arrays of crossbar cells larger than the width of the input buses and output buses (what will be referred to herein as a narrow channel design).

Figure 16:
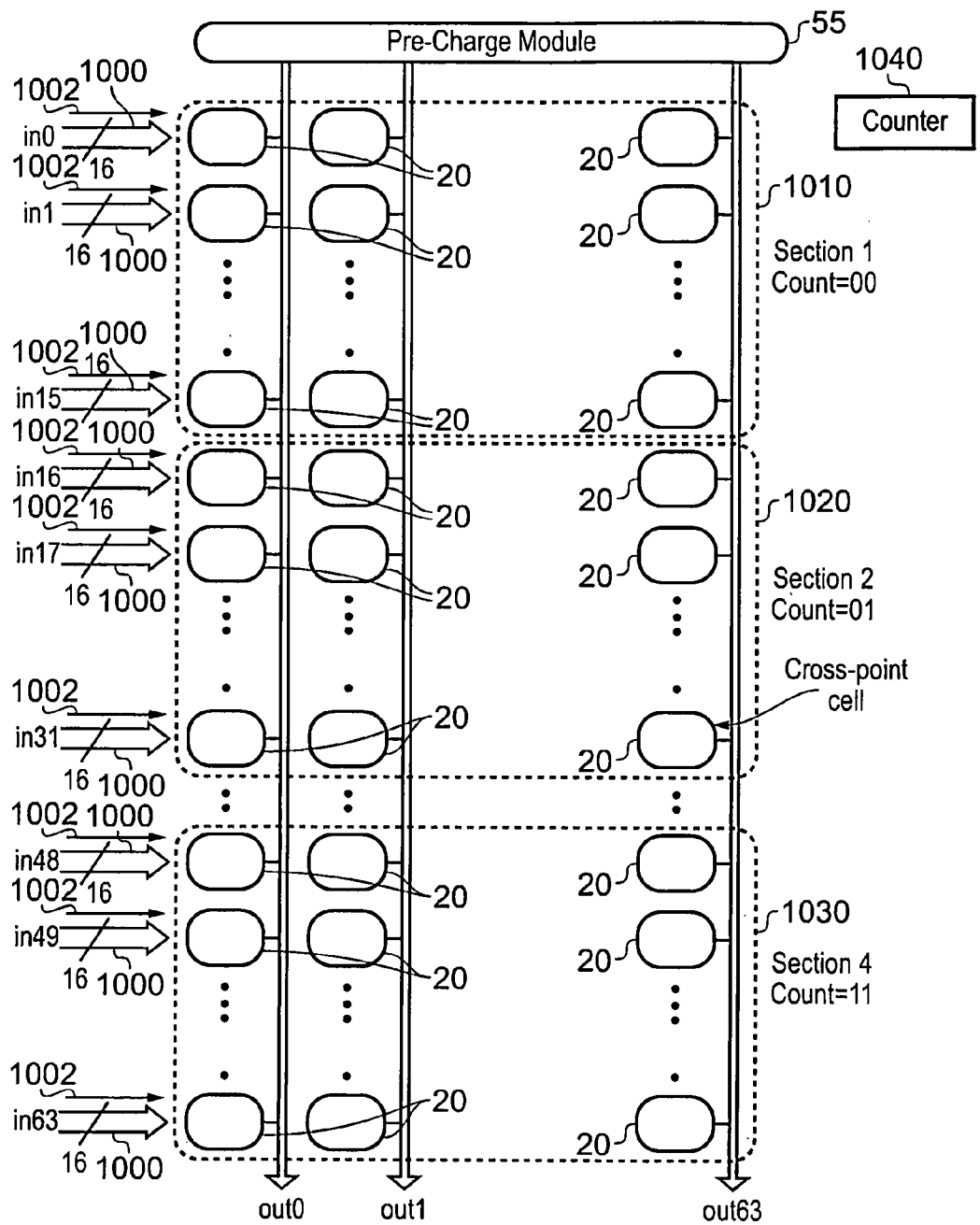
FIG. 16 illustrates how crossbar circuitry with narrow data input paths and data output paths may be arranged to operate in accordance with one embodiment.

Considering first a narrow channel design, FIG. 16 illustrates one embodiment for implementing such a narrow channel design. In this particular example, it is assumed that a 64×64 array of crossbar cells 20 is provided within the crossbar, with the precharge module 55 again being used to precharge the bit lines running through the crossbar. However, the data input paths and data output paths are only 16 bits wide, and accordingly it is not possible to perform the earlier described arbitration process in a single cycle. Instead, in such embodiments, the crossbar can be divided into sections, in this example the crossbar being divided into four sections 1010, 1020, 1030, with a counter 1040 being used to identify which section is currently active. The counter can hence be incremented every arbitration cycle to select which section to serve during arbitration in that arbitration cycle. Since each section still has 64 crossbar cells in each row, it is clear that the data input paths 1000 do not by themselves enable individual data output paths to be identified by asserted transmission requests. Accordingly, in one embodiment a two bit additional signal 1002 is provided when asserting transmission requests to identify which data output path is being requested by the associated source circuit.

Accordingly, when the counter has a value of 00, only asserted transmission requests from sources 0 to 15 are considered, and for each data output path the highest priority source amongst sources 0 to 15 requesting access to that data output path is granted access for transferring data in the subsequent transmission cycle. Following such an arbitration and transmission sequence, the counter is then incremented to 01, so that in the next arbitration cycle only asserted transmission requests from sources 16 to 31 are considered. This process is repeated for each section in turn. As a result, it will be appreciated that the arbitration latency for any given asserted transmission request will vary from one to four cycles for the dimensions of the example in FIG. 16. For example, if source 0 asserts a transmission request in an arbitration cycle for which the count is 00, then its request can be arbitrated straightaway in that cycle, and if it is the highest priority request in section 1, it will be granted. However, if source 0 asserts a transmission request when the count is 01, then its request will not even be a candidate for arbitration until the fourth following arbitration cycle when the counter has returned to 00 (and accordingly section 1 1010 is being arbitrated).

A benefit of such an approach is that it has a minimal wiring and logic overhead, and hence the solution will provide a good solution in situations where the variation in arbitration latency can be tolerated. However, it is worth noting that as the number of sections increases, the worst case arbitration latency also increases.

Figure 17A:
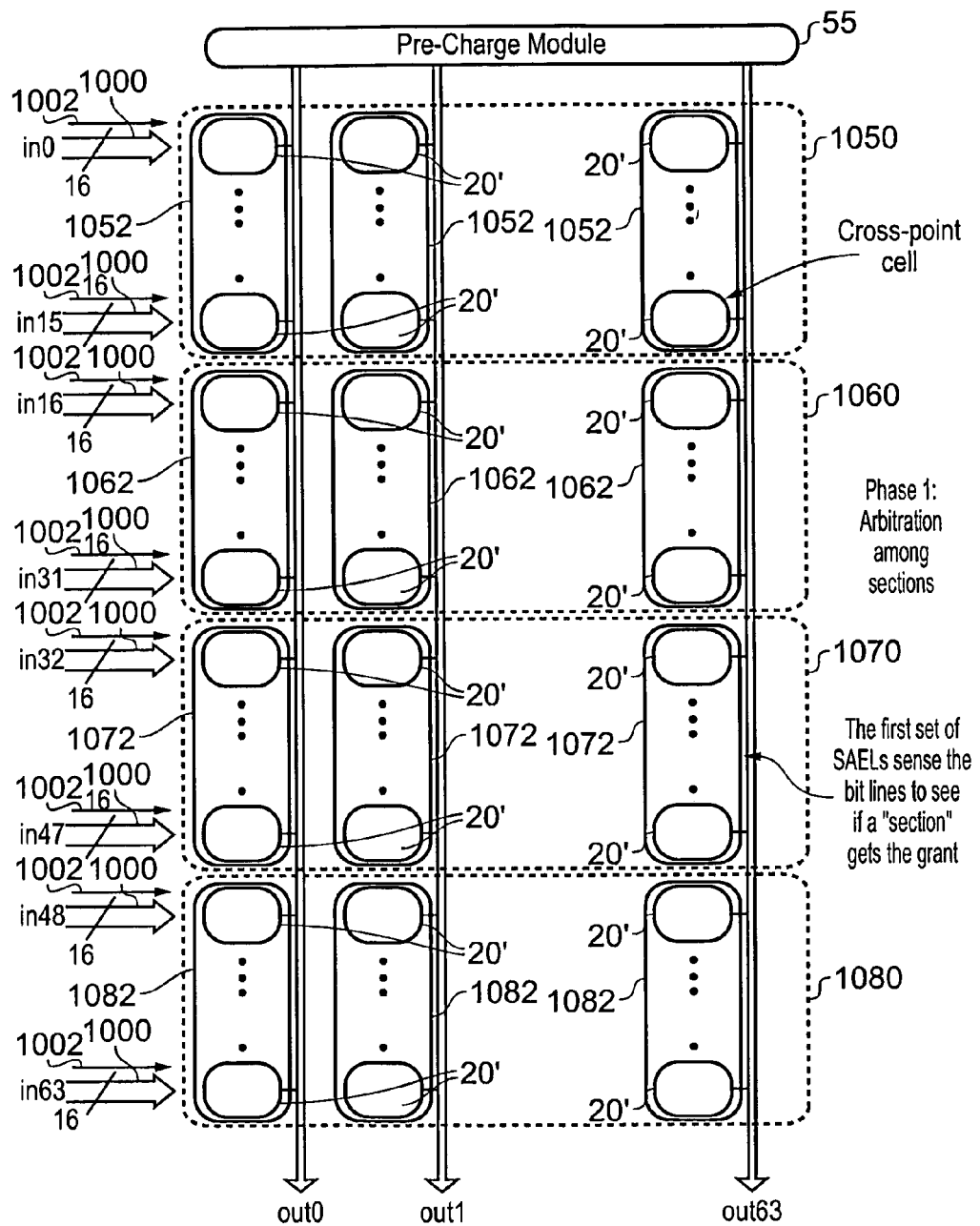
FIGS. 17A and 17B illustrate how crossbar circuitry with narrow data input paths and data output paths may be arranged to operate in accordance with an alternative embodiment.
Figure 17B:
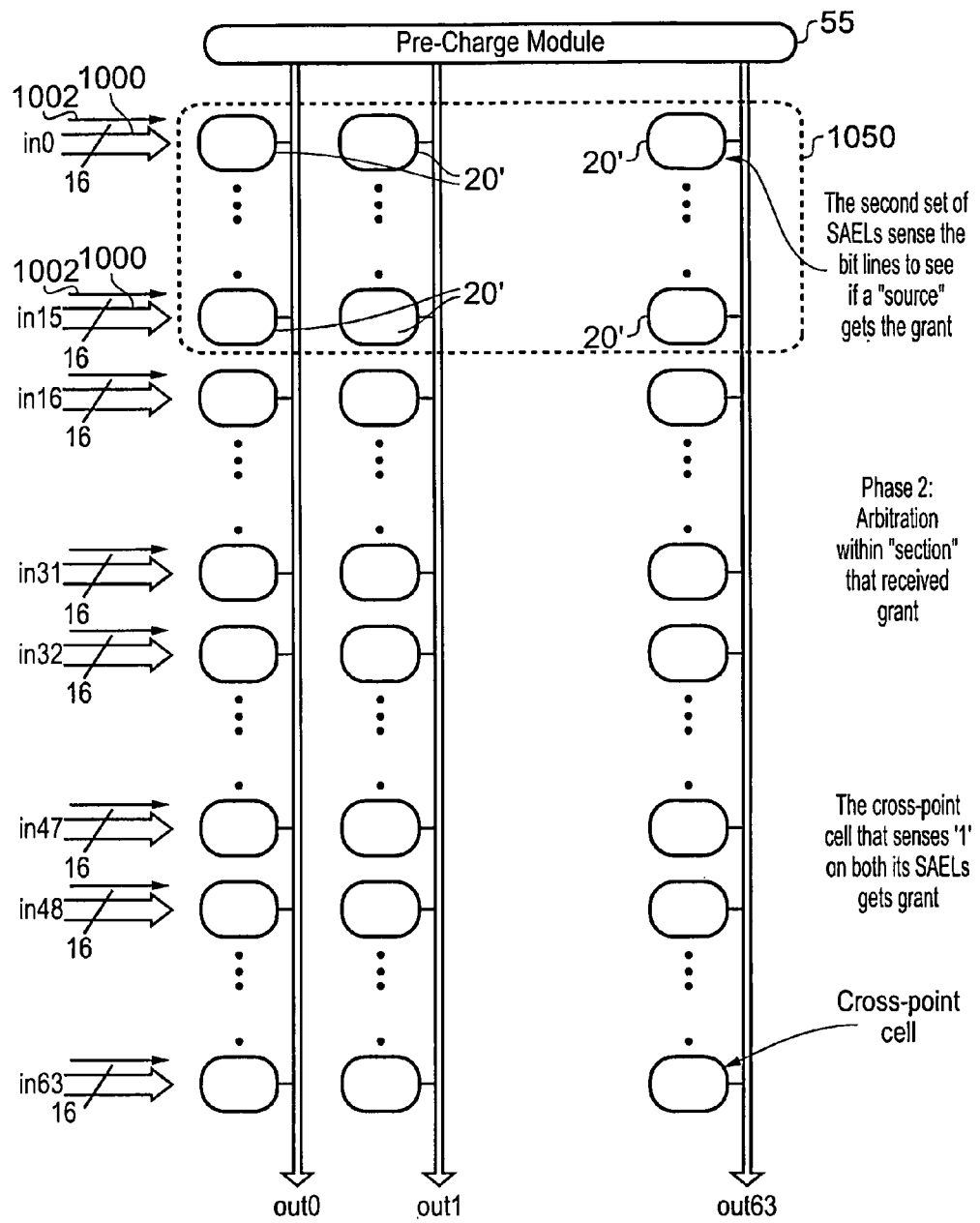

FIGS. 17A and 17B illustrate an alternative embodiment where the crossbar is again divided into sections, but arbitration is then done hierarchically in two steps. In a first step, arbitration is performed amongst the sections, and then in the second step arbitration is performed amongst all the asserted transmission requests in a given section. The same group of bit lines is used for both arbitration steps. In this example, the crossbar cells are denoted by the numeral 20', since each of the crossbar cells is constructed basically as discussed earlier, but now each crossbar cell includes two sense amp enabled latches (SAELs), with the first SAEL being used in the first arbitration cycle and the second SAEL being used in the second arbitration cycle.

Hence, in arbitration cycle 1, each of the sections 1050, 1060, 1070, 1080 are considered but the individual crossbar cells 20' for a particular data output path within the given section are in effect considered in combination, as indicated schematically by the boxes 1052, 1062, 1072, 1082. In particular, considering the 64×64 crossbar example of FIG. 17A with 16-bit channels, then each of the four separate sections 1050, 1060, 1070, 1080 will have relative priorities. If section 1 has the highest priority, then any asserted transmission request from sources 0 to 15 will cause the bit lines for sections 2, 3 and 4 (i.e. sections 1060, 1070, 1080) to be discharged. As a result, the first set of SAELs in section 1 will latch a logic one value, whilst the first set of SAELs in the other sections will latch a logic zero value.

In the next arbitration cycle, as illustrated by FIG. 17B, only requests in section 0 (assuming the sequence of events discussed above) use the bit lines for arbitration. Now the process performed within this section 1050 is as discussed earlier, i.e. the bit lines are precharged, and then selectively discharged in accordance with the priority information stored within each crossbar cell. As was discussed earlier in FIG. 16, an additional 2-bit signal 1002 is used to qualify which output path is being requested by the 16-bit value input over the word lines 1000. For multiple requests for any particular data output line, the highest priority request from amongst the sources 0 to 15 will then be granted access, with the second set of SAELs sensing the bit lines in the standard manner. To determine whether a grant has been given to a particular source, then both of the SAELs of a crossbar cell 20' need to be considered, and in particular if both of them store a logic one value, then a grant signal is generated back to the source.

Such an approach has a fixed two cycle arbitration latency at the expense of some additional logic, but no additional interconnect structure. With 16 bit lines in a channel it is possible to potentially arbitrate between 16 sections, with each section containing 16 requests. Hence the arbitration latency can be retained at two cycles for a crossbar up to a 256×256 crossbar.

In one embodiment of the FIGS. 17A/17B approach, two sets of priority storage elements can be provided in each crossbar cell, one set used in association with the first arbitration cycle (where the first set of SAELs are used), and one set used in association with the second arbitration cycle (where the second set of SAELs are used).

Figure 18:
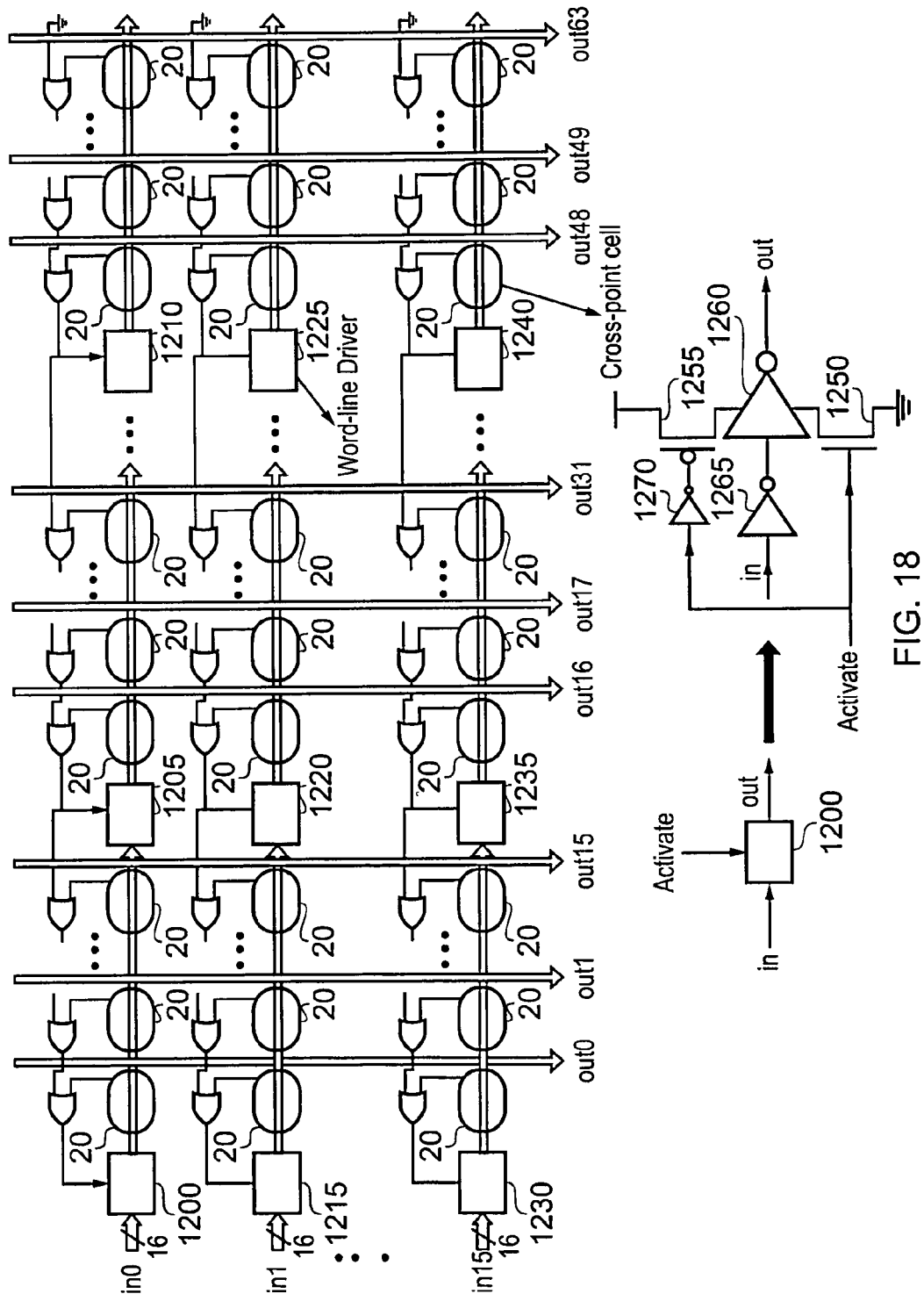
FIG. 18 illustrates how crossbar circuitry may be used in a partially activated configuration in accordance with one embodiment.

FIG. 18 illustrates a partially activated network embodiment where a sequence of word line drivers 1200, 1205, 1210 are used to propagate data input values along the data input paths to the various crossbar cells 20 connected to those data input paths. Without such a partially activated network, significant power may be consumed in propagating the data along the entirety of the data input path in situations where it is not needed.

However, power savings can be achieved by using the partially activated network approach set out in FIG. 18, where each of the word line drivers is conditionally activated based on a signal derived from the routing values stored in each of the remaining crossbar cells along the data input path. In particular, as shown, a routing value stored in a particular crossbar cell is logically OR-ed with the routing value held in all of the other crossbar cells to its right in a particular row, with each word line driver 1200, 1205, 1210 being activated in dependence on the value of that signal at the point that word line driver is reached in the chain.

Hence, in the example given above, where at least one of the first fifteen crossbar cells in row 0 has its routing value set to one, indicating that the corresponding source has been granted access to one of the output paths 0 to 15, but none of the other crossbar cells further to the right in that row have their routing values set to one, then both the word line drivers 1205 and 1210 will receive a logic zero activate signal, whilst the word line driver 1200 will receive a logic one activate signal. As shown by the circuitry in the lower half of FIG. 18, for each of the word line drivers (for the purposes of illustration word line driver 1200 is considered but all of the word line drivers are constructed similarly), the activate signal is used to selectively activate the word line driver. In particular, the main inverter 1260 within the word line driver is only activated if the activate signal is high, this causing both the transistors 1250 and 1255 to turn on. When the activate signal is low, these transistors do not turn on and the inverter 1260 is not activated. When activated, the inverters 1260 and 1265 act in combination to amplify the input data for propagation further along the data input path.

Accordingly, in the embodiment discussed with reference to FIG. 18, data is not driven on the word lines beyond the channel after which the remaining crossbar cell switches are turned off. This can provide a useful power saving scheme for large crossbars, and can yield particularly good power savings in implementations which rarely do multi-casting.

From the above description of embodiments, it will be seen that such embodiments provide a novel crossbar implementation scheme that can be used to design very large crossbars, such as may be required for multi-core applications. The crossbar circuitry of embodiments of the present invention re-uses the data output lines during the arbitration mode of operation to detect and resolve conflicts, and to program the configuration storage elements within each crossbar cell accordingly. The proposed implementation of embodiments of the present invention uses the minimum possible area to design the crossbar. As opposed to typical prior art implementations, where both the number of cross-points as well as the logic embedded at each cross-point grows, in accordance with embodiments of the present invention only the number of cross-points grows.

For embodiments where the size of the crossbar cell array does not exceed the width of the input and output channels, arbitration can be performed in a single cycle, thereby minimising delay overhead in performing arbitration. Further, embodiments provide priority storage circuitry which re-uses the bit lines to self update the priority data stored therein between each application of the priority scheme by the arbitration circuitry, thereby providing a very efficient, fast and scalable mechanism for implementing adaptive priority schemes such as the LRG priority scheme.

Further, by integrating the arbiter with the crossbar, communication overhead between the two has been eliminated.

In addition, when employing the crossbar cell structure of the above described embodiments, neither the size of the transmission circuitry, nor the driver circuitry used to provide the input data on each input data path, need to increase in size as the crossbar circuitry increases in size. Further, no additional hardware or sizing is required to support multi-casting, where a single input data value is broadcast to multiple output paths.

Further, due to the regular structure employed in the above described embodiments, routing becomes significantly more straightforward than in typical prior art approaches.

In embodiments of the present invention, inputs are fed into the crossbar as buses and not as packets comprising the same bits from different buses, as for example would be required in a typical prior art crossbar employing multiplexing techniques. This makes the crossbar circuitry of embodiments of the present invention easy to utilise as a wide bus interconnect.

Due to the design of the crossbar circuitry of embodiments of the present invention, the delay through the crossbar grows linearly with size. This makes the crossbar circuitry of such embodiments readily usable for very large crossbars, such as 128×128 or 256×256 input/output crossbars.

As mentioned earlier, the design is very regular and the delay across all channels is uniform. Further, inputs can be fed from either horizontal end and outputs are available at either vertical end. This makes design floor planning easy by reducing routing congestion.

Due to the regular bit-cell like architecture of the crossbar circuitry of embodiments of the present invention, the design and layout of the crossbar circuitry can readily be integrated into existing CAD (computer aided design) flow processes.

When compared with prior art techniques, the crossbar circuitry of embodiments of the present invention runs faster, yet consumes less power, due to the smaller size of the interconnect and the fast sensing techniques employed.

Although a particular embodiment of the invention has been described herein, it will be apparent that the invention is not limited thereto, and that many modifications and additions may be made within the scope of the invention. For example, various combinations of the features of the following dependent claims could be made with the features of the independent claims without departing from the scope of the present invention.

We claim:

1. Crossbar circuitry for interconnecting a plurality of source circuits and a plurality of destination circuits such that data input to the crossbar circuitry from any of said plurality of source circuits can be output to any of said plurality of destination circuits, the crossbar circuitry comprising:

a plurality of data input paths passing through said crossbar circuitry, each data input path being connectable to one of said plurality of source circuits and providing a plurality of word lines;

a plurality of data output paths passing through said crossbar circuitry transverse to the plurality of data input paths, each data output path being connectable to one of said plurality of destination circuits and providing a plurality of bit lines;

a crossbar cell associated with each intersection between one of said data input paths and one of said data output paths, each crossbar cell comprising:

configuration storage circuitry programmable in an arbitration mode of operation to store a routing value in dependence on a voltage on at least one of said plurality of bit lines, the routing value being programmed to a first value to indicate that data input along the word lines of the data input path to the associated intersection is to be output on the bit lines of the data output path at the associated intersection, and the routing value being programmed to a second value to indicate that data input along the word lines of the data input path to the associated intersection is not to be output on the bit lines of the data output path at the associated intersection;

transmission circuitry which in a transmission mode of operation is responsive to the routing value having said first value to detect the data input along the word lines of the data input path and to output an indication of that data on the bit lines of the data output path at the associated intersection;

arbitration circuitry that operates in said arbitration mode of operation in dependence on a transmission request received by the crossbar cell from the source circuit connected to the data input path of the associated intersection, if the transmission request is asserted to indicate that said source circuit wishes to route data from the data input path to the data output path at the associated intersection, the arbitration circuitry being arranged to operate in combination with the arbitration circuitry of other crossbar cells associated with the same data output path to selectively modify the voltage on the plurality of bit lines in order to apply an adaptive priority scheme, such that in the presence of multiple asserted transmission requests for said same data output path, the configuration storage circuitry of only one crossbar cell associated with said same data output path has its routing value programmed to said first value, thereby resolving conflict between said multiple asserted transmission requests according to said adaptive priority scheme; and priority storage circuitry configured to store priority data identifying which of the plurality of bit lines are to have their voltage modified by the associated arbitration circuitry in order to apply the adaptive priority scheme;

the priority storage circuitry being configured, between each application of the adaptive priority scheme by the arbitration circuitry, to self update the priority data stored therein in dependence on the voltage of at least one of the plurality of bit lines.

2. Crossbar circuitry as claimed in claim 1, wherein the adaptive priority scheme is a least recently granted (LRG) priority scheme.

3. Crossbar circuitry as claimed in claim 1, wherein:
each data output path provides n bit lines;
each configuration storage circuitry is associated with one of said n bit lines via which the routing value is programmed into the configuration storage circuitry, such that for up to n crossbar cells associated with the same data output path, the configuration storage circuitry of those crossbar cells have a different associated bit line of said n bit lines;
within each crossbar cell the arbitration circuitry and the priority storage circuitry is associated with the n−1 bit lines other than the one bit line associated with the configuration storage circuitry of that crossbar cell, with the priority storage circuitry identifying which of those n−1 bit lines should have their voltages modified by the arbitration circuitry in order to apply said adaptive priority scheme.

4. Crossbar circuitry as claimed in claim 3, wherein:
in said arbitration mode of operation, after the arbitration circuitry of any crossbar cells associated with the same data output path that receive an asserted transmission request has selectively modified the voltage on the n bit lines in order to apply said adaptive priority scheme, each configuration storage circuitry of a crossbar cell receiving an asserted transmission request is configured to sample the voltage on its associated bit line in order to program said routing value.

5. Crossbar circuitry as claimed in claim 3, wherein each crossbar cell further comprises:
release circuitry coupled to the one bit line associated with the configuration storage circuitry of that crossbar cell, on receipt of an asserted release request the release circuitry causing the voltage on that one bit line to be modified to a level that causes said second value to be stored as said routing value in the configuration storage circuitry of that crossbar cell, thereby causing the crossbar cell to release the associated data output path to allow re-allocation of that data output path.

6. Crossbar circuitry as claimed in claim 5, wherein the priority storage circuitry in those crossbar cells associated with the released data output path is responsive to the asserted release request to self update the priority data stored therein in dependence on the voltage of at least one of the plurality of bit lines.

7. Crossbar circuitry as claimed in claim 6, wherein:
each priority storage circuitry comprises a plurality of priority storage elements, each priority storage element being associated with one of said plurality of bit lines, within each priority storage circuitry the current value of the plurality of priority storage elements indicating, for the associated data output path, a relative priority level for the source circuit coupled to the crossbar cell containing that priority storage circuitry;
the adaptive priority scheme is a least recently granted (LRG) priority scheme;
within the priority storage circuitry of those crossbar cells associated with the released data output path, those priority storage elements that are associated with the bit line whose voltage is modified by the release circuitry are set to a first value, whereby the relative priority level of each source circuit other than the source circuit releasing the data output path is either increased or maintained;
for the crossbar cell containing the release circuitry that received the asserted release request, the priority storage circuitry has its priority storage elements cleared to a second value, whereby the source circuitry releasing the data output path is assigned a relative priority lower than the other source circuits.

8. Crossbar circuitry as claimed in claim 5, wherein:
each of the bit lines are precharged to a first voltage level;
on receipt of said asserted release request, the release circuitry discharges the voltage on the one bit line associated with the configuration storage circuitry of that crossbar cell; and
each configuration storage circuitry comprises a sense-amp enabled latch which, in the presence of an asserted release request to the associated release circuitry, senses the voltage on its associated bit line following the discharge operation performed by the release circuitry in order to update the routing value to said second value, thereby releasing the associated data output path.

9. Crossbar circuitry as claimed in claim 5, wherein:
each data input path provides n word lines;
the release requests for up to n crossbar cells associated with the same data input path are input to the crossbar circuitry via the n word lines of that same data input path; and
each release circuitry is associated with one of said n word lines, such that for up to n crossbar cells associated with the same data input path, the release circuitry of those crossbar cells have a different associated word line of said n word lines via which the release request is received.

10. Crossbar circuitry as claimed in claim 9, wherein:
the release requests are issued in said arbitration mode of operation, and a control signal is issued by the plurality of source circuits in the arbitration mode of operation to identify if the n word lines of the associated data input path are carrying release requests or transmission requests.

11. Crossbar circuitry as claimed in claim 1, wherein, at an initialization point, the priority storage circuitry of each crossbar cell are initialized to predetermined values to provide initial relative priority levels for the plurality of source circuits in respect of each of the plurality of data output paths.

12. Crossbar circuitry as claimed in claim 1, wherein:
each of the bit lines are precharged to a first voltage level and then during the arbitration mode of operation the arbitration circuitry of any crossbar cells associated with the same data output path that receive an asserted transmission request selectively discharge the voltage on the n bit lines in order to apply said adaptive priority scheme.

13. Crossbar circuitry as claimed in claim 12, wherein each configuration storage circuitry comprises a sense-amp enabled latch which, in the presence of an asserted transmission request, senses the voltage on its associated bit line following the selective discharge operation performed by the arbitration circuitry.

14. Crossbar circuitry as claimed in claim 1, wherein:
each data input path provides n word lines; and
in the arbitration mode of operation the transmission requests for up to n crossbar cells associated with the same data input path are input to the crossbar circuitry via the n word lines of that same data input path.

15. Crossbar circuitry as claimed in claim 14, wherein each configuration storage circuitry is associated with one of said n word lines, such that for up to n crossbar cells associated with the same data input path, the configuration storage circuitry of those crossbar cells have a different associated word line of said n word lines via which the transmission request is received.

16. Crossbar circuitry as claimed in claim 15, wherein:
a matrix of mn×mn crossbar cells are provided, wherein m is an integer of 2 or more;
the matrix is divided into a plurality of sections;
a series of arbitration operations are used to apply the adaptive priority scheme to cause the configuration storage circuitry of only one crossbar cell associated with said same data output path to have its routing value programmed to said first value, thereby resolving conflict between multiple asserted transmission requests according to said adaptive priority scheme;
for each arbitration operation in the series, one or more of the sections in said plurality of sections being subjected to that arbitration operation.

17. Crossbar circuitry as claimed in claim 16, wherein each arbitration operation operates on a single section, such that after said series of arbitration operations have been performed all of said plurality of sections have been subjected to said arbitration operation.

18. Crossbar circuitry as claimed in claim 16, wherein:
in a first arbitration operation of the series, all of the plurality of sections are subjected to the first arbitration operation in order to identify one of the sections in said plurality that contains the configuration storage circuitry whose routing value is to be programmed to said first value; and
in a second arbitration operation of the series, said one of the sections identified by the first arbitration operation is subjected to the second arbitration operation to identify the configuration storage circuitry within that section whose routing value is to be programmed to said first value.

19. Crossbar circuitry as claimed in claim 1, wherein for the one crossbar cell associated with the same data output path whose configuration storage circuitry has its routing value programmed to said first value during the arbitration mode of operation, a grant signal is asserted to the associated source circuit to confirm that the asserted transmission request has been granted.

20. Crossbar circuitry as claimed in claim 1, wherein each data output path associated with a crossbar cell in the transmission mode of operation is precharged to a first logic level prior to data transfer, the transmission circuitry of each crossbar cell comprising:
first and second switches connected in series between the data output path and a second logic level;
in the transmission mode of operation the first switch being open or closed dependent on the routing value stored in the associated configuration storage circuitry, and the second switch being open or closed dependent on the data input over the data input path.

21. Crossbar circuitry as claimed in claim 20, wherein each said data input path comprises n word lines for carrying an n-bit input data value during the transmission mode of operation, and each said data output path comprises n bit lines for carrying an n-bit data value during said transmission mode of operation, at least the second switch being replicated for each bit line.

22. Crossbar circuitry as claimed in claim 20, wherein in the transmission mode of operation a bit line of the data output path is pulled to the second logic level if the routing value is said first value and the input data bit on the corresponding word line is at said first logic level.

23. Crossbar circuitry as claimed in claim 22, wherein each crossbar cell further comprises conditional discharge circuitry for turning off the first switch irrespective of the routing value whilst the associated data output path is being precharged to the first logic level, and for allowing the first switch to be controlled by the routing value following the precharging of the associated data output path to the first logic level.

24. Crossbar circuitry as claimed in claim 22, further comprising:
sense amplifier circuitry to detect, during the transmission mode of operation, the data output on the bit lines of the data output path, thereby allowing detection of a transition towards the second logic level before the voltage on a bit line of the data output path has reached the second logic level.

25. Crossbar circuitry as claimed in claim 22, further comprising:
encode circuitry between each of said plurality of source circuits and said plurality of data input paths;
decode circuitry between each of said plurality of data output paths and said plurality of destination circuits;
the encode circuitry applying an encoding operation to encode input data provided by each source circuit into an encoded format that reduces the number of times the data output paths need to be pulled to the second logic level following their precharge to the first logic level, when compared to the number of times the data output paths would need to be pulled to the second logic level if the original input data were passed through the crossbar circuitry;

the decode circuitry applying a corresponding decoding operation to identify the original input data provided by the source circuit from the encoded data output over the data output path.

26. Crossbar circuitry as claimed in claim 1, wherein said plurality of source circuits are connectable to either end of said plurality of data input paths.

27. Crossbar circuitry as claimed in claim 1, wherein said plurality of destination circuits are connectable to either end of said plurality of data output paths.

28. Crossbar circuitry as claimed in claim 1, wherein:
each data input path consists of multiple input path portions separated by word line drivers;
each word line driver is activated in dependence on the routing values stored in the configuration storage circuitry of crossbar cells provided along the associated data input path but further from the source circuit than that word line driver;
whereby each word line driver is only activated if the configuration storage circuitry of at least one crossbar cell provided along the associated data input path but further from the source circuit than that word line driver has a routing value set to said first value.

29. A data processing apparatus comprising:
a plurality of memory devices for storing data values;
a plurality of processors for performing data processing operations in parallel on multiple of the data values stored in said plurality of memory devices; and
crossbar circuitry as claimed in claim 1 for routing the data value from any of said plurality of memory devices to any of said plurality of processors.

30. Crossbar circuitry for interconnecting a plurality of source means and a plurality of destination means such that data input to the crossbar circuitry from any of said plurality of source means can be output to any of said plurality of destination means, the crossbar circuitry comprising:
a plurality of data input path means passing through said crossbar circuitry, each data input path means for connecting to one of said plurality of source means and providing a plurality of word line means;
a plurality of data output path means passing through said crossbar circuitry transverse to the plurality of data input path means, each data output path means for connecting to one of said plurality of destination means and providing a plurality of bit line means;
a crossbar cell means associated with each intersection between one of said data input path means and one of said data output path means, each crossbar cell means comprising:
configuration storage means programmable in an arbitration mode of operation for storing a routing value in dependence on a voltage on at least one of said plurality of bit line means, the routing value being programmed to a first value to indicate that data input along the word line means of the data input path means to the associated intersection is to be output on the bit line means of the data output path means at the associated intersection, and the routing value being programmed to a second value to indicate that data input along the word line means of the data input path means to the associated intersection is not to be output on the bit line means of the data output path means at the associated intersection;
transmission means, responsive to the routing value having said first value in a transmission mode of operation, for detecting the data input along the word line means of the data input path means and to output an indication of that data on the bit line means of the data output path means at the associated intersection;
arbitration means for operating in said arbitration mode of operation in dependence on a transmission request received by the crossbar cell means from the source means connected to the data input path means of the associated intersection, if the transmission request is asserted to indicate that said source means wishes to route data from the data input path means to the data output path means at the associated intersection, the arbitration means for operating in combination with the arbitration means of other crossbar cell means associated with the same data output path means to selectively modify the voltage on the plurality of bit line means in order to apply an adaptive priority scheme, such that in the presence of multiple asserted transmission requests for said same data output path means, the configuration storage means of only one crossbar cell means associated with said same data output path means has its routing value programmed to said first value, thereby resolving conflict between said multiple asserted transmission requests according to said adaptive priority scheme; and
priority storage means for storing priority data identifying which of the plurality of bit line means are to have their voltage modified by the associated arbitration means in order to apply the adaptive priority scheme;
the priority storage means for self updating the priority data stored therein in dependence on the voltage of at least one of the plurality of bit line means, between each application of the adaptive priority scheme by the arbitration means.

31. A method of operating crossbar circuitry to interconnect a plurality of source circuits and a plurality of destination circuits such that data input to the crossbar circuitry from any of said plurality of source circuits can be output to any of said plurality of destination circuits, the crossbar circuitry having a plurality of data input paths passing through said crossbar circuitry, each data input path being connectable to one of said plurality of source circuits and providing a plurality of word lines, and a plurality of data output paths passing through said crossbar circuitry transverse to the plurality of data input paths, each data output path being connectable to one of said plurality of destination circuits and providing a plurality of bit lines, the method comprising the steps of:
employing a crossbar cell in association with each intersection between one of said data input paths and one of said data output paths;
programming a routing value in each crossbar cell in an arbitration mode of operation, the routing value being programmed in dependence on a voltage on at least one of said plurality of bit lines, the routing value being programmed to a first value to indicate that data input along the word lines of the data input path to the associated intersection is to be output on the bit lines of the data output path at the associated intersection, and the routing value being programmed to a second value to indicate that data input along the word lines of the data input path to the associated intersection is not to be output on the bit lines of the data output path at the associated intersection;
in a transmission mode of operation, causing the crossbar cell to be responsive to the routing value having said first value to detect the data input along the word lines of the data input path and to output an indication of that data on the bit lines of the data output path at the associated intersection;

in said arbitration mode of operation, causing arbitration circuitry in the crossbar cell to operate in dependence on a transmission request received by the crossbar cell from the source circuit connected to the data input path of the associated intersection, if the transmission request is asserted to indicate that said source circuit wishes to route data from the data input path to the data output path at the associated intersection, the arbitration circuitry operating in combination with the arbitration circuitry of other crossbar cells associated with the same data output path to selectively modify the voltage on the plurality of bit lines in order to apply an adaptive priority scheme, such that in the presence of multiple asserted transmission requests for said same data output path, the configuration storage circuitry of only one crossbar cell associated with said same data output path has its routing value programmed to said first value, thereby resolving conflict between said multiple asserted transmission requests according to said adaptive priority scheme;

storing, in priority storage circuitry within the crossbar cell, priority data identifying which of the plurality of bit lines are to have their voltage modified by the associated arbitration circuitry in order to apply the adaptive priority scheme; and arranging the priority storage circuitry, between each application of the adaptive priority scheme by the arbitration circuitry, to self update the priority data stored therein in dependence on the voltage of at least one of the plurality of bit lines.

* * * * *